(12) United States Patent
Kanazawa et al.

(10) Patent No.: US 9,263,435 B2
(45) Date of Patent: Feb. 16, 2016

(54) SWITCHING ELEMENT WITH A SERIES-CONNECTED JUNCTION FET (JFET) AND MOSFET ACHIEVING BOTH IMPROVED WITHSTAND VOLTAGE AND REDUCED ON-RESISTANCE

(75) Inventors: Takamitsu Kanazawa, Kanagawa (JP); Satoru Akiyama, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 119 days.

(21) Appl. No.: 14/348,048

(22) PCT Filed: Sep. 30, 2011

(86) PCT No.: PCT/JP2011/072584
§ 371 (c)(1), (2), (4) Date: Mar. 27, 2014

(87) PCT Pub. No.: WO2013/046439
PCT Pub. Date: Apr. 4, 2013

(65) Prior Publication Data
US 2014/0231829 A1   Aug. 21, 2014

(51) Int. Cl.
*H01L 29/15* (2006.01)
*H01L 31/0312* (2006.01)
(Continued)

(52) U.S. Cl.
CPC ........ *H01L 27/0617* (2013.01); *H01L 21/8213* (2013.01); *H01L 23/4952* (2013.01); *H01L 23/49524* (2013.01); *H01L 23/49562* (2013.01); *H01L 23/49575* (2013.01);
(Continued)

(58) Field of Classification Search
CPC ............ H01L 27/0617; H01L 21/8213; H01L 23/4952; H01L 23/49524; H01L 23/49562; H01L 23/49575; H01L 24/34; H01L 24/37; H01L 24/40; H01L 24/49; H01L 27/0207; H01L 27/088; H01L 29/8083
See application file for complete search history.

(56) References Cited

U.S. PATENT DOCUMENTS 6,157,049 A    12/2000 Mitlehner et al.
2004/0130021 A1  7/2004 Sridevan
(Continued)

FOREIGN PATENT DOCUMENTS

JP    2000-506313 A    5/2000
JP    3046017 B1       5/2000
(Continued)

OTHER PUBLICATIONS

Extended European search report (including supplementary European search report and search opinion) from European Patent Application No. 11873214.8, Dec. 15, 2015.

*Primary Examiner* — Stephen W Smoot
*Assistant Examiner* — Vicki B Booker
(74) *Attorney, Agent, or Firm* — Shapiro, Gabor and Rosenberger, PLLC

(57) ABSTRACT

Technology capable of improving reliability of a semiconductor device is provided. In the present invention, a gate pad GPj formed on a front surface of a semiconductor chip CHP1 is disposed so as to be closer to a source lead SL than to other leads (a drain lead DL and a gate lead GL). As a result, according to the present invention, a distance between the gate pad GPj and the source lead SL can be shortened, and thus a length of the wire Wgj for connecting the gate pad GPj and the source lead SL together can be shortened. Thus, according to the present invention, a parasitic inductance that is present in the wire Wgj can be sufficiently reduced.

26 Claims, 22 Drawing Sheets

(51) Int. Cl.

| | | |
|---|---|---|
| *H01L 27/06* | (2006.01) | |
| *H01L 21/82* | (2006.01) | |
| *H01L 27/02* | (2006.01) | |
| *H01L 27/088* | (2006.01) | |
| *H01L 23/495* | (2006.01) | |
| *H01L 29/808* | (2006.01) | |
| H01L 23/31 | (2006.01) | |
| H01L 23/00 | (2006.01) | |
| H01L 29/16 | (2006.01) | |
| H01L 29/78 | (2006.01) | |
| H01L 29/10 | (2006.01) | |

(52) U.S. Cl.
CPC ............... *H01L 24/34* (2013.01); *H01L 24/37* (2013.01); *H01L 24/40* (2013.01); *H01L 24/49* (2013.01); *H01L 27/0207* (2013.01); *H01L 27/088* (2013.01); *H01L 29/8083* (2013.01); H01L 23/3107 (2013.01); H01L 24/06 (2013.01); H01L 24/29 (2013.01); H01L 24/32 (2013.01); H01L 24/45 (2013.01); H01L 24/48 (2013.01); H01L 24/73 (2013.01); H01L 29/1066 (2013.01); H01L 29/1608 (2013.01); H01L 29/7802 (2013.01); H01L 2224/04034 (2013.01); H01L 2224/04042 (2013.01); H01L 2224/05554 (2013.01); H01L 2224/0603 (2013.01); H01L 2224/291 (2013.01); H01L 2224/2919 (2013.01); H01L 2224/29139 (2013.01); H01L 2224/32145 (2013.01); H01L 2224/32245 (2013.01); H01L 2224/3701 (2013.01); H01L 2224/3702 (2013.01); H01L 2224/40105 (2013.01); H01L 2224/40145 (2013.01); H01L 2224/40247 (2013.01); H01L 2224/45124 (2013.01); H01L 2224/45144 (2013.01); H01L 2224/45147 (2013.01); H01L 2224/48137 (2013.01); H01L 2224/48247 (2013.01); H01L 2224/48465 (2013.01); H01L 2224/4903 (2013.01); H01L 2224/49111 (2013.01); H01L 2224/49113 (2013.01); H01L 2224/73221 (2013.01); H01L 2224/73263 (2013.01); H01L 2224/73265 (2013.01); H01L 2924/01029 (2013.01); H01L 2924/10253 (2013.01); H01L 2924/10272 (2013.01); H01L 2924/12032 (2013.01); H01L 2924/1305 (2013.01); H01L 2924/1306 (2013.01); H01L 2924/13062 (2013.01); H01L 2924/13091 (2013.01); H01L 2924/181 (2013.01); H01L 2924/1815 (2013.01); H01L 2924/30107 (2013.01)

(56) References Cited

U.S. PATENT DOCUMENTS

| | | |
|---|---|---|
| 2008/0191216 A1 | 8/2008 | Machida et al. |
| 2009/0218676 A1 | 9/2009 | Muto et al. |
| 2010/0224885 A1 | 9/2010 | Onose |
| 2011/0102054 A1 | 5/2011 | Domes |
| 2011/0127606 A1 | 6/2011 | Bobde et al. |

FOREIGN PATENT DOCUMENTS

| | | |
|---|---|---|
| JP | 2002-208673 A | 7/2002 |
| JP | 2006-114674 A | 4/2006 |
| JP | 2008-198735 A | 8/2008 |
| JP | 2009-231805 A | 10/2009 |
| JP | 2010-206100 A | 9/2010 |
| JP | 2011-166673 A | 8/2011 |

SWITCHING ELEMENT WITH A SERIES-CONNECTED JUNCTION FET (JFET) AND MOSFET ACHIEVING BOTH IMPROVED WITHSTAND VOLTAGE AND REDUCED ON-RESISTANCE

TECHNICAL FIELD

The present invention relates to semiconductor devices and, in particular, to technology effective when applied to a power semiconductor device for use in, for example, an inverter of an air conditioner, a DC/DC converter of a computer power supply, an inverter module of a hybrid automobile or electric automobile, or the like.

BACKGROUND ART

Japanese Patent Application Laid-Open Publication (Translation of PCT Application) No. 2000-506313 (Patent Document 1) describes technology for providing a switching element which achieves both a low on-resistance and a high withstand voltage. Specifically, Patent Document 1 describes a structure for cascode connection between a junction FET (Junction Field Effect Transistor) formed of silicon carbide (SiC) and a MOSFET (Metal Oxide Semiconductor Field Effect Transistor) formed of silicon (Si).

Japanese Patent Application Laid-Open Publication No. 2008-198735 (Patent Document 2) describes a structure for serial connection between an FET formed of SiC and a diode formed of Si in order to provide an element with a low on-voltage and a high withstand voltage.

Japanese Patent Application Laid-Open Publication No. 2002-208673 (Patent Document 3) describes structure in which a switching element and a diode are stacked interposing a flat-plate connection terminal in order to reduce the area of a power module.

Japanese Patent Application Laid-Open Publication No. 2010-206100 (Patent Document 4) describes a technology in which erroneous breakthrough is prevented by increasing a threshold voltage of a normally-off-type junction FET formed of SiC. Specifically, a junction FET and a MOSFET are disposed on a SiC substrate, and the MOSFET is diode-connected to the gate electrode of the junction FET.

CITATION LIST

Patent Documents

Patent Document 1: Japanese Patent Application Laid-Open Publication (Translation of PCT Application) No. 2000-506313
Patent Document 2: Japanese Patent Application Laid-Open Publication No. 2008-198735
Patent Document 3: Japanese Patent Application Laid-Open Publication No. 2002-208673
Patent Document 4: Japanese Patent Application Laid-Open Publication No. 2010-206100

DISCLOSURE OF THE INVENTION

Problems to be Solved by the Invention

As a switching element which achieves both an improvement in withstand voltage and a reduction in on-resistance, a switching element using a cascode connection scheme has existed. The switching element using the cascode connection scheme has a structure, for example, in which a normally-on-type junction FET (Junction Field Effect Transistor) using a material with a band gap larger than that of silicon (Si) and a normally-off-type MOSFET (Metal Oxide Semiconductor Field Effect Transistor) using silicon (Si) are connected together in series. According to this cascode-connection-scheme switching element, a withstand voltage can be ensured by the junction FET which has a large dielectric strength voltage. Also, with a reduction in on-resistance by the normally-on-type junction FET and a reduction in on-resistance by the MOSFET with a low withstand voltage, a switching element achieving both an improvement in withstand voltage and a reduction in on-resistance can be obtained.

In the mount configuration of this cascode-connected switching element, a structure is adopted in which a semiconductor chip in which a junction FET is formed and a semiconductor chip in which a MOSFET is formed are connected together by bonding wires. The inventors newly found out that, in this case of the structure, a voltage larger than or equal to a designed withstand voltage may be disadvantageously applied at the time of switching between the source and the drain of the low-withstand-voltage MOSFET due to an influence of parasitic inductance present in the bonding wires and an influence of a leakage current of the junction FET. As just described, if the voltage larger than or equal to the designed withstand voltage is applied to the low-withstand-voltage MOSFET, the MOSFET may possibly be broken, resulting in a decrease in reliability of the semiconductor device.

A preferred aim of the present invention is to provide technology capable of improving reliability of a semiconductor device.

The above and other preferred aims and novel characteristics of the present invention will be apparent from the description of the present specification and the accompanying drawings.

Means for Solving the Problems

The typical ones of the inventions disclosed in the present application will be briefly described as follows.

In a semiconductor device in an embodiment, the gate pad of the semiconductor chip in which a junction FET is formed is disposed closer to a source lead than to other leads (such as a gate lead and a drain lead).

Effects of the Invention

The effects obtained by typical aspects of the present invention will be briefly described below.

According to an embodiment, reliability of the semiconductor device can be improved. Also, electrical characteristics of the semiconductor device can be improved.

BRIEF DESCRIPTIONS OF THE DRAWINGS

Figure 12C:
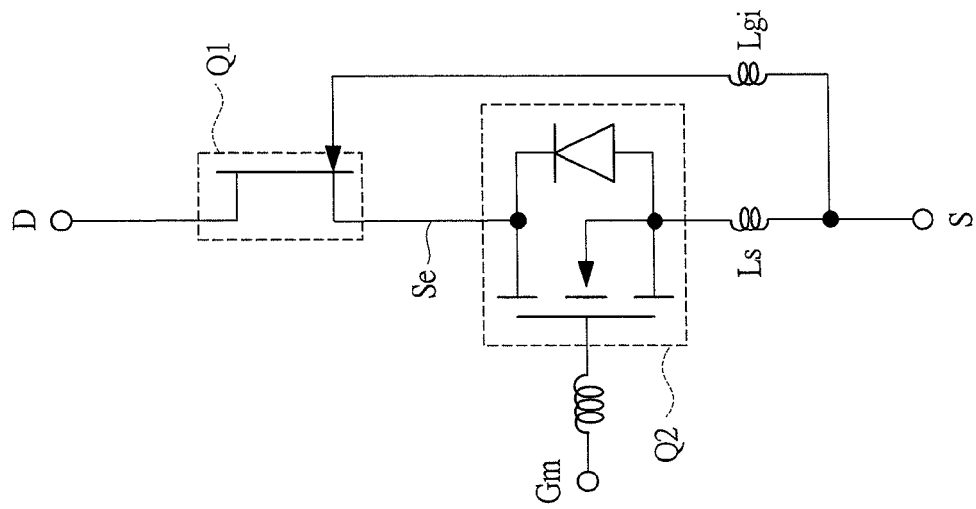
Figure 12B:
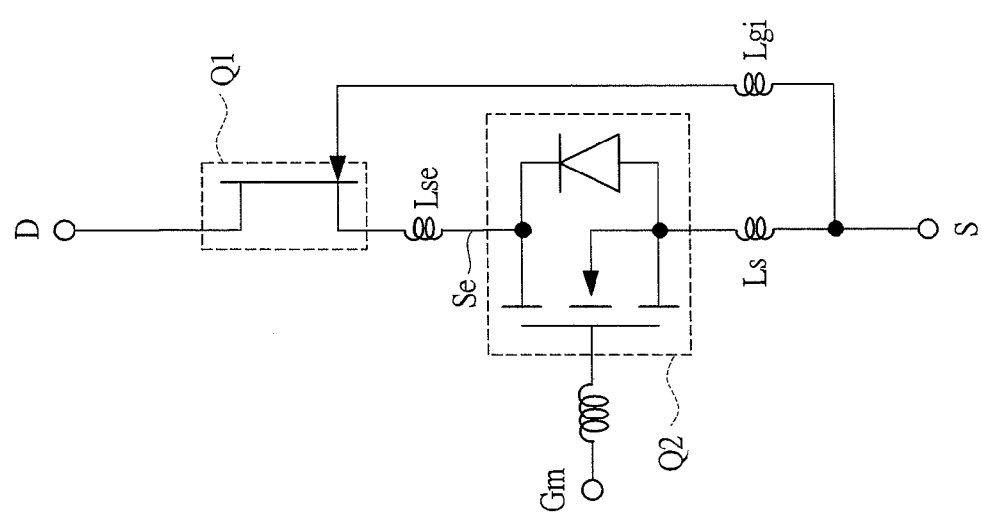
Figure 12A:
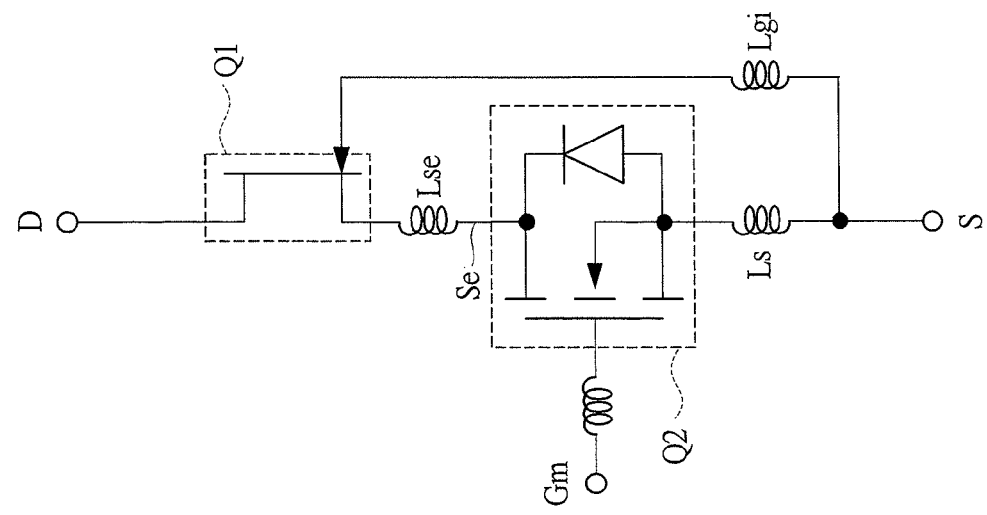
Figure 13:
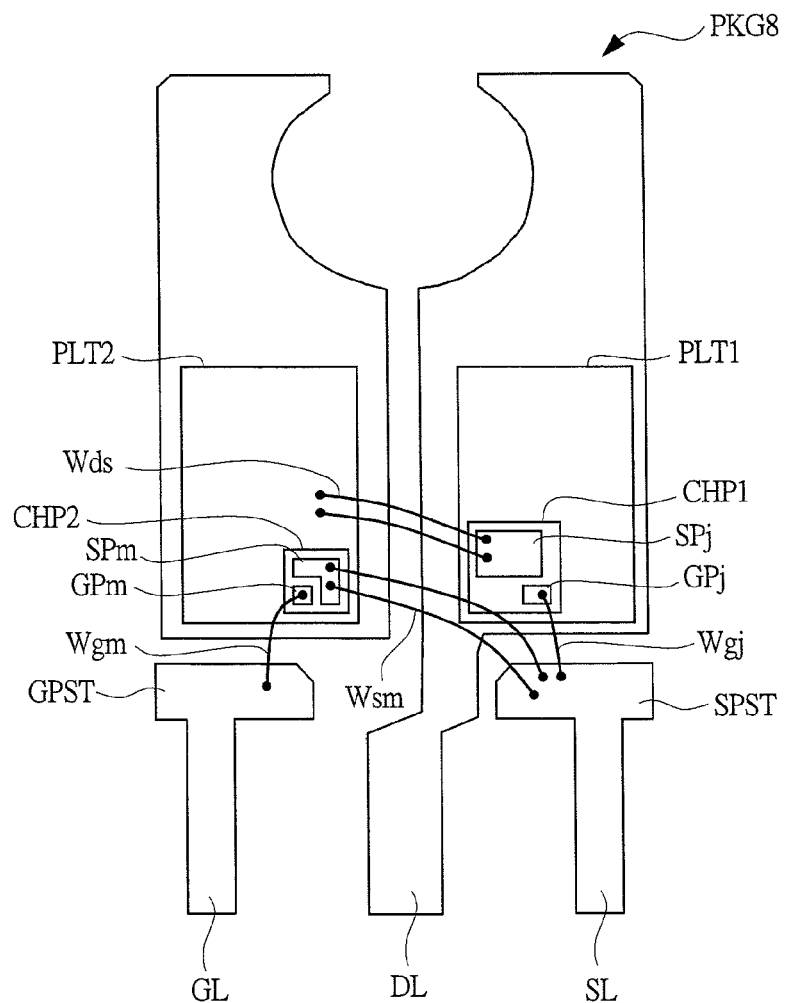
Figure 14:
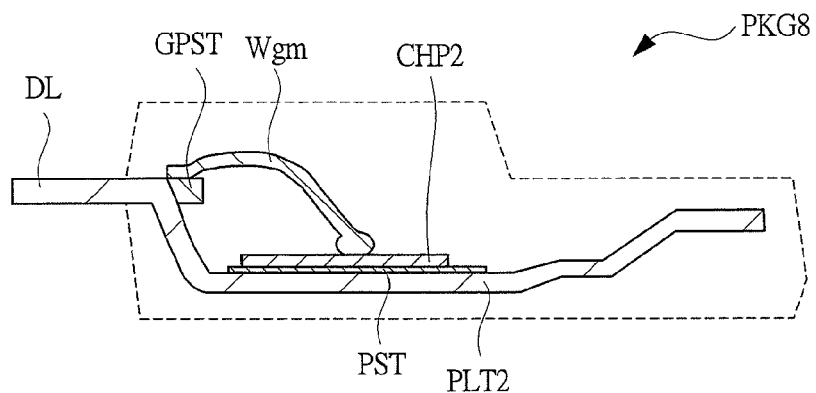
Figure 15:
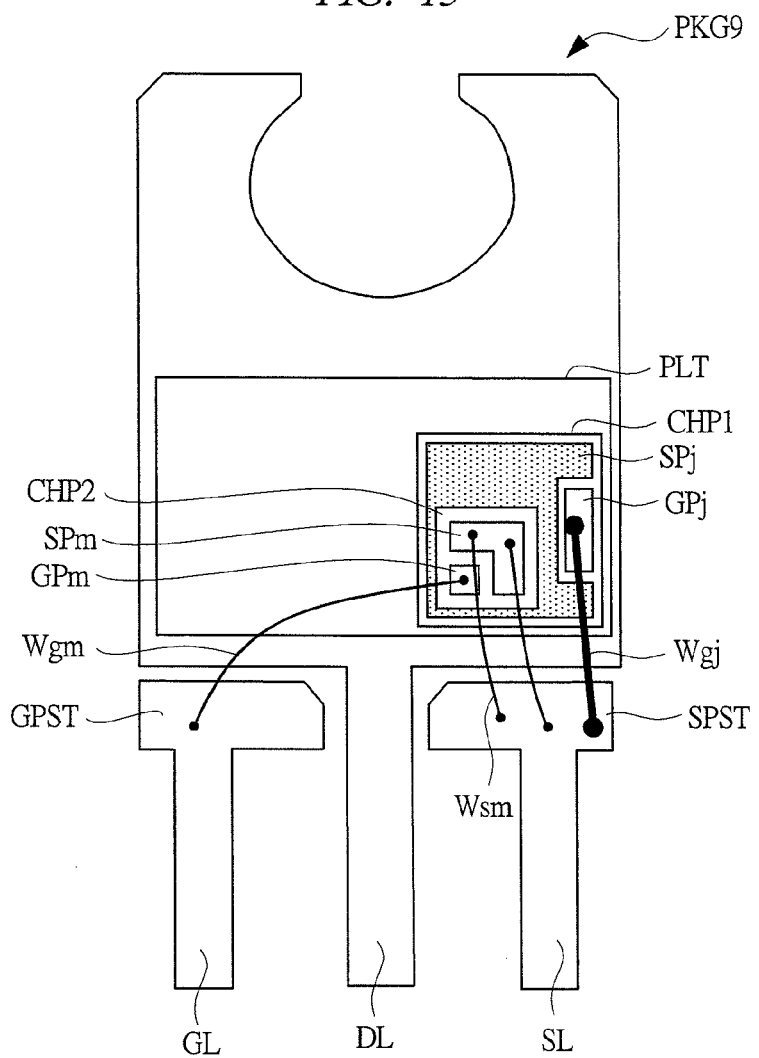
Figure 16:
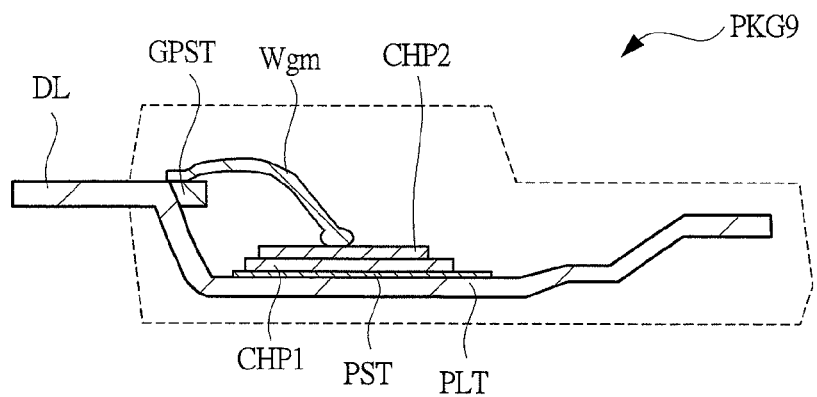
Figure 17:
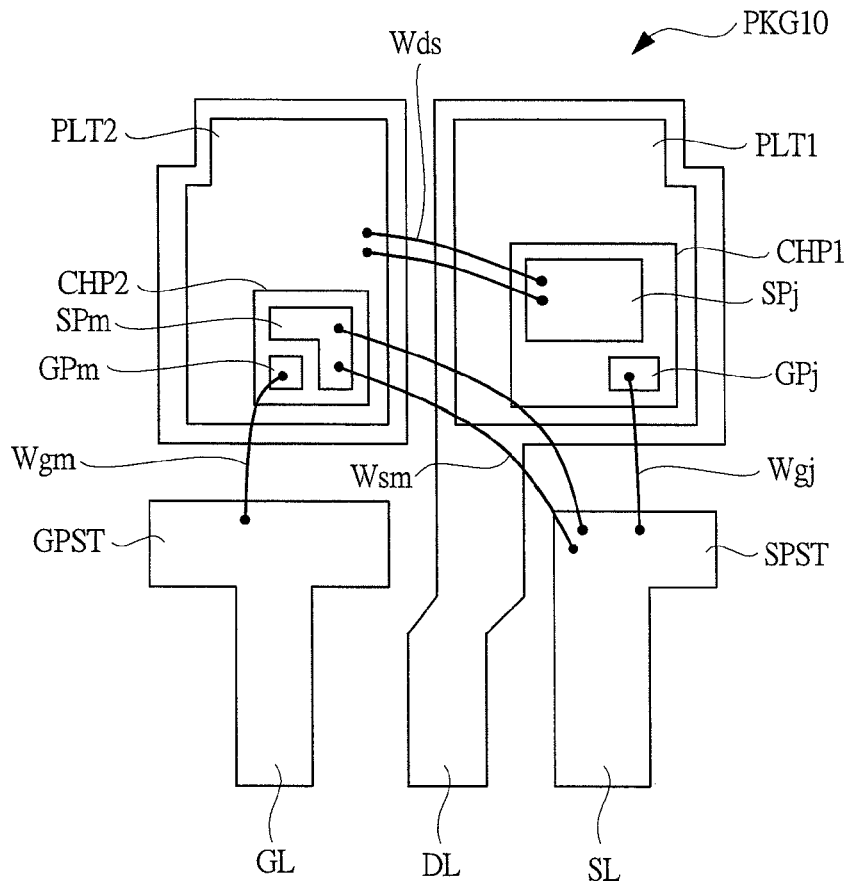
Figure 18:
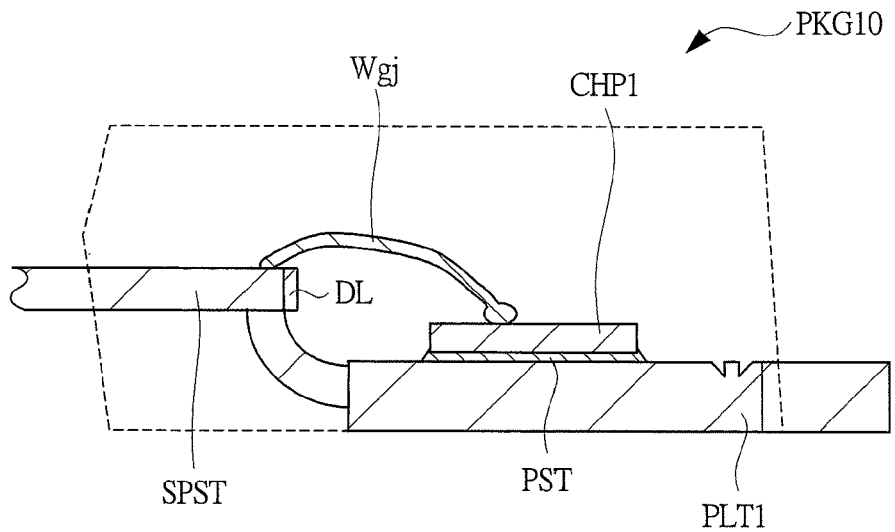
Figure 19:
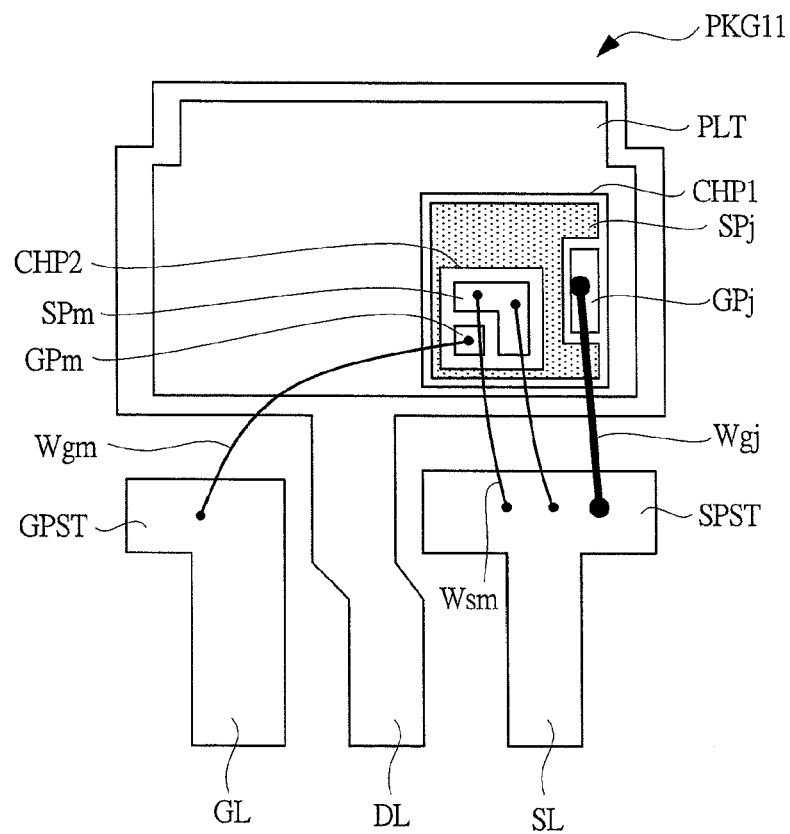
Figure 20:
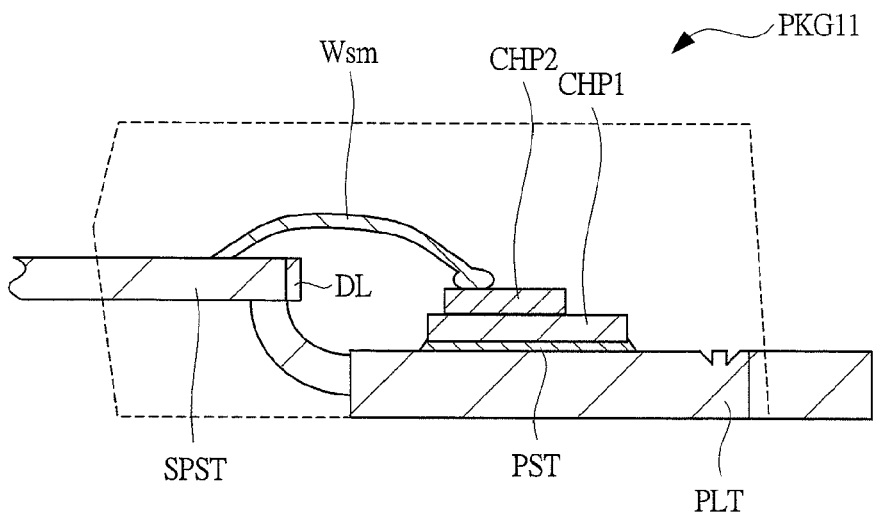
Figure 21:
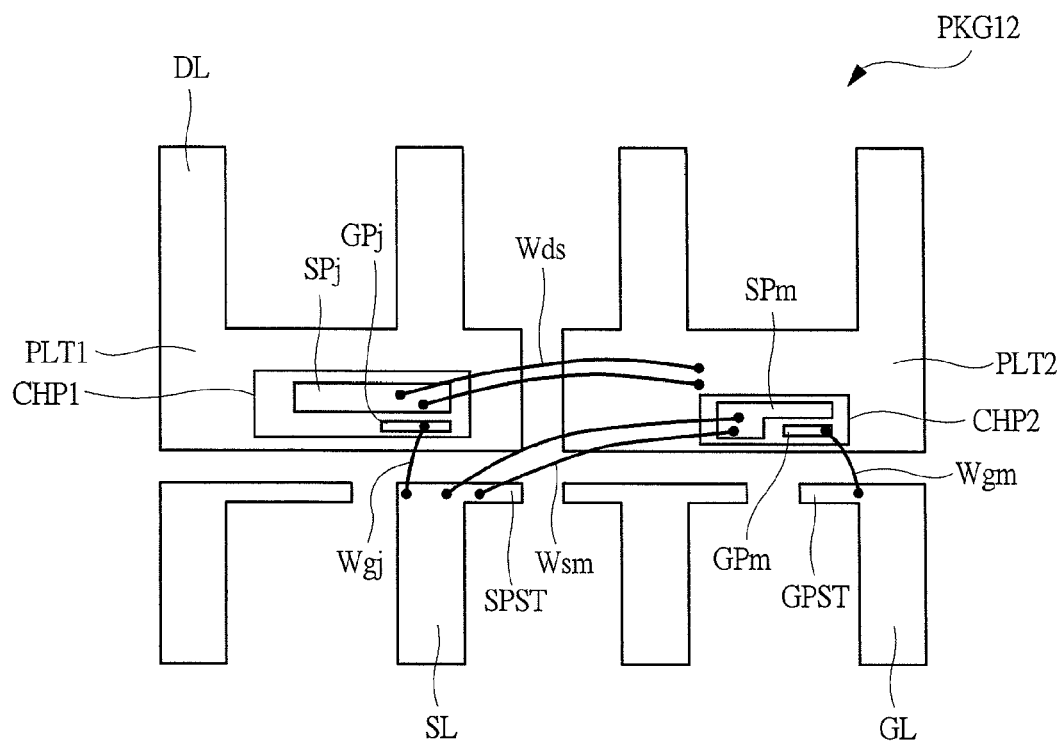
Figure 22:
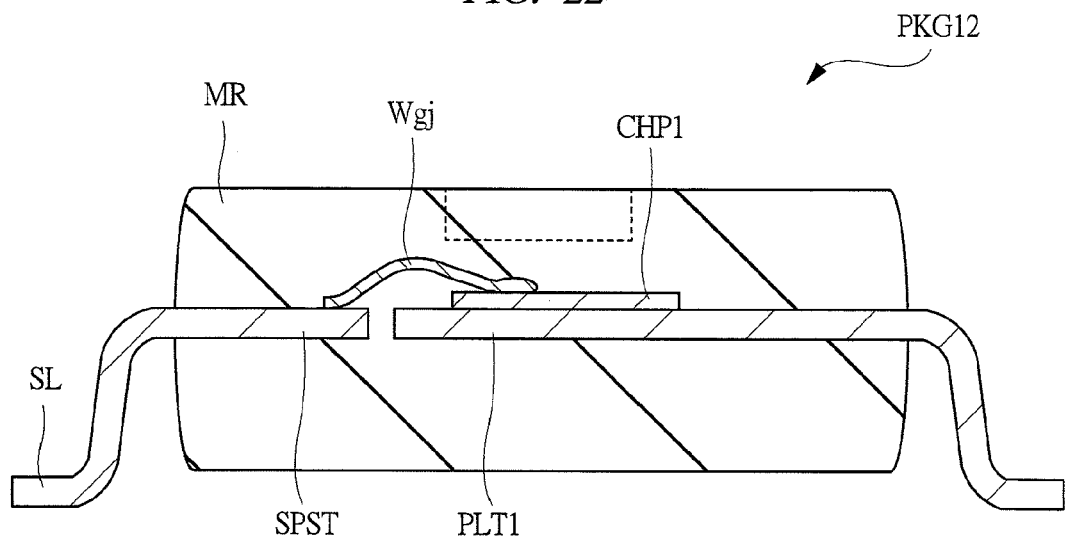
Figure 23:
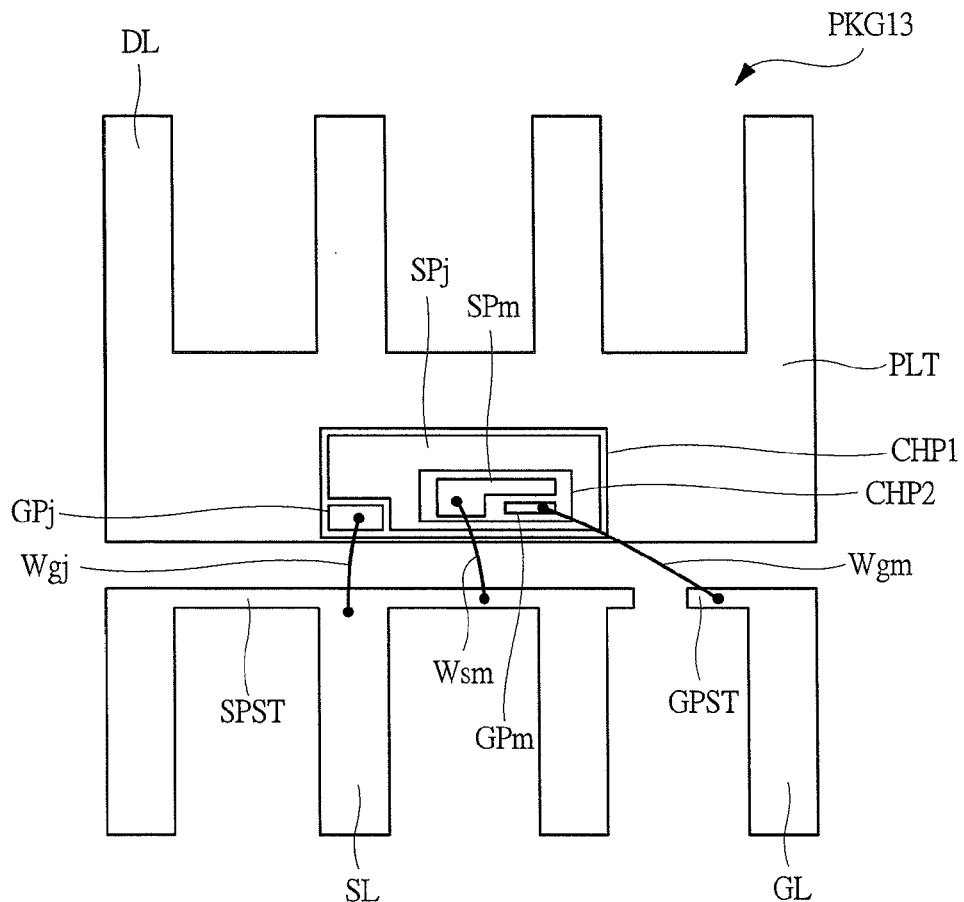
Figure 24:
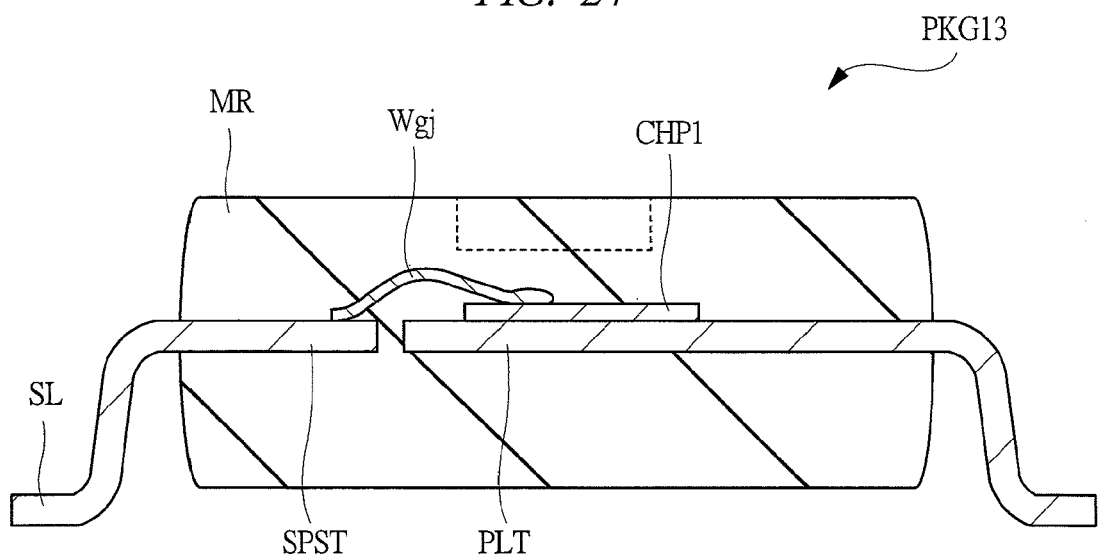
Figure 25:
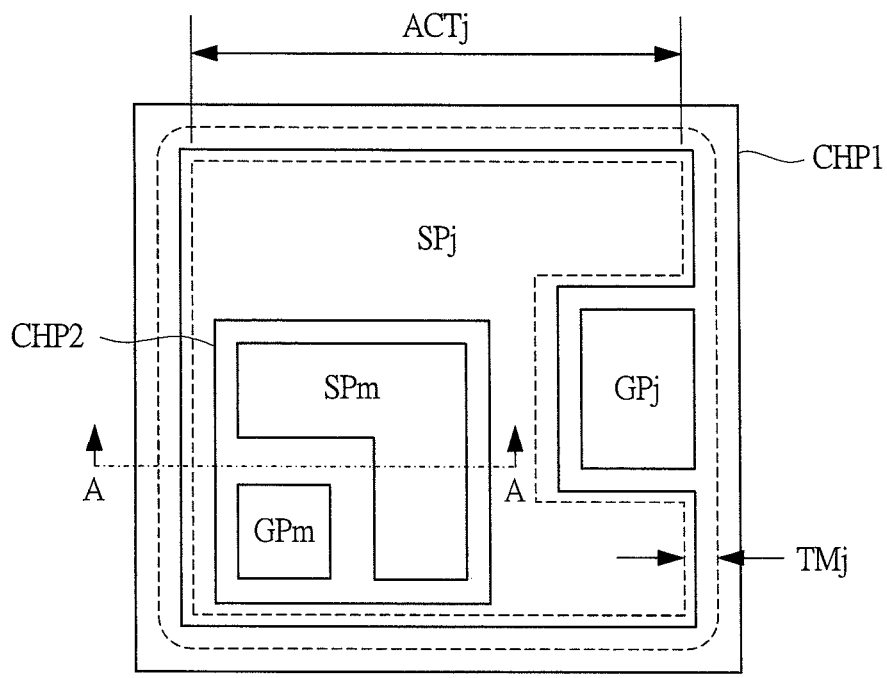
Figure 26:
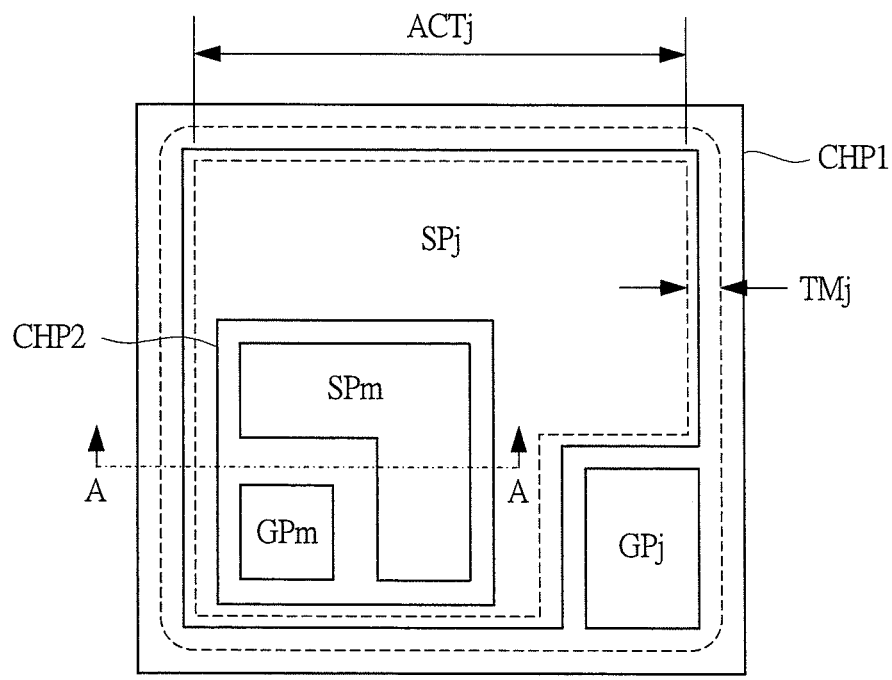
Figure 27:
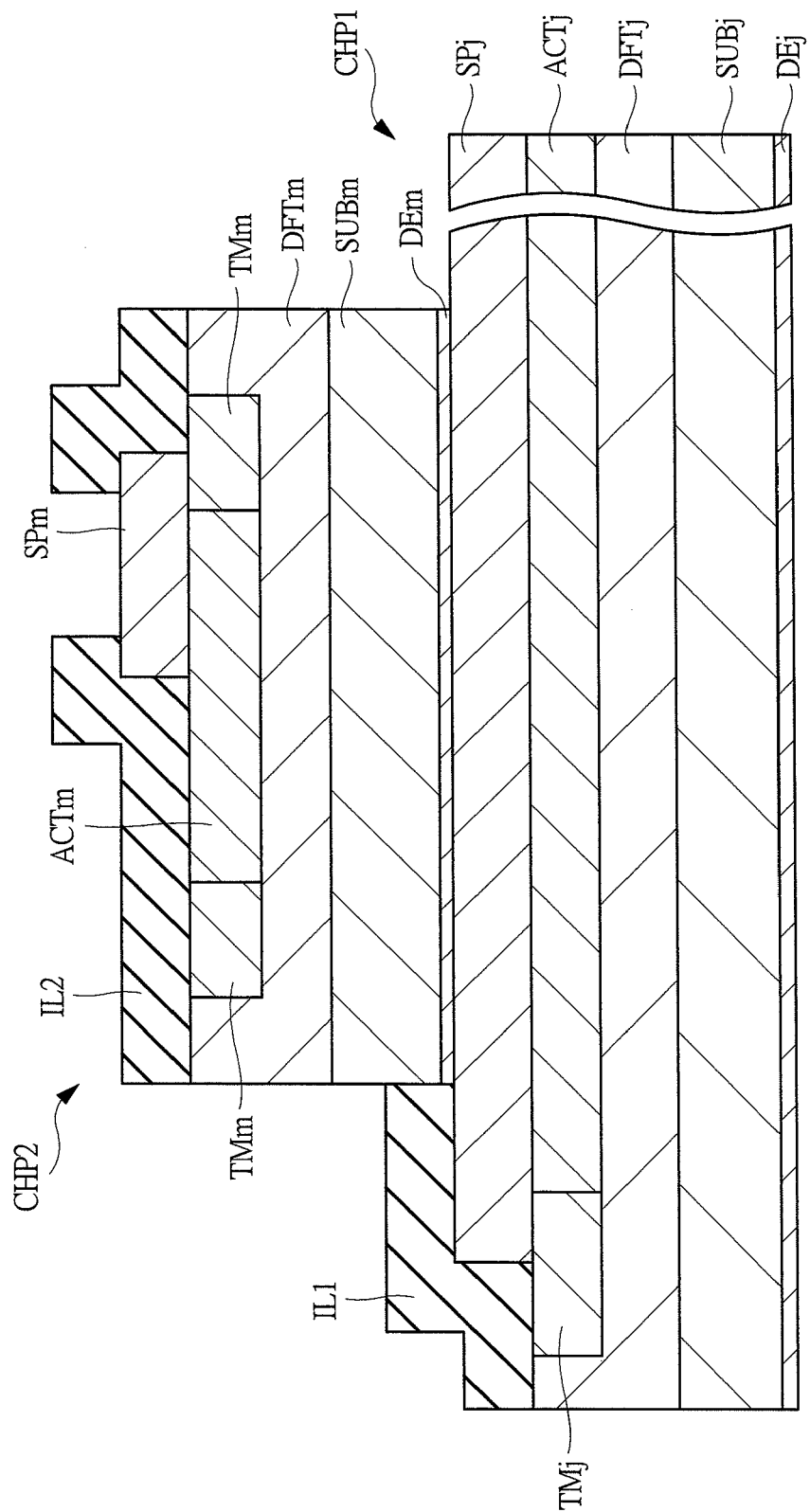
Figure 28:
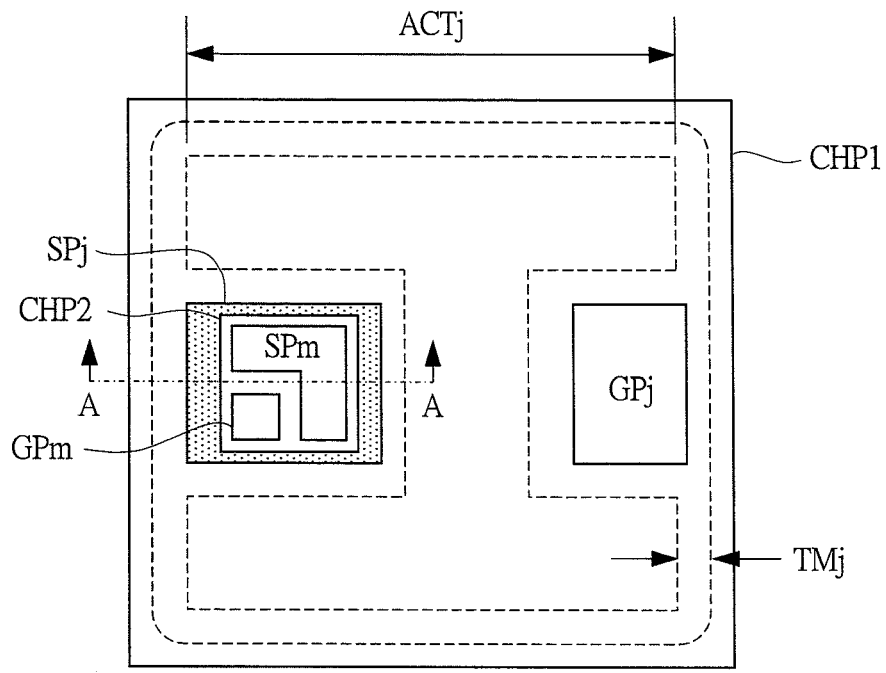
Figure 29:
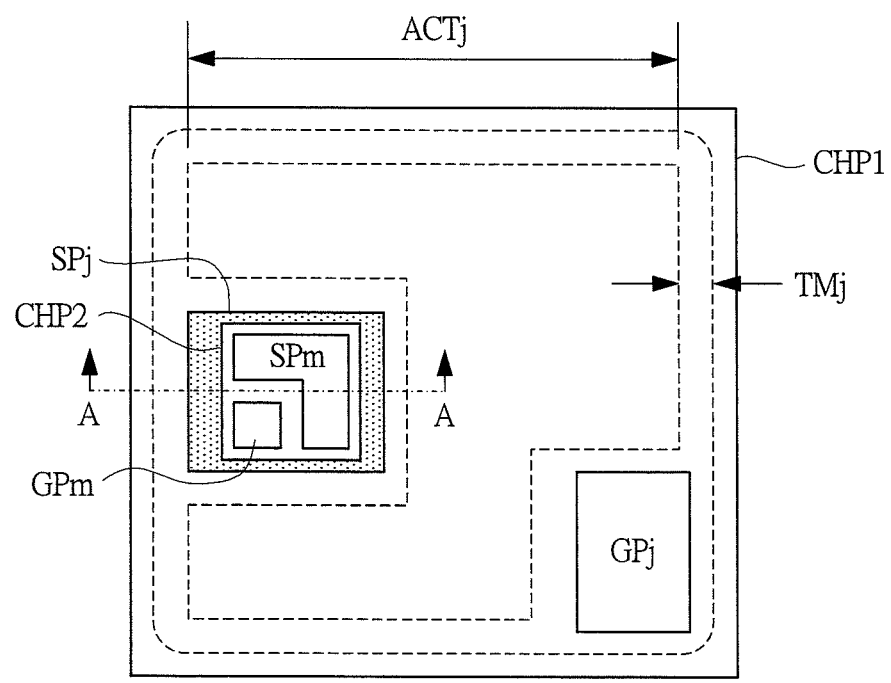
Figure 30:
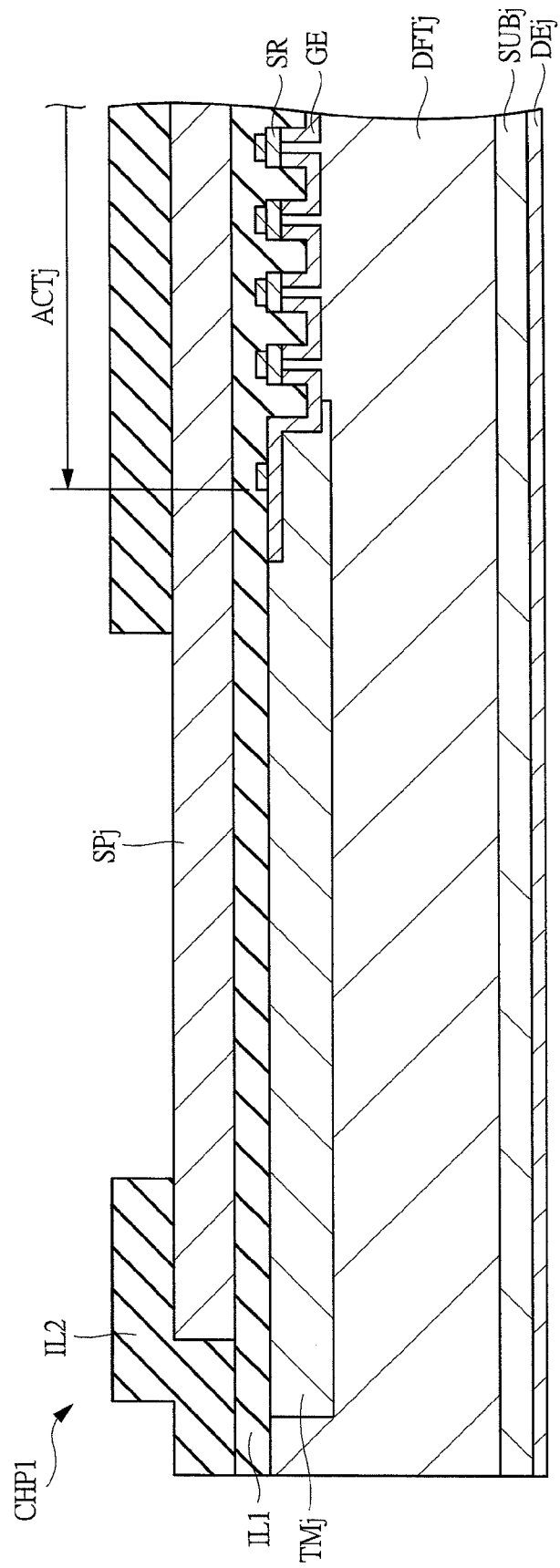
Figure 31:
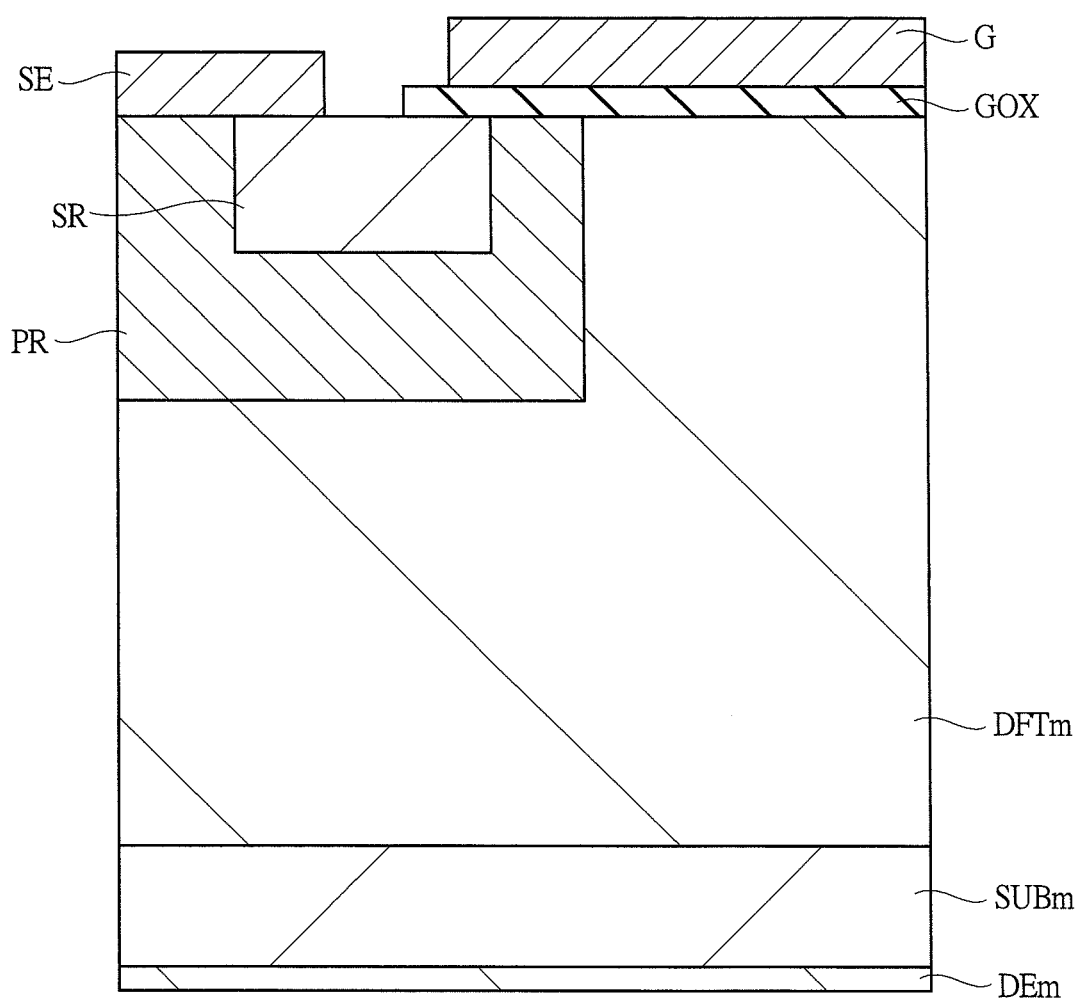
Figure 32B:
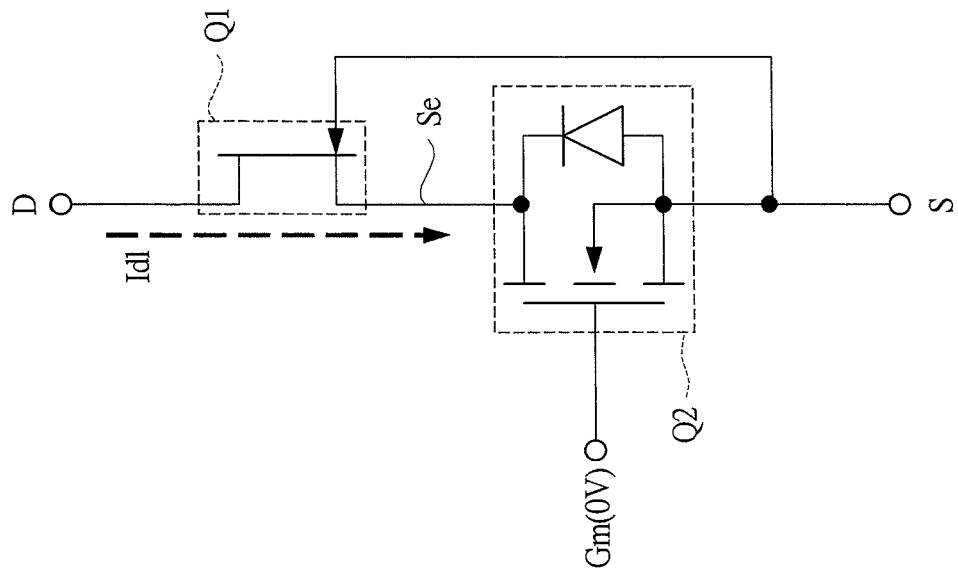
Figure 32A:
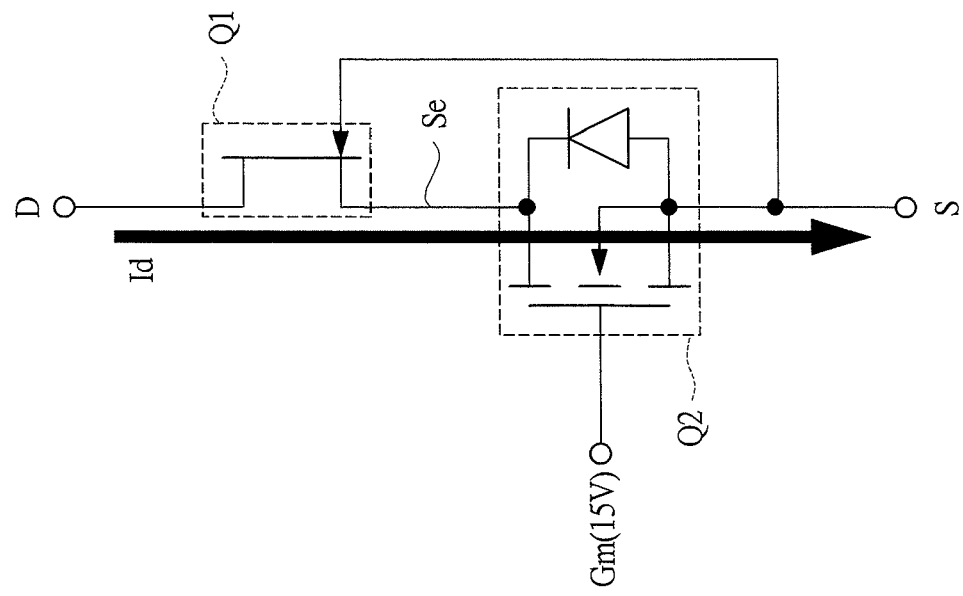
Figure 33:
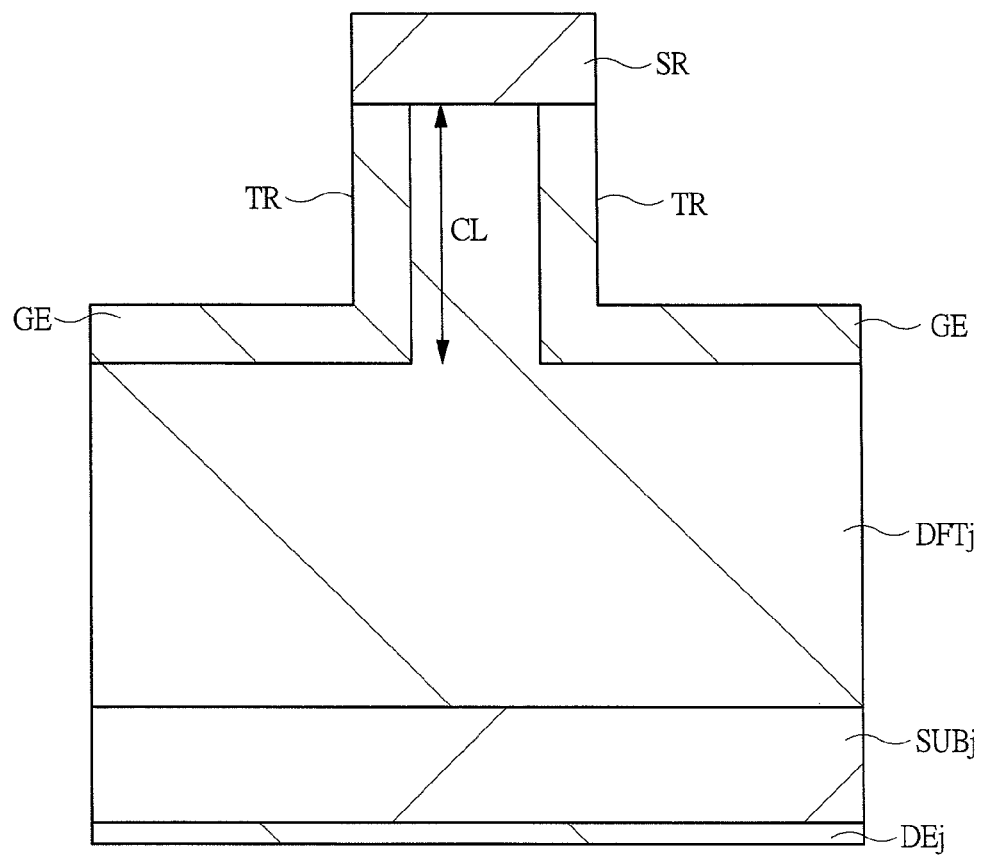
Figure 34:
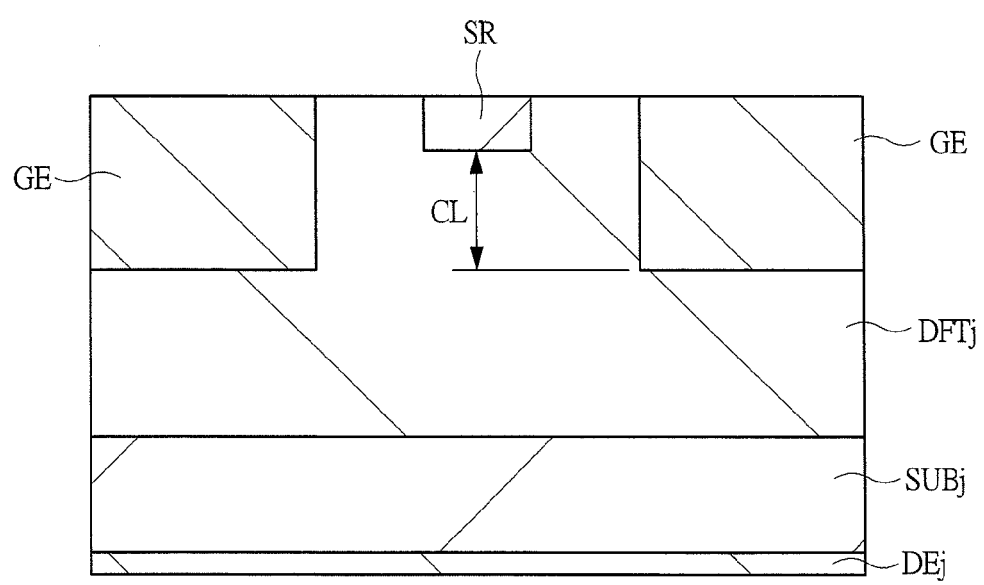

FIG. 12A is a circuit diagram illustrating positions of parasitic inductances together with a switching element in a conventional technology, FIG. 12B is a circuit diagram illustrating positions of parasitic inductances together with a switching element in the first embodiment, and FIG. 12C is a circuit diagram illustrating positions of parasitic inductances together with a switching element in the first modification example;

FIG. 13 is a diagram illustrating a mount configuration of a semiconductor device in a second modification example;

FIG. 14 is a cross-sectional view illustrating one cross section of FIG. 13;

FIG. 15 is a diagram illustrating a mount configuration of another semiconductor device in the second modification example;

FIG. 16 is a cross-sectional view illustrating one cross section of FIG. 15;

FIG. 17 is a diagram illustrating a mount configuration of a semiconductor device in a third modification example;

FIG. 18 is a cross-sectional view illustrating one cross section of FIG. 17;

FIG. 19 is a diagram illustrating a mount configuration of another semiconductor device in the third modification example;

FIG. 20 is a cross-sectional view illustrating one cross section of FIG. 19;

FIG. 21 is a diagram illustrating a mount configuration of a semiconductor device in a fourth modification example;

FIG. 22 is a cross-sectional view illustrating one cross section of FIG. 21;

FIG. 23 is a diagram illustrating a mount configuration of another semiconductor device in the third modification example;

FIG. 24 is a cross-sectional view illustrating one cross section of FIG. 23;

FIG. 25 is a diagram illustrating the structure of a stacked semiconductor chip in a second embodiment;

FIG. 26 is a diagram illustrating another structure of the stacked semiconductor chip in the second embodiment;

FIG. 27 is a cross-sectional view of the structure cut along the line A-A in FIG. 25 and FIG. 26;

FIG. 28 is a diagram illustrating the structure of a stacked semiconductor chip in a modification example;

FIG. 29 is a diagram illustrating another structure of the stacked semiconductor chip in the modification example;

FIG. 30 is a cross-sectional view of the structure cut along the line A-A in FIG. 28 and FIG. 29;

FIG. 31 is a cross-sectional view illustrating a device structure of a MOSFET in the second embodiment;

FIGS. 32A and 32B are diagrams illustrating a current path in a cascode-connected switching element, in which FIG. 32A illustrates a diagram illustrating a current path at the time of ON and FIG. 32B illustrates a diagram illustrating a current path of a leakage current flowing at the time of OFF;

FIG. 33 is a cross-sectional view illustrating a device structure of a junction FET in the second embodiment; and FIG. 34 is a cross-sectional view illustrating another device structure of the junction FET in the second embodiment.

BEST MODE FOR CARRYING OUT THE INVENTION

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Also, components having the same function are denoted by the same reference symbols throughout the drawings for describing the embodiments, and a repetitive description thereof is omitted. Moreover, in some drawings used in the embodiments, hatching is used even in a plan view so as to make the drawings easy to see.

(First Embodiment)

<Details of Problems Found Out by the Inventors>

In a major social trend to conservation of global environment, the importance of electronics businesses for reducing environmental burdens has been increasing. Among others, power devices (power semiconductor devices) are used as power supplies for inverters of railroad vehicles, hybrid automobiles or electric automobiles, inverters of air conditioners, and consumer devices such as personal computers. An improvement in performance of the power device significantly contributes to an improvement inefficiency of electric power of infrastructure systems and consumer devices. The improvement in efficiency of electric power means a reduction in energy resources required for system operation. In other words, the amount of emission of carbon dioxide, that is, environmental burdens, can be reduced. For this reason, research and development toward an improvement in performance of power devices have been vigorously conducted at various companies.

In general, as with large-scale integration circuits (LSIs), power devices are made with silicon. However, in recent years, silicon carbide (SiC) with a band gap larger than that of silicon has attracted attention. Since SiC has a large band gap, its dielectric breakdown voltage is about ten times larger than that of silicon. Thus, the film thickness of a device made of SiC can be made thinner than that of a device made of Si and, as a result, a resistance value at the time of conduction (on-resistance value) Ron can be significantly reduced. Therefore, in the device made of SiC, a conduction loss (Ron×$i^2$) represented by the product of a resistance value Ron and a conductance current i can be significantly reduced to greatly contribute to an improvement in efficiency of electric power. By focusing on this feature, MOSFETs, Schottky diodes, and junction FETs using SiC have been developed both domestically and overseas.

In particular, when attention is focused on a switching element, commercialization of junction FETs (JFETs) made of SiC has started early. Compared with a MOSFET made with SiC, for example, this junction FET does not require a gate insulating film formed of a silicon oxide film, and therefore a defect at an interface between the silicon oxide film and SiC and problems typified by deterioration in element characteristics associated with this defect can be avoided. Also, since this junction FET can control ON/OFF of a channel by controlling extension of a depletion layer due to pn junction, it is possible to easily make a normally-off-type junction FET and a normally-on-type junction FET individually. As just described, compared with the MOSFET made of SiC, the junction FET made of SiC has features of being excellent in long-term reliability and easy to fabricate devices.

Among junction FETs made of SiC, in the normally-on-type junction FET, a channel is normally turned ON to cause a current to flow. When the channel is required to be turned OFF, a negative voltage is applied to the gate electrode and the depletion layer is extended from the pn junction to turn the channel OFF. Therefore, if the junction FET is broken because of some reasons, the current continues to flow with the channel ON. Normally, it is desirable in view of safety (fail-safe) that the current does not flow when the junction FET is broken. However, in the normally-on-type junction FET, the current continues to flow even when the junction FET is broken, and therefore its intended use is limited. Therefore, in view of fail-safe, the normally-off-type junction FET is desired.

However, the normally-off-type junction FET has a problem as described below. That is, the gate electrode and the source region of the junction FET have a pn-junction diode structure formed of a p-type semiconductor region (gate electrode) and an n-type semiconductor region (source region), respectively. Therefore, if a voltage between the gate electrode and the source region becomes on the order of 3 V, a parasitic diode between the gate electrode and the source region is turned ON. As a result, a large current may flow between the gate electrode and the source region, thereby possibly causing excessive heating and breakage of the junction FET. Thus, to use the junction FET as a normally-off-type switching element, it is desirable to limit the gate voltage to a low voltage on the order of 2.5 V for use in the state in which the parasitic diode is not turned ON or the diode current between the gate electrode and the source region is sufficiently small. Note that, to a normal MOSFET made with Si, a gate voltage of 0 to 15 V or 20 V or so is applied. For this reason, to use the normally-off-type junction FET, it is required to add, in addition to the existing MOSFET gate driver circuit, a step-down circuit (a DC/DC converter) for generating a voltage on the order of 2.5 V, a level conversion circuit, and others. This design change, that is, component addition, results in an increase in cost of the entire system. For this, while the junction FET has a feature of being excellent in long-term reliability and easy to fabricate, the gate voltage for driving is significantly different from that of a general MOSFET, and therefore a large design change including changes of a drive circuit and others is required when a junction FET is newly used. This poses a problem of increasing cost in the entire system.

As a method of solving this problem, a cascode connection scheme is present. This cascode connection scheme is a scheme in which a normally-on-type junction FET made with SiC and a low-withstand-voltage MOSFET made of Si are connected together in series. When this connection scheme is adopted, the gate driver circuit drives the low-withstand-voltage MOSFET, and the gate driver circuit is not required to be changed. On the other hand, the withstand voltage between the drain and the source can be determined by the characteristics of a junction FET with high dielectric voltage. Furthermore, even in the case of a cascode connection, the low on-resistance of the junction FET and the low on-resistance of the low-withstand-voltage MOSFET are connected in series, and therefore the on-resistance of the cascode-connected switching element can also be relatively reduced. As just described, the cascode connection scheme has a possibility of solving the problem of the normally-off-type junction FET.

Figure 1:
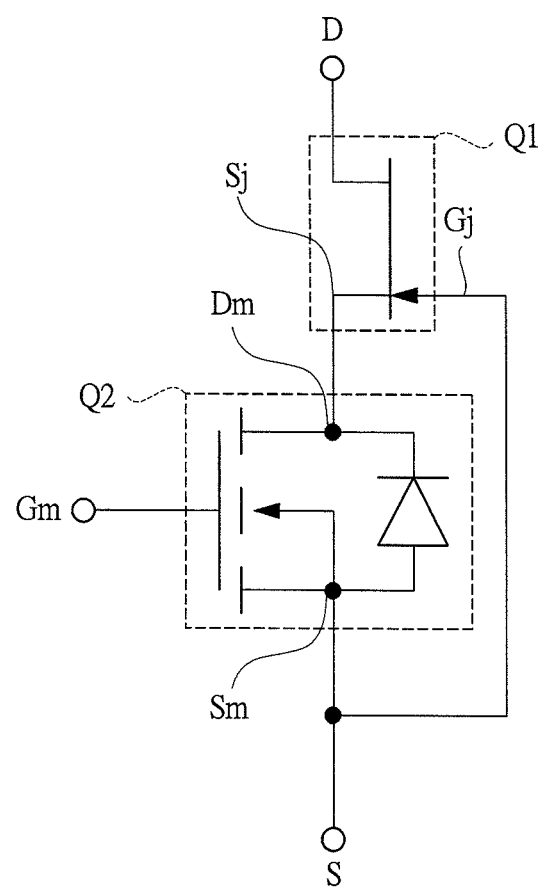
FIG. 1 is a diagram illustrating a circuit structure of a switching element adopting a cascode connection scheme.

FIG. 1 is a diagram illustrating a circuit structure of a switching element adopting a cascode connection scheme. As illustrated in FIG. 1, the switching element adopting the cascode connection scheme has a structure in which a normally-on-type junction FET Q1 between a source S and a drain D and a normally-off-type MOSFET Q2 are connected together in series. Specifically, the junction FET Q1 is disposed on the drain D side, and the MOSFET Q2 is disposed on the source S side. That is, a source Sj of the junction FET Q1 is connected to a drain Dm of the MOSFET Q2, and a source Sm of the MOSFET Q2 is connected to the source S of the switching element. Also, a gate electrode Gj of the junction FET Q1 is connected to the source S of the switching element, and the gate electrode Gm of the MOSFET Q2 is connected to a gate driver circuit (not illustrated in the drawing).

Note that, as illustrated in FIG. 1, a free wheel diode is in inverse-parallel connection with the MOSFET Q2. This free wheel diode has a function of refluxing reverse current to release energy accumulated in an inductance. That is, when the switching element illustrated in FIG. 1 is connected to a load including an inductance, if the switching element is turned OFF, the inductance included in the load causes a reverse current in a direction in reverse to the direction in which the current of the MOSFET Q2 flows. Thus, with provision of a free wheel diode in inverse-parallel with the MOSFET Q2, the reverse current is refluxed to release energy accumulated in the inductance.

The connection scheme as described above is the cascode connection scheme. According to the switching element in which the cascode connection scheme is adopted, since the gate driver circuit (not illustrated in the drawing) first drives the gate electrode Gm of the MOSFET Q2, there is an advantage of eliminating the need of changing the gate driver circuit from the case in which a single MOSFET is used as a switching element.

Furthermore, since the junction FET Q1 uses, as a material, a substance typified by silicon carbide (SiC) with a band gap larger than that of silicon (Si), the dielectric voltage of the junction FET Q1 is increased. Thus, the withstand voltage of the cascode-connected switching element is determined mainly by the characteristics of the junction FET Q1. Therefore, the dielectric voltage required in the MOSFET Q2 connected to the junction FET Q1 in series can be made lower than that of the switching element using a single MOSFET. That is, even when the dielectric voltage is required as a switching element, a MOSFET with a low withstand voltage (for example, on the order of several tens of voltage) can be used as the MOSFET Q2. For this reason, the on-resistance of the MOSFET Q2 can be reduced. Furthermore, since the junction FET Q1 is configured of a normally-on-type junction FET, the on-resistance of the junction FET Q1 can also be reduced. As a result, according to the cascode-connected switching element, there is an advantage of eliminating the need of changing the design of the gate driver circuit, and it is possible to ensure dielectric resistance and reduce on-resistance both, thereby achieving an improvement in electrical characteristics of the semiconductor element (the switching element).

Also, as illustrated in FIG. 1, the cascode-connected junction FET Q1 is the junction FET Q1 of a normally-on type, and the gate electrode Gj of the junction FET Q1 is electrically connected to the source S of the switching element. As a result, the voltage between the gate electrode Gj of the junction FET Q1 and the source S is not forward-biased even at the time of switching (at the time of ON). Thus, a flow of a large current due to the parasitic diode of the junction FET Q1 does not occur in cascode connection, and therefore it is possible to restrain breakage of the switching element due to excessive heating. That is, in the normally-off-type junction FET, a positive voltage is applied to the gate electrode Gj with respect to the source S at the time of switching (at the time of ON). Here, since the source region of the junction FET Q1 is formed of an n-type semiconductor region and the gate electrode Gj is formed of a p-type semiconductor region, application of a positive voltage to the gate electrode Gj with respect to the source S means application of a forward voltage (forward bias) between the source region and Gj. For this reason, if the forward voltage is too large in the normally-off-type junction FET, the parasitic diode formed of the source region and the gate electrode Gj is turned ON. As a result, a large current may flow between the gate electrode Gj and the source region, and there is a possibility of causing excessive heating and breakage of the junction FET. By contrast, in the cascode-connected switching element, the normally-on-type junction FET Q1 is used, and the gate electrode Gj is electrically connected to the source S of the switching element. Thus, the voltage between the gate electrode Gj of the junction FET Q1 and the source S is not forward-biased even at the time of switching (at the time of ON). Therefore, since a flow of a large current due to the parasitic diode of the junction FET Q1 does not occur in cascode connection, it is possible to suppress breakage of the switching element due to excessive heating.

As just described, the cascode-connected switching element has various advantages as described above. As a result of studies by the inventors, a problem as described below has been newly found. That is, to achieve a cascode connection, it is required to connect a semiconductor chip in which the junction FET Q1 is formed and a semiconductor chip in which the MOSFET Q2 with a low withstand voltage together via a bonding wire. For this reason, for example, the drain Dm of the MOSFET Q2 with a low withstand voltage and the source Sj of the junction FET Q1 are connected together via a bonding wire. In this case, a parasitic inductance by a bonding wire is added to the source Sj of the junction FET Q1. With such addition of the parasitic inductance, a large surge voltage occurs at the time of switching, thereby applying a voltage larger than or equal to the withstand voltage to the MOSFET Q2 with low withstand voltage. As a result, the MOSFET Q2 with a low withstand voltage operates in an avalanche mode, and a large current uncontrollable by the gate electrode Gm flows to the MOSFET Q2 with a low withstand voltage, possibly resulting in element breakdown. That is what the inventors have newly found. This mechanism will be described in detail below.

<Mechanism of Problem Occurrence>

Figure 2B:
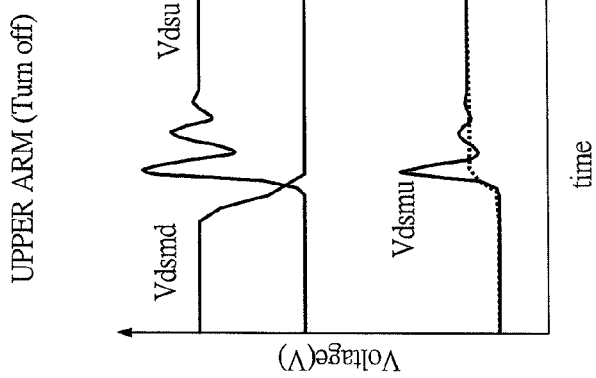
FIG. 2B is a diagram illustrating waveforms when a switching element configuring an upper arm is turned ON, and FIG. 2C is a diagram illustrating waveforms when the switching element configuring the upper arm is turned OFF.
Figure 2C:
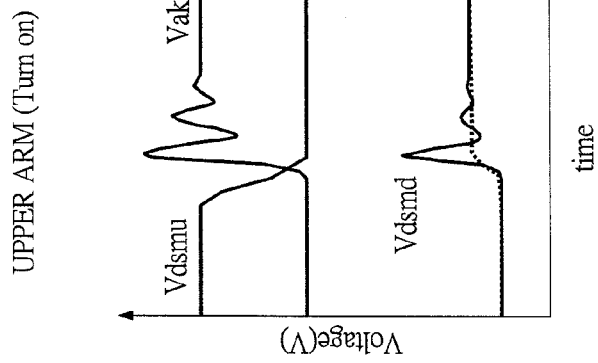
FIG. 2A is a circuit diagram illustrating an inverter in which a junction FET and a MOSFET which are in a cascode connection with each other are used as switching elements.
Figure 2A:
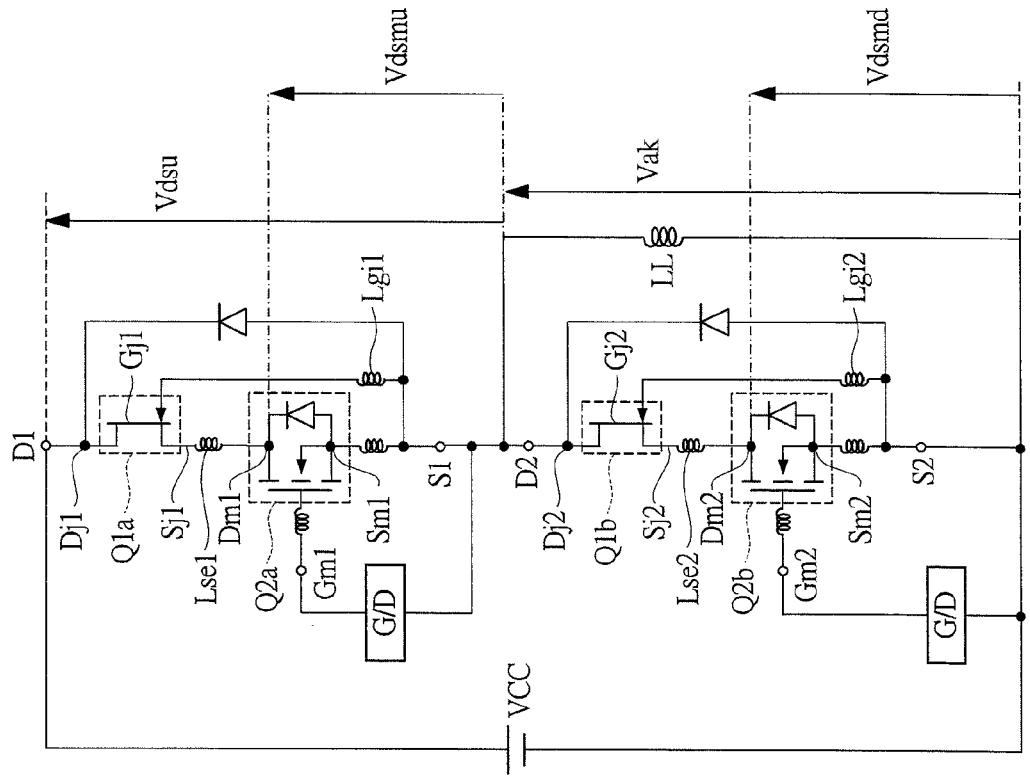

FIG. 2A is a circuit diagram illustrating an inverter in which a junction FET and a MOSFET which are in a cascode connection with each other are used as switching elements. The inverter illustrated in FIG. 2A has an upper arm and a lower arm connected in series to a power supply VCC. The upper arm is configured of a switching element connected between a drain D1 and a source S1. The switching element configuring the upper arm is configured of a junction FET Q1a and a MOSFET Q2a which are in cascode connection with each other. Specifically, a drain Dj1 of the junction FET Q1a is connected to the drain D1 of the switching element, and a source Sj1 of the junction FET Q1a is connected to a drain Dm1 of the MOSFET Q2a. And, a source 5 ml of the MOSFET Q2a is connected to the source S1 of the switching element. Also, a gate electrode Gj1 of the junction FET Q1a is connected to the source S1 of the switching element, and a gate driver circuit (G/D) is connected between a gate electrode Gm1 of the MOSFET Q2a and the source S1 of the switching element.

Here, a parasitic inductance Lse1 based on a bonding wire is present between the source Sj1 of the junction FET Q1a and the drain Dm1 of the MOSFET Q2a, and a parasitic inductance Lgi1 based on a bonding wire is present between the gate electrode Gj1 of the junction FET Q1a and the source S1 of the switching element. Note in FIG. 2A that a voltage between the source S1 of the switching element and the drain D1 of the switching element is defined as the voltage Vdsu and a voltage between the source S1 of the switching element and the drain Dm1 of the MOSFET Q2a is defined as the voltage Vdsmu.

Similarly, as illustrated in FIG. 2A, the lower arm is configured of a switching element connected between a drain D2 and a source S2. The switching element configuring the lower arm is configured of a junction FET Q1b and a MOSFET Q2b which are in a cascode connection with each other. Specifically, a drain Dj2 of the junction FET Q1b is connected to the drain D2 of the switching element, and a source Sj2 of the junction FET Q1b is connected to a drain Dm2 of the MOSFET Q2b. And, a source Sm2 of the MOSFET Q2b is connected to the source S2 of the switching element. Also, a gate electrode Gj2 of the junction FET Q1b is connected to the source S2 of the switching element, and a gate driver circuit (G/D) is connected between a gate electrode Gm2 of the MOSFET Q2b and the source S2 of the switching element. Furthermore, the load inductance LL is connected between the source S2 of the switching element and the drain D2 of the switching element.

Here, the parasitic inductance Lse2 based on a bonding wire is present between Sj2 of the junction FET Q1b and the drain Dm2 of the MOSFET Q2b, and a parasitic inductance Lgi2 based on a bonding wire is present between the gate electrode Gj2 of the junction FET Q1b and the source S2 of the switching element. Note in FIG. 2A that a voltage between the source S2 of the switching element and the drain D2 of the switching element is defined as the voltage Vak and a voltage between the source S2 of the switching element and the drain Dm2 of the MOSFET Q2b is defined as the voltage Vdsmd.

The inverter using the cascode-connected switching elements is configured as described above. In the following, the mechanism of problem occurrence will be described below with describing the operation of this inverter. First, the case is described in which the switching element configuring the upper arm is turned ON. That is, the case is described in which a power supply voltage is applied to a load (including a load inductance) by turning the switching element configuring the upper arm ON and turning the switching element configuring the lower arm OFF.

FIG. 2B illustrates waveforms when the switching element configuring the upper arm is turned ON. Specifically, when the switching element configuring the upper arm is turned ON, the junction FET Q1a and the MOSFET Q2a configuring the upper arm are turned ON. Therefore, a reflux current flows along a route from the drain Dj1 of the junction FET Q1a via the drain Dm1 and the source Smd of the MOSFET Q2a through the load inductance LL to return to the power supply VCC. Here, as illustrated in FIG. 2B, the voltage Vdsmu is changed from a predetermined voltage to about 0 V and, on the other hand, the voltage Vak increases from 0 V when the switching element of the upper arm is turned OFF to a voltage approximately equal to the power supply voltage. As a result, the voltage Vdsmd representing a drain voltage of the MOSFET Q2b of the lower arm increases to a voltage at which the junction FET Q1b of the lower arm is cut off. After the junction FET Q1b of the lower arm is turned OFF, a certain constant voltage is maintained. This change of the voltage Vdsmd represents a change in an ideal state in which the parasitic inductance is negligible, and is indicated by a broken line in FIG. 2B. However, as the parasitic inductance Lse2 and the parasitic inductance Lgi2 increase, the voltage Vdsmd abruptly and significantly increases when the switching element of the upper arm is turned ON, as indicated by a solid line in FIG. 2B.

On the other hand, FIG. 2C illustrates waveforms when the switching element configuring the upper arm is turned OFF. Specifically, when the switching element configuring the upper arm is turned OFF, as illustrated in FIG. 2C, the voltage Vdsmd is changed from a predetermined voltage to about 0 V and, on the other hand, the voltage Vdsu is increased from 0 V when the switching element of the upper arm is turned ON to a voltage approximately equal to the power supply voltage. As a result, the voltage Vdsmu representing a drain voltage of the MOSFET Q2a of the upper arm increases to a voltage at which the junction FET Q1a of the upper arm is cut off. After the junction FET Q1a of the upper arm is turned OFF, a certain constant voltage is maintained. This change of the voltage Vdsmu represents a change in an ideal state in which the parasitic inductance is negligible, and is indicated by a broken line in FIG. 2C. However, as the parasitic inductance Lse1 and the parasitic inductance Lgi1 increase, the voltage Vdsmu abruptly and significantly increases when the switching element of the upper arm is turned OFF, as indicated by a solid line in FIG. 2C.

As just described, it can be found that a phenomenon occurs in which the voltage Vdsmd representing a drain voltage of the MOSFET Q2b of the lower arm to be turned OFF abruptly increases when the switching element of the upper arm is turned ON and a phenomenon occurs in which the voltage Vdsmu representing a drain voltage of the MOSFET Q2a of the upper arm to be turned OFF abruptly increases when the switching element of the upper arm is turned OFF. Since mechanism of occurrence of these phenomena are similar to each other, a description will be made about mechanisms of occurrence of the phenomenon in which the voltage Vdsmd representing a drain voltage of the MOSFET Q2b of the lower arm to be turned OFF abruptly increases, by focusing on the case in which the switching element of the upper arm is turned ON. As mechanisms of occurrence of this phenomenon, the following three mechanisms can be thought of.

A first mechanism is caused by the parasitic inductance Lse2 that is present between the source Sj2 of the junction FET Q1b configuring the lower arm and the drain Dm2 of the MOSFET Q2b configuring the lower arm. Specifically, the switching element of the upper arm is turned ON, the MOSFET Q2b of the lower arm is turned OFF. Here, the voltage Vak starts to increase from approximately 0 V and, as the increase of this voltage Vak, the voltage Vdsmd representing a drain voltage of the MOSFET Q2b of the lower arm also starts to increase. However, at an initial stage in which the voltage Vdsmd increases, the voltage Vdsmd is not larger than the gate voltage applied to the gate electrode Gj2 of the junction FET Q1b by a predetermined value. Therefore, the junction FET Q1b is not cut off, and a current flows from the drain Dj2 to Sj2 of the MOSFET Q2b. As a result, the current flows into the drain Dm2 of the MOSFET Q2b, and electric charges are accumulated. Thus, the voltage Vdsmd representing a drain voltage of the MOSFET Q2b increases. And, when this voltage Vdsmd continues to increase to become larger than the gate voltage of the junction FET Q1b by the predetermined value, the junction FET Q1b is cut off, and a current does not flow any more. That is, at the initial stage in which the voltage Vdsmd increases, a current flows between the drain Dj2 and Sj2 of the junction FET Q1b, and electric charges are accumulated in the drain Dm2 of the MOSFET Q2b, thereby increasing the voltage Vdsmd. Then, as the voltage Vdsmd increases, the voltage Vdsmd becomes closer to a state of being larger than the gate voltage of the junction FET Q1b by the predetermined value, and therefore the current flowing between the drain Dj2 and Sj2 of the junction FET Q1b gradually decreases. Then, eventually, the voltage Vdsmd becomes larger than the gate voltage of the junction FET Q1b by the predetermined value, thereby cutting off the junction FET Q1b. After the junction FET Q1b is cut off, no electric charge flows into the drain Dm2 of the MOSFET Q2b, and therefore Vdsmd becomes substantially constant.

As just described, when the switching element of the upper arm is turned ON, the MOSFET Q2b of the lower arm is turned OFF. At this stage, the junction FET Q1b of the lower arm is not immediately cut off, and a current flows from the drain Dj2 to Sj2 of the junction FET Q1b. Then, the current flowing into Sj2 of the junction FET Q1b flows via the parasitic inductance Lse2 into the drain Dm2 of the MOSFET Q2b. Here, the point to be focused on is that the current flowing from the drain Dj2 to Sj2 of the junction FET Q1b of the lower arm decreases. This means that the current flowing through the parasitic inductance Lse2 also decreases with time. As a result, in Lse2, an electromotive force occurs so as to cancel the decrease of the current. That is, the parasitic inductance Lse2 functions to increase the current flowing from the drain Dj2 to Sj2 of the junction FET Q1b. For this reason, when the parasitic inductance Lse2 increases, a large current transiently flows from the drain Dj2 to Sj2 of the junction FET Q1b. As a result, the electric charge flowing into the drain Dm2 of the MOSFET Q2b abruptly increases, thereby abruptly increasing the voltage Vdsmd. This is the first mechanism.

Next, a second mechanism is caused by the parasitic inductance Lgi2 that is present between the gate electrode Gj2 of the junction FET Q1b configuring the lower arm and the source S2 of the lower arm. Specifically, when the switching element of the upper arm is turned ON, the MOSFET Q2b of the lower arm is turned OFF. Here, the voltage Vak starts to increase from approximately 0 V. For example, as illustrated in FIG. 2B, at the initial stage in which the switching element of the upper arm is turned ON, the voltage Vak oscillates to a range exceeding the power supply voltage. This is based on counter-electromotive force caused by the load inductance LL included in the load connected to the inverter. Therefore, the voltage Vak fluctuates at the stage in which the upper arm is turned ON. Here, when attention is focused on the junction FET Q1$b$, a parasitic capacitance is formed between the drain Dj2 and the gate electrode Gj2 of the junction FET Q1$b$. When the voltage Vak fluctuates, a voltage applied to this parasitic capacitance also fluctuates. And, since the capacitance value of this parasitic capacitance is relatively large, a charge/discharge current occurring with fluctuations of the voltage applied to the parasitic capacitance is increased. This charge/discharge current flows between the gate electrode Gj2 of the junction FET Q1$b$ and the source S2 of the lower arm. Here, the charge/discharge current is a temporally-changing current. For this reason for example, if the parasitic inductance Lgi2 is present between the gate electrode Gj2 of the junction FET Q1$b$ and the source S2 of the lower arm, the temporally-changing charge/discharge current flows through Lgi2, and therefore a resistance component in proportion to the product of the magnitude of the parasitic inductance Lgi2 and the time derivative of the charge/discharge current occurs between the gate electrode Gj2 of the junction FET Q1$b$ and the source S2 of the lower arm. As a result, the potential of the gate electrode Gj2 of the junction FET Q1$b$ and the potential of the source S2 of the lower arm are not equal to each other, and a mode occurs in which the gate electrode Gj2 of the junction FET Q1$b$ increases in a positive voltage direction with respect to the source S2 of the lower arm. In this case, since the gate electrode Gj2 of the junction FET Q1$b$ has a positive voltage, the depletion layer extending from the gate electrode Gj2 of the junction FET Q1$b$ is suppressed to increase the width of the channel region. For this reason, a current flowing from the drain Dj2 toward Sj2 of the junction FET Q1$b$ transiently increases. As a result, the electric charge flowing into the drain Dm2 of the MOSFET Q2$b$ abruptly increases, thereby abruptly increasing the voltage Vdsmd. This is the second mechanism. Furthermore, since a positive voltage is applied to the gate electrode Gj2 of the junction FET Q1$b$, a voltage larger than the one when 0 V is applied to the gate electrode Gj2 has to be applied to the source Sj2 of the junction FET Q1$b$ in order to cut off the junction FET Q1$b$. Also from this point of view, the voltage Vdsmd increasing until the junction FET Q1$b$ is cut off is increased.

Furthermore, a third mechanism is caused by a parasitic resistance that is present between the gate electrode Gj2 of the junction FET Q1$b$ configuring the lower arm and the source S2 of the lower arm. As described in the second mechanism, the charge/discharge current flows between the gate electrode Gj2 of the junction FET Q1$b$ and the source S2 of the lower arm. Thus, if a parasitic resistance is present between the gate electrode Gj2 of the junction FET Q1$b$ and the source S2 of the lower arm, the charge/discharge current flows through this parasitic resistance to decrease voltage. As a result, the potential of the gate electrode Gj2 of the junction FET Q1$b$ and the potential of the source S2 of the lower arm are not equal to each other, and a mode occurs in which the gate electrode Gj2 of the junction FET Q1$b$ increases in a positive voltage direction with respect to the source S2 of the lower arm. For this reason, also in the third mechanism, as with the second mechanism, the gate electrode Gj2 of the junction FET Q1$b$ has a positive voltage, and therefore the depletion layer extending from the gate electrode Gj2 of the junction FET Q1$b$ is suppressed to increase the width of the channel region. Therefore, the current flowing from the drain. Dj2 toward Sj2 of the junction FET Q1$b$ transiently increases. As a result, the electric charge flowing into the drain Dm2 of the MOSFET Q2$b$ abruptly increases, thereby abruptly increasing the voltage Vdsmd.

As described above, it can be found that the voltage Vdsmd is abruptly increased by the first mechanism to the third mechanism regarding the parasitic inductances Lse2, Lgi2, and the parasitic resistance. As just described, when the parasitic inductances Lse2, Lgi2, and the parasitic resistance are increased, the voltage Vdsmd representing a drain voltage of the MOSFET Q2$b$ of the lower arm increases to a voltage larger than or equal to the withstand voltage of the MOSFET Q2$b$, thereby causing the MOSFET Q2$b$ of the lower arm to perform avalanche operation and eventually possibly breaking down the MOSFET Q2$b$ of the lower arm.

Specifically, when a voltage larger than or equal to the withstand voltage is applied to the MOSFET Q2$b$, a region of electric field concentration locally occurs inside the MOSFET Q2$b$. In this region, a large amount of positive-hole electron pairs due to impact ionization occur. With the occurrence of the large amount of positive-hole electron pairs, a parasitic npn bipolar transistor formed of a source region (n-type semiconductor region), a channel formation region (p-type semiconductor region), and a drift region (n-type semiconductor region) is turned ON. In a cell in which the parasitic npn bipolar transistor is turned ON (MOSFET Q2$b$), a large current uncontrollable by the gate electrode Gm2 of the MOSFET Q2$b$ flows to generate heat. Here, since an electric resistance of the semiconductor regions is decreased due to an increase in temperature by heat, a positive feedback occurs in which a further larger current flows. As a result, the large current locally flows to break down the MOSFET Q2$b$. This phenomenon is called avalanche breakdown. The occurrence of this avalanche breakdown invites a decrease in reliability of the semiconductor device.

Thus, in a first embodiment, contrivance of reducing parasitic inductance and parasitic resistance is provided in order to suppress application of a voltage larger than or equal to the dielectric voltage to the MOSFET, which would cause avalanche breakdown. In the following, the technical idea of providing this contrivance in the first embodiment will be described. The first embodiment has a feature in which contrivance is provided to the mount configuration of the semiconductor device, and the mount configuration of the semiconductor device including this feature point is described herein.

<Mount Configuration of Semiconductor Device in First Embodiment>

Figure 3:
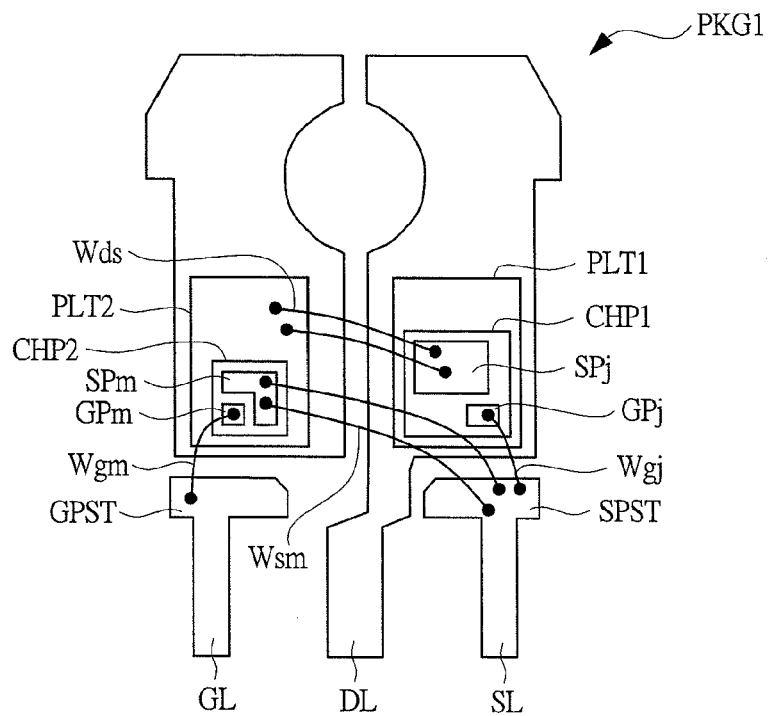
FIG. 3 is a diagram illustrating a mount configuration of a semiconductor device in a first embodiment of the present invention.

FIG. 3 is a diagram illustrating a mount configuration of a package (semiconductor device) PKG1 in the first embodiment. As illustrated in FIG. 3, the package PKG1 in the first embodiment has two chip mount units, that is, a chip mount unit PLT1 and a chip mount unit PLT2 which are electrically insulated from each other. In FIG. 3, a metal plate disposed on the right side configures the chip mount unit PLT1, and a metal plate disposed on the left side configures the chip mount unit PLT2. The chip mount unit PLT1 is integrally formed so as to be coupled to a drain lead DL, and the chip mount unit PLT1 and the drain lead DL are electrically connected to each other. And, a source lead SL and a gate lead GL are disposed so as to interpose the drain lead DL with spaces. Specifically, as illustrated in FIG. 3, the source lead SL is disposed on the right side of the drain lead DL, and the gate lead GL is disposed on the left side of the drain lead DL. These drain lead DL, the source lead SL, and the gate lead GL are electrically insulated from each other. And, a source lead post portion SPST formed of a wide-width region is formed at the tip of the source lead SL, and a gate lead post portion GPST formed of a wide-width region is formed at the tip of the gate lead GL.

Next, the semiconductor chip CHP1 is mounted on the chip mount unit PLT1 via, for example, a conductive adhesive material made of silver paste or solder. On this semiconductor chip CHP1, for example, a junction FET made of SiC is formed. And, the back surface of the semiconductor chip CHP1 serves as a drain electrode, and the source pad SPj and the gate pad GPj are formed on the front surface (main surface) of the semiconductor chip CHP1. That is, a junction FET configuring part of the cascode-connection-scheme switching element is formed on the semiconductor chip CHP1, a drain electrode electrically connected to the drain of this junction FET is formed on the back surface of the semiconductor chip CHP1, and the source pad SPj electrically connected to the source of the junction FET and the gate pad GPj electrically connected to the gate electrode of the junction FET are formed on the front surface of the semiconductor chip CHP1.

Next, the semiconductor chip CHP2 is mounted on the chip mount unit PLT2 via, for example, a conductive adhesive material made of silver paste or solder. On this semiconductor chip CHP2, for example, a MOSFET made with Si is formed. Here, a back surface of the semiconductor chip CHP2 serves as a drain electrode, and a source pad SPm and a gate pad GPm are formed on a front surface (main surface) of the semiconductor chip CHP2. That is, a MOSFET configuring part of the cascode-connection-scheme switching element is formed on the semiconductor chip CHP2, a drain electrode electrically connected to the drain of this MOSFET is formed on the back surface of the semiconductor chip CHP2, and the source pad SPm electrically connected to the source of the MOSFET and the gate pad GPm electrically connected to the gate electrode of the MOSFET are formed on the front surface of the semiconductor chip CHP2.

And, the semiconductor chip CHP1 mounted on the chip mount unit PLT1 and the semiconductor chip CHP2 mounted on the chip mount unit PLT2 are connected together by bonding wires, thereby configuring a cascode-connected switching element. Specifically, as illustrated in FIG. 3, the gate pad GPj formed on the front surface of the semiconductor chip CHP1 and the source lead post portion SPST formed at the tip of the source lead SL are electrically connected together via a wire Wgj. Also, the source pad SPj formed on the front surface of the semiconductor chip CHP1 and the chip mount unit PLT2 are electrically connected together via a wire Wds. Furthermore, the source pad SPm formed on the front surface of the semiconductor chip CHP2 and the source lead post portion SPST formed at the tip of the source lead SL are electrically connected together via a wire Wsm. Also, the gate pad GPm formed on the front surface of the semiconductor chip CHP2 and the gate lead post portion GPST formed at the tip of the gate lead GL are electrically connected together via a wire Wgm. Here, a region in which the wire Wgj and the wire Wsm are connected in the source lead post portion SPST and a region in which the wire Wgm is connected in the gate lead post portion GPST are configured to be placed each at a position higher than the upper surface of the chip mount unit PLT1 and the upper surface of the chip mount unit PLT2.

Note that the semiconductor chip CHP1 is mounted on the chip mount unit PLT1 via the conductive adhesive material and therefore the drain electrode formed on the back surface of the semiconductor chip CHP1 is electrically connected to the chip mount unit PLT1. Also, the semiconductor chip CHP2 is mounted on the chip mount unit PLT2 via the conductive adhesive material and therefore the drain electrode formed on the back surface of the semiconductor chip CHP2 is electrically connected to the chip mount unit PLT2.

In the above-structured package PKG1, the semiconductor chip CHP1, the semiconductor chip CHP2, part of the chip mount unit PLT1, part of the chip mount unit PLT2, part of the drain lead DL, part of the source lead SL, part of the gate lead GL, and the wire Wgj, the wire Wds, the wire Wgm, and the wire Wsm are at least sealed by a sealing body. Therefore, part of the sealing body is disposed between the chip mount unit PLT1 and the chip mount unit PLT2, thereby electrically insulating the chip mount unit PLT1 and the chip mount unit PLT2 from each other by the sealing body. Note that the lower surface of the chip mount unit PLT1 and the lower surface of the chip mount unit PLT2 may be configured to be exposed from the sealing body. In this case, heat generated in the semiconductor chip CHP1 and the semiconductor chip CHP2 can be efficiently dissipated from the lower surface of the chip mount unit PLT1 and the lower surface of the chip mount unit PLT2.

This sealing body has, for example, a rectangular parallelepiped shape, having a first side surface and a second side surface facing the first side surface. In this case, for example, part of the drain lead DL, part of the source lead SL, and part of the gate lead GL protrude from the first side surface of the sealing body. These protruding part of the drain lead DL, part of the source lead SL, and part of the gate lead GL function as external connection terminals.

Here, in the cascode-connected switching element, two semiconductor chips, that is, the semiconductor chip CHP1 and the semiconductor chip CHP2 are mounted. Therefore, an existing general-purpose package having only one chip mount unit in the package cannot be used as it is. For example, also in consideration of use with a large rated current larger than or equal to several A (amperes), a so-called vertical-type structure having a drain electrode on the back surface of the semiconductor chip is adopted in the junction FET formed on the semiconductor chip CHP1 and the MOSFET formed on the semiconductor chip CHP2. In this case, in the cascode-connection-scheme switching element, the drain electrode formed on the back surface of the semiconductor chip CHP1 and the drain electrode formed on the back surface of the semiconductor chip CHP2 cannot be electrically connected to each other. Thus, in the existing general-purpose package having only one chip mount unit in the package, if the semiconductor chip CHP1 and the semiconductor chip CHP2 are disposed on this one chip mount unit, the drain electrode formed on the back surface of the semiconductor chip CHP1 and the drain electrode formed on the back surface of the semiconductor chip CHP2 are electrically connected to each other, thereby making it impossible to achieve a cascode connection scheme.

Thus, in the first embodiment, as illustrated in FIG. 3, on the premise that the outer shape is equivalent to the general-purpose package, the package PKG1 is configured so that the two chip mount units, i.e., the chip mount unit PLT1 and the chip mount unit PLT2 electrically insulated from each other are provided inside the sealing body. And, the package PKG1 is configured so that the semiconductor chip CHP1 is mounted on the chip mount unit PLT1 and the semiconductor chip CHP2 is mounted on the chip mount unit PLT2. That is, the two chip mount units, i.e., the chip mount unit PLT1 and the chip mount unit PLT2 electrically insulated from each other are provided in the package PKG1, the semiconductor chip CHP1 and the semiconductor chip CHP2 are flatly disposed, and the semiconductor chip CHP1 and the semiconductor chip CHP2 flatly disposed are connected together via wires, thereby achieving a cascode connection.

For this reason, according to the package PKG1 in the first embodiment, for example, an existing general-purpose package in which a switching element for use in a power supply circuit or the like can be replaced with the package PKG1 in the first embodiment having equivalent outer dimensions. In particular, according to the package PKG1 in the first embodiment, the arrangement of the drain lead DL, the source lead SL, and the gate lead GL is similar to that of a general-purpose package, and therefore the general-purpose package can be replaced with the package PKG1 in the first embodiment, and no design change regarding other drive circuit and wiring of a printed board is required. Therefore, according to the first embodiment, the switching element using a general-purpose package can be easily changed to a high-performance cascode-connection-scheme switching element using the package PKG1 of the first embodiment, and a high-performance power supply system can be advantageously provided without a significant design change.

Feature points of the package PKG1 in the first embodiment will be described hereinafter. First, a first feature point in the first embodiment is that, as illustrated in FIG. 3, the gate pad GPj provided on the front surface of the semiconductor chip CHP1 in which the junction FET is formed and the source lead SL are disposed so as to be as close as possible to each other. Specifically, in the first embodiment, the chip mount unit PLT1 in which the semiconductor chip CHP1 is mounted is disposed on the same side as the side on which the source lead SL is disposed with respect to the drain lead DL. In this manner, the chip mount unit PLT1 can be made close to the source lead SL. This means that the semiconductor chip CHP1 mounted on the chip mount unit PLT1 can be disposed so as to be close to the source lead SL. And, in the first embodiment, the semiconductor chip CHP1 mounted on the chip mount unit PLT1 is disposed not on a center portion of the chip mount unit PLT1 but so as to be close to a side closest to the source lead SL of the chip mount unit PLT1. In this manner, the semiconductor chip CHP1 can be disposed so as to be closest to the source lead SL. Furthermore, in the first embodiment, the semiconductor chip CHP1 is disposed so as to be as close as possible to the source lead SL, and the gate pad. GPj formed on the front surface of the semiconductor chip CHP1 is disposed so as to be close to the source lead SL. As just described, in the first embodiment, the chip mount unit PLT1 in which the semiconductor chip CHP1 having the junction FET formed thereon is mounted is first disposed at a position close to the source lead SL and, furthermore, the semiconductor chip CHP1 is mounted in a region that is close to the source lead SL in an inner region inside the chip mount unit PLT1. Moreover, in the first embodiment, the gate pad GPj is disposed so that the gate pad GPj formed on the front surface of the semiconductor chip CHP1 is close to the source lead SL. In this manner, the gate pad GPj formed on the front surface of the semiconductor chip CHP1 and the source lead SL are made close to each other. In other words, in the first embodiment, the gate pad GPj formed on the front surface of the semiconductor chip CHP1 is disposed so as to be closer to the source lead SL than other leads (the drain lead DL and the gate lead GL). As a result, according to the first embodiment, the distance between the gate pad GPj and the source lead SL can be shortened, and therefore the length of the wire Wgj for connecting the gate pad GPj and the source lead SL together can be shortened. In particular, in the first embodiment, the structure is adopted in which, in the source lead SL, the wire Wgj is connected at the source lead post portion SPST with a wide width that is present at the tip close to GPj. Therefore, the length of the wire Wgj can be further shortened. When the length of the wire Wgj can be shortened, that means that the parasitic inductance (Lgi1 and Lgi2 of FIGS. 2A to 2C) that is present in the wire Wgj can be reduced. That is, according to the first embodiment, the parasitic inductance that is present in the wire Wgj can be sufficiently reduced. Thus, application of a voltage larger than or equal to the dielectric voltage to the MOSFET by the above-described second mechanism can be suppressed, thereby effectively suppressing avalanche breakdown of the cascode-connected MOSFET. As a result, according to the first embodiment, reliability of the semiconductor device can be improved.

Next, a second feature point in the first embodiment is described. The second feature point in the first embodiment is that, as illustrated in FIG. 3, the gate pad GPm provided on the front surface of the semiconductor chip CHP2 in which the MOSFET is formed and the gate lead GL are disposed so as to be as close as possible to each other. Specifically, in the first embodiment, the chip mount unit PLT2 in which the semiconductor chip CHP2 is mounted is disposed on the same side of the drain lead DL in which the gate lead GL is disposed. In this manner, the chip mount unit PLT2 can be made close to the gate lead GL. This means that the semiconductor chip CHP2 mounted on the chip mount unit PLT2 can be disposed so as to be close to the gate lead GL. And, in the first embodiment, the semiconductor chip CHP2 mounted on the chip mount unit PLT2 is disposed not on a center portion of the chip mount unit PLT2 but so as to be close to a side closest to the gate lead GL of the chip mount unit PLT2. In this manner, the semiconductor chip CHP2 can be disposed so as to be closest to the gate lead GL. Furthermore, in the first embodiment, the semiconductor chip CHP2 is disposed so as to be as close as possible to the gate lead GL, and the gate pad GPm formed on the front surface of the semiconductor chip CHP2 is disposed so as to be close to the gate lead GL. As just described, in the first embodiment, the chip mount unit PLT2 in which the semiconductor chip CHP2 having the MOSFET formed thereon is mounted is first disposed at a position close to the gate lead GL and, furthermore, the semiconductor chip CHP2 is mounted in a region that is close to the gate lead GL in an inner region inside the chip mount unit PLT2. Moreover, in the first embodiment, the gate pad GPm is disposed so that the gate pad GPm formed on the front surface of the semiconductor chip CHP2 is close to the gate lead GL. In this manner, the gate pad GPm formed on the front surface of the semiconductor chip CHP2 and the gate lead GL are made close to each other. In other words, in the first embodiment, the gate pad GPm formed on the front surface of the semiconductor chip CHP2 is disposed so as to be closer to the gate lead GL than other leads (the drain lead DL and the source lead SL). As a result, according to the first embodiment, the distance between the gate pad GPm and the gate lead GL can be shortened, and therefore the length of the wire Wgm for connecting the gate pad GPm and the gate lead GL together can be shortened. In particular, in the first embodiment, the structure is adopted in which, in the gate lead GL, the wire Wgm is connected at the gate lead post portion GPST with a wide width that is present at the tip close to GPm. Therefore, the length of the wire Wgm can be further shortened. In this manner, according to the first embodiment, the parasitic inductance of the wire Wgm can be reduced. This reduction in parasitic inductance of the wire Wgm contributes to an improvement in electrical characteristics of the cascode-connected switching element, but is not directly related to suppression of application of a voltage larger than or equal to the dielectric voltage to the MOSFET. According to the structure of the second feature point in the first embodiment, application of the voltage larger than or equal to the dielectric voltage to the MOSFET can be suppressed not directly but indirectly.

The above-described point is described hereinafter. As illustrated in FIG. 3, the second feature point in the first embodiment is that the semiconductor chip CHP2 in which the MOSFET is formed is disposed as close as possible to the gate lead GL. This means that the semiconductor chip CHP2 is disposed so as to be leaning to a frontward side of the chip mount unit PLT2 as illustrated in FIG. 3 and, in other words, means that a large space in which the semiconductor chip CHP2 is not mounted is formed on a depth side of the chip mount unit PLT2. As just described, the first embodiment has an indirect feature in which a large space in which the semiconductor chip CHP2 is not mounted can be ensured in the chip mount unit PLT2. Specifically, with this feature, as illustrated in FIG. 3, a wire connection region for electrically connecting the source pad SPj formed on the front surface of the semiconductor chip CHP1 mounted on the chip mount unit PLT1 and the chip mount unit PLT2 together can be sufficiently ensured. As a result, as illustrated in FIG. 3, the source pad SPj and the chip mount unit PLT2 can be connected together via a plurality of the wires Wds. Here, the chip mount unit PLT2 is electrically connected to the drain electrode formed on the back surface of the semiconductor chip CHP2 mounted thereon. Therefore, according to the first embodiment, the drain of the MOSFET and the source of the junction FET are connected together via the plurality of wires Wds. This means that the parasitic inductance (the parasitic inductance Lse1 and Lse2 of FIGS. 2A to 2C) of the wire Wds for connecting the drain of the MOSFET and the source of the junction FET together can be reduced. That is, according to the first embodiment, by using the plurality of wires Wds, the parasitic inductance between the drain of the MOSFET and the source of the junction FET can be sufficiently reduced.

Furthermore, as illustrated in FIG. 3, it is desirable to dispose the formation position of the source pad SPj formed on the front surface of the semiconductor chip CHP1 is as close as possible to the chip mount unit PLT2. This is because, with this arrangement, the length of the wire Wds for connecting the source pad SPj and the chip mount unit PLT2 together can be shortened as much as possible. Also in this manner, the parasitic inductance (Lse1 and Lse2 of FIGS. 2A to 2C) of the wire Wds for connecting the drain of the MOSFET and the source of the junction FET together can be reduced.

From above, according to the second feature point of the first embodiment, application of a voltage larger than or equal to the dielectric voltage to the MOSFET by the above-described first mechanism can be suppressed, thereby effectively suppressing avalanche breakdown of the cascode-connected MOSFET. As a result, according to the first embodiment, reliability of the semiconductor device can be improved.

Note in the first embodiment that, as illustrated in FIG. 3, the gate pad GPj is electrically connected to the source lead SL via the wire Wgj and the gate pad GPm is electrically connected to the gate lead GL via the wire Wgm. Here, the thickness (width) of the wire Wgj is desirably configured to be thicker than the thickness (width) of the wire Wgm. This is because, as the parasitic resistance that is present in the wire Wgj increases, the voltage larger than or equal to the dielectric voltage is applied to the MOSFET because of the third mechanism. Therefore, in view of reducing the parasitic resistance that is present in the wire Wgj, the structure is desirably taken in which the thickness of the wire Wgj is thicker than those of other wires. In this manner, the parasitic resistance between the gate electrode of the junction FET and the source of the switching element (this can be said as the source of the MOSFET) can be reduced. Thus, application of a voltage larger than or equal to the dielectric voltage to the MOSFET by the above-described third mechanism can be suppressed, thereby effectively suppressing avalanche breakdown of the cascode-connected MOSFET. As a result, according to the first embodiment, reliability of the semiconductor device can be improved.

Next, a third feature point in the first embodiment is described. The third feature point in the first embodiment is that, as illustrated in FIG. 3, the source pad SPm provided on the front surface of the semiconductor chip CHP2 in which the MOSFET is formed and the source lead SL (the source lead post portion SPST) are connected together via a plurality of the wire Wsm. In this manner, the parasitic resistance and the parasitic inductance between the source of the MOSFET and the source lead SL can be reduced. As a result, the potential of the source of the MOSFET can be restrained from fluctuating from a GND potential (reference potential) supplied from the source lead SL, and the source of the MOSFET can be reliably fixed to the GND potential. Furthermore, since the parasitic resistance between the source of the MOSFET and the source lead SL is reduced, the on-resistance of the cascode-connected switching element can also be reduced. As just described, according to the third feature point in the first embodiment, the electrical characteristics of the cascode-connected switching element formed in the package PKG can be improved.

As described above, according to the package PKG1 (semiconductor device) in the first embodiment, with provision of the above-described first and second feature points, application of a voltage larger than or equal to the dielectric voltage to the MOSFET can be suppressed, thereby effectively suppressing avalanche breakdown of the cascode-connected MOSFET. As a result, reliability of the semiconductor device can be improved. Furthermore, also with provision of the above-described third feature point to the package PKG1 (semiconductor device) in the first embodiment, the parasitic resistance and the parasitic inductance can be reduced. Therefore, the electrical characteristics of the semiconductor device can be improved.

As a specific effect associated with the package PKG1 of the first embodiment, the package PKG1 in the first embodiment adopts the structure in which the semiconductor chip CHP1 in which the junction FET is formed and the semiconductor chip CHP2 in which the MOSFET is formed are disposed in a plane. Therefore, the chip areas of the semiconductor chip CHP1 and the semiconductor chip CHP2 can be freely designed. Thus, low on-resistance and on-current density can also be easily designed, and switching elements with various specifications can be achieved.

Figure 4:
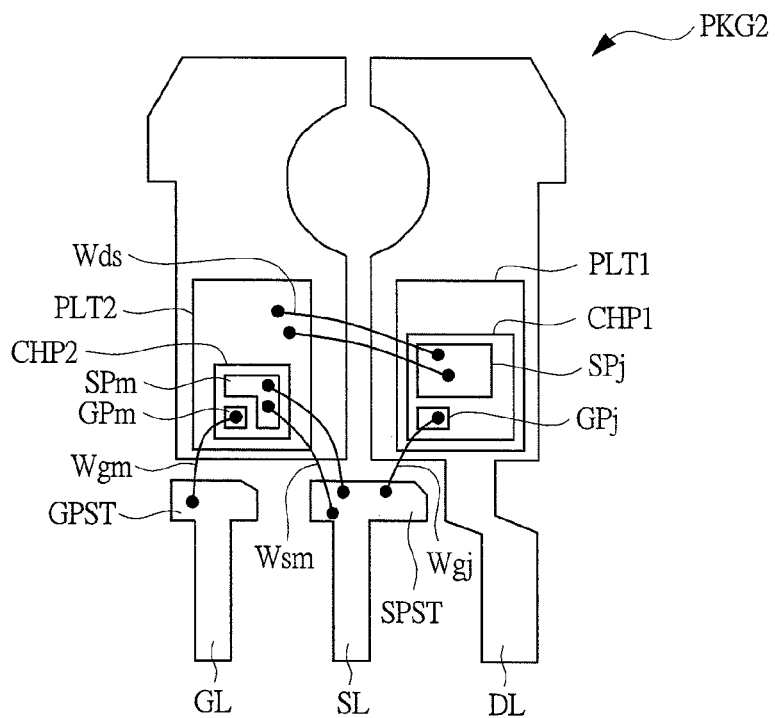
FIG. 4 is a diagram illustrating a mount configuration of another semiconductor device in the first embodiment.

Next, an example of another mount mode of the switching element in the first embodiment is described. FIG. 4 is a diagram illustrating a mount configuration of the package PKG2 in the first embodiment. The package PKG2 illustrated in FIG. 4 and the package PKG1 illustrated in FIG. 3 are different from each other in that the formation positions of the source lead SL and the drain lead DL are different. Specifically, in the package PKG1 illustrated in FIG. 3, the gate lead GL is disposed on the leftmost side, the drain lead DL is disposed at the center, and the source lead SL is disposed on the rightmost side. By contrast, in the package PKG2 illustrated in FIG. 4, the gate lead GL is disposed on the leftmost side, the source lead SL is disposed at the center, and the drain lead DL is disposed on the rightmost side. In this case, as illustrated in FIG. 4, with the change of the arrangement position of SL, the formation position of the gate pad GPj formed on the front surface of the semiconductor chip CHP1 is also changed so as to be closer to the source lead SL than to other leads. As a result, also in the package PKG2 illustrated in FIG. 4, the distance between the gate pad GPj and the source lead SL can be shortened. For this reason, the length of the wire Wgj for connecting the gate pad GPj and the source lead SL together can be shortened. That is, also in the package PKG2 illustrated in FIG. 4, the parasitic inductance that is present in the wire Wgj can be sufficiently reduced. Thus, application of a voltage larger than or equal to the dielectric voltage to the MOSFET by the above-described second mechanism can be suppressed, thereby effectively suppressing avalanche breakdown of the cascode-connected MOSFET. As a result, also in the package PKG2 illustrated in FIG. 4, reliability of the semiconductor device can be improved.

Furthermore, a feature point unique to the package PKG2 illustrated in FIG. 4 is that the length of the wire Wsm for electrically connecting the source pad SPm formed on the front surface of the semiconductor chip CHP2 and the source lead SL together can be sufficiently shortened compared with the package PKG1 illustrated in FIG. 3. For this reason, according to the package PKG2 illustrated in FIG. 4, the parasitic resistance and the parasitic inductance of the wire Wsm can be reduced, thereby improving electrical characteristics of the switching element in the first embodiment. In particular, the effect obtained by shortening the length of the wire Wsm becomes apparent in that the on-resistance of the switching element in the first embodiment is decreased.

FIRST MODIFICATION EXAMPLE

Next, a mount configuration of a package PKG3 in a first modification example is described. In the first modification example, the structure is described in which a semiconductor chip in which a junction FET is formed and a semiconductor chip in which a MOSFET is formed are multilayered.

Figure 5:
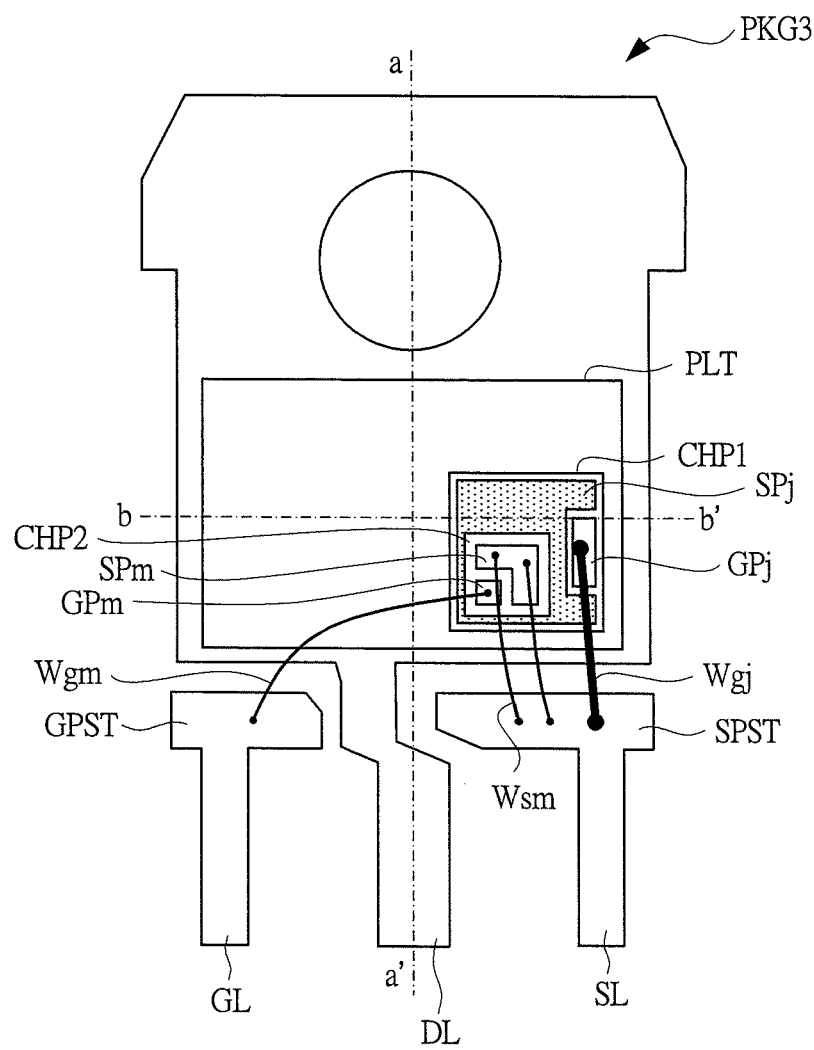
FIG. 5 is a diagram illustrating a mount configuration of a semiconductor device in a first modification example.

FIG. 5 is a diagram illustrating the mount configuration of the package PKG3 in the first modification example. In FIG. 5, for example, the package PKG3 in the first modification example has a chip mount unit PLT formed of a metal plate in a rectangular shape. This chip mount unit PLT is integrally formed so as to be coupled to the drain lead DL, and the chip mount unit PLT and the drain lead DL are electrically connected to each other. And, the source lead SL and the gate lead GL are disposed so as to interpose the drain lead DL with spaces. Specifically, as illustrated in FIG. 5, the source lead SL is disposed on the right side of the drain lead DL, and the gate lead GL is disposed on the left side of the drain lead DL. These drain lead DL, source lead SL, and the gate lead GL are electrically insulated from each other. And, the source lead post portion SPST formed of a wide-width region is formed at the tip of the source lead SL, and the gate lead post portion GPST formed of a wide-width region is formed at the tip of the gate lead GL.

Next, the semiconductor chip CHP1 is mounted on the chip mount unit PLT via, for example, a conductive adhesive material made of silver paste or solder. On this semiconductor chip CHP1, for example, a junction FET made with SiC is formed. And, the back surface of the semiconductor chip CHP1 serves as a drain electrode, and the source pad SPj and the gate pad GPj are formed on the front surface (main surface) of the semiconductor chip CHP1. That is, a junction FET configuring part of the cascode-connection-scheme switching element is formed on the semiconductor chip CHP1, a drain electrode electrically connected to the drain of this junction FET is formed on the back surface of the semiconductor chip CHP1, and the source pad SPj electrically connected to the source of the junction FET and the gate pad GPj electrically connected to the gate electrode of the junction FET are formed on the front surface of the semiconductor chip CHP1.

Next, the semiconductor chip CHP2 is mounted on this semiconductor chip CHP1 via, for example, a conductive adhesive material made of silver paste or solder. On this semiconductor chip CHP2, for example, a MOSFET made with Si is formed. Here, the back surface of the semiconductor chip CHP2 serves as a drain electrode, and the source pad SPm and the gate pad GPm are formed on the front surface (main surface) of the semiconductor chip CHP1. That is, a MOSFET configuring part of the cascode-connection-scheme switching element is formed on the semiconductor chip CHP2, a drain electrode electrically connected to the drain of this MOSFET is formed on the back surface of the semiconductor chip CHP2, and the source pad SPm electrically connected to the source of the MOSFET and the gate pad GPm electrically connected to the gate electrode of the MOSFET are formed on the front surface of the semiconductor chip CHP2.

As just described, in the first modification example, the semiconductor chip CHP2 is mounted on the semiconductor chip CHP1. In particular, the semiconductor chip CHP2 is mounted on the source pad SPj formed on the front surface of the semiconductor chip CHP1. In this manner, the drain electrode formed on the back surface of the semiconductor chip CHP2 and the source pad SPj formed on the front surface of the semiconductor chip CHP1 are electrically connected together. As a result, the source of the junction FET formed on the semiconductor chip CHP1 and the drain of the MOSFET formed on the semiconductor chip CHP2 are electrically connected together. Thus, the semiconductor chip CHP2 is required to be formed so as to be contained in the source pad SPj formed on the front surface of the semiconductor chip CHP1 in a planar view. That is, in the first modification example, the size of the semiconductor chip CHP2 is required to be smaller than the size of the semiconductor chip CHP1. Furthermore, the size of the semiconductor chip CHP2 is required to be smaller than the size of the source pad SPj.

Next, as illustrated in FIG. 5, the gate pad GPj formed on the front surface of the semiconductor chip CHP1 and the source lead post portion SPST formed at the tip of the source lead SL are electrically connected together via the wire Wgj. And, the source pad SPm formed on the front surface of the semiconductor chip CHP2 and the source lead post portion SPST formed at the tip of the source lead SL are electrically connected together via the wire Wsm. Also, the gate pad GPm formed on the front surface of the semiconductor chip CHP2 and the gate lead post portion GPST formed at the tip of the gate lead GL are electrically connected together via the wire Wgm. Here, a region in which the wire Wgj and the wire Wsm are connected in the source lead post portion SPST and a region in which the wire Wgm is connected in the gate lead post portion GPST are configured to be placed each at a position higher than the upper surface of the chip mount unit PLT1 and the upper surface of the chip mount unit PLT2.

In the package PKG3 structured in that manner, the semiconductor chip CHP1, the semiconductor chip CHP2, part of the chip mount unit PLT, part of the drain lead DL, part of the source lead SL, part of the gate lead GL, and the wire Wgj, the wire Wgm, and the wire Wsm are at least sealed by a sealing body. Note that the lower surface of the chip mount unit PLT may be configured to be exposed from the sealing body. In this case, heat generated in the semiconductor chip CHP1 and the semiconductor chip CHP2 can be efficiently dissipated from the lower surface of the chip mount unit PLT.

This sealing body has, for example, a rectangular parallelepiped shape, having a first side surface and a second side surface facing the first side surface. In this case, for example, part of the drain lead DL, part of the source lead SL, and part of the gate lead GL protrude from the first side surface of the sealing body. These protruding part of the drain lead DL, part of the source lead SL, and part of the gate lead GL function as external connection terminals.

The package PKG3 in the first modification example is configured as described above, and feature points of the package PKG3 in the first modification example will be described hereinafter. First, a feature point in the first modification example is that, as illustrated in FIG. 5, the gate pad GPj provided on the front surface of the semiconductor chip CHP1 in which the junction FET is formed and the source lead SL are disposed so as to be as close as possible to each other. Specifically, in the first modification example, the semiconductor chip CHP1 is disposed on the same side as the side in which the source lead SL is disposed with respect to the drain lead DL. That is, the semiconductor chip CHP1 is disposed so as to be leaning to a right side with respect to a center line a-a' illustrated in FIG. 5. In this manner, the semiconductor chip CHP1 can be made close to SL. And, in the first modification example, the semiconductor chip CHP1 is disposed not on a center portion of the chip mount unit PLT but so as to be close to a side closest to the source lead SL of the chip mount unit PLT. That is, the semiconductor chip CHP1 is disposed so as to be leaning to a frontward side (a lower side) with respect to a center line b-b' illustrated in FIG. 5. In this manner, the semiconductor chip CHP1 can be disposed so as to be close to a side closest to the source lead SL of the chip mount unit PLT. In other words, in the first modification example, the gate pad GPj formed on the front surface of the semiconductor chip CHP1 is disposed so as to be closer to the source lead SL than other leads (the drain lead DL and the gate lead GL). As a result, according to the first modification example, the distance between the gate pad GPj and the source lead SL can be shortened, and therefore the length of the wire Wgj for connecting the gate pad GPj and the source lead SL can be shortened. In particular, in the first modification example, the structure is adopted in which, in the source lead SL, the wire Wgj is connected at the source lead post portion SPST with a wide width that is present at the tip close to the gate pad GPj. Therefore, the length of the wire Wgj can be further shortened. When the length of the wire Wgj can be shortened, that means that the parasitic inductance (the parasitic inductance Lgi1 and the parasitic inductance Lgi2 of FIGS. 2A to 2C) that is present in the wire Wgj can be reduced. That is, according to the first modification example, the parasitic inductance that is present in the wire Wgj can be sufficiently reduced. Thus, application of a voltage larger than or equal to the dielectric voltage to the MOSFET by the above-described second mechanism can be suppressed, thereby effectively suppressing avalanche breakdown of the cascode-connected MOSFET. As a result, according to the first modification example, reliability of the semiconductor device can be improved.

Here, in view of shortening the length of the wire Wgj for connecting the gate pad GPj and the source lead SL, it can be thought that the gate pad GPj is disposed so as to be leaning on the side closest to the source lead SL of the semiconductor chip CHP1. However, in the first modification example, as illustrated in FIG. 5, the gate pad GPj is disposed so as to be aligned to a right side of the semiconductor chip CHP1 and be symmetrical to a center portion of the right side. The reason for this is as follows. That is, the gate pad GPj is connected to each gate electrode of a plurality of junction FETs formed inside the semiconductor chip CHP1 via gate wirings. Thus, for example, with the gate pad GPj being disposed so as to be symmetrical with respect to the center portion of the right side, variations in the distance between each gate electrode of the plurality of junction FETs and gate wirings for connecting the gate pad GPj can be suppressed. This means that the characteristics of the plurality of junction FETs formed inside the semiconductor chip CHP1 can be used as being made uniform. From this reason, in the first modification example, the gate pad GPj is disposed so as to be symmetrical to the center portion on the right side of the semiconductor chip CHP1.

Note in the first modification example that, as illustrated in FIG. 5, the gate pad GPj is electrically connected to the source lead SL via the wire Wgj and the gate pad GPm is electrically connected to the gate lead GL via the wire Wgm. Here, the thickness (width) of the wire Wgj is desirably configured to be thicker than the thickness (width) of the wire Wym. This is because, as the parasitic resistance that is present in the wire Wgj increases, the voltage larger than or equal to the dielectric voltage is applied to the MOSFET because of the third mechanism. Therefore, in view of reducing the parasitic resistance that is present in the wire Wgj, the structure is desirably taken in which the thickness of the wire Wgj is thicker than those of other wires. In this manner, the parasitic resistance between the gate electrode of the junction FET and the source of the switching element (this can be said as the source of the MOSFET) can be reduced. Thus, application of a voltage larger than or equal to the dielectric voltage to the MOSFET by the above-described third mechanism can be suppressed, thereby effectively suppressing avalanche breakdown of the cascode-connected MOSFET. As a result, according to the first modification example, reliability of the semiconductor device can be improved.

Next, a further feature point in the first modification example is described. The further feature point in the first modification is that, as illustrated in FIG. 5, the source pad SPm provided on the front surface of the semiconductor chip CHP2 in which the MOSFET is formed and the source lead SL (SPST) are connected together via a plurality of the wire Wsm. In this manner, the parasitic resistance and the parasitic inductance between the source of the MOSFET and the source lead SL can be reduced. As a result, the potential of the source of the MOSFET can be restrained from fluctuating from a GND potential (reference potential) supplied from the source lead SL, and the source of the MOSFET can be reliably fixed to the GND potential. Furthermore, since the parasitic resistance between the source of the MOSFET and the source lead SL is reduced, the on-resistance of the cascode-connected switching element can also be reduced. As just described, according to the further feature point in the first modification example, the electrical characteristics of the cascode-connected switching element formed in the package PKG3 can be improved.

Next, a feature point unique to the first modification example is described. The feature point unique to the first modification example is that, as illustrated in FIG. 5, the semiconductor chip CHP2 in which the MOSFET is formed is mounted on the semiconductor chip CHP1 in which the junction FET is formed. In this manner, the source pad SPj formed on the front surface of the semiconductor chip CHP1 and the drain electrode formed on the back surface of the semiconductor chip CHP2 can be directly connected together. That is, according to the first modification example, the source of the junction FET and the drain of the MOSFET can be directly connected together without using a wire. This means that the parasitic inductance that intervenes between the source of the junction FET and the drain of the MOSFET can be almost completely eliminated. That is, the feature point unique to the first modification example is that the semiconductor chip CHP2 is mounted directly on the semiconductor chip CHP1. According to this structure, no wire is required to connect the source of the junction FET and the drain of the MOSFET together. When a wire is used, the parasitic inductance that is present in the wire poses a problem. According to the first modification example, since the source of the junction FET and the drain of the MOSFET can be directly connected together without using a wire, the parasitic inductance (Lse1 and Lse2 of FIGS. 2A to 2C) between the drain of the MOSFET and the source of the junction FET can be almost completely eliminated. From the foregoing, according to the feature point unique to the first modification example, application of a voltage larger than or equal to the dielectric voltage to the MOSFET by the above-described first mechanism can be suppressed. In this manner, avalanche breakdown of the cascode-connected MOSFET can be effectively suppressed. As a result, according to the first modification example, reliability of the semiconductor device can be improved.

According to the package PKG3 in the first modification example, the semiconductor chip CHP1 and the semiconductor chip CHP2 are disposed so as to be multilayered on the chip mount unit PLT. Thus, in the package PKG3 in the first modification example, the structure may be such that one chip mount unit PLT is included in the package. Therefore, the existing general-purpose package having only one chip mount unit in the package can be used as it is. That is, according to the package PKG3 in the first modification example, since a so-called inexpensive general-purpose package can be used as it is, a cascode-connected high-performance switching element can be inexpensively provided. In other words, according to the first modification example, the cost of the package PKG3 in which a cascode-connected high-performance switching element is formed can be reduced.

Also, according to the first modification example, since the semiconductor chip CHP1 in which the junction FET is formed and the semiconductor chip CHP2 in which the MOSFET is formed are multilayered, the mount areas of the semiconductor chips can be also advantageously reduced. In particular, in this case, as illustrated in FIG. 5, since a large space can be ensured in the chip mount unit PLT, heat generated in the semiconductor chip CHP1 and the semiconductor chip CHP2 can be efficiently dissipated. Furthermore, according to the first modification example, since the mount area of the switching element can be reduced, a free wheel diode (a reflux diode), which is conventionally disposed on a printed board outside the package, and the switching element can be advantageously mounted on the same package. As a result, according to the first modification example, contributions can be made to reduction in mount area of the printed board. In this manner, cost of the entire system typified by the power supply system can be reduced.

Figure 6:
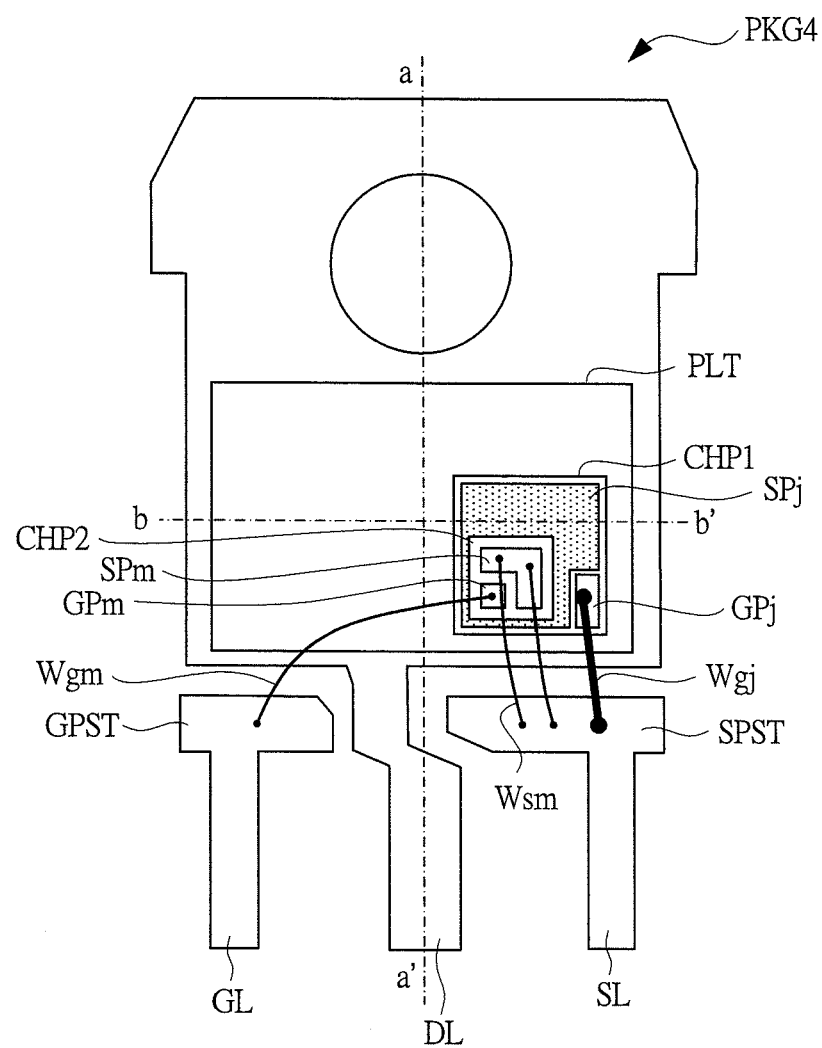
FIG. 6 is a diagram illustrating a mount configuration of another semiconductor device in the first modification example.

Next, an example of another mount mode of the switching element in the first modification example is described. FIG. 6 is a diagram illustrating a mount configuration of a package PKG4 in the first modification example. A difference between the package PKG4 illustrated in FIG. 6 and the package PKG3 illustrated in FIG. 5 is that the arrangement position of the gate pad GPj formed on the front surface of the semiconductor chip CHP1 is different. Specifically, in the package PKG3 illustrated in FIG. 5, the gate pad GPj is disposed so as to be along the right side of the semiconductor chip CHP1 and be symmetrical to the center portion of the right side. By contrast, in the package PKG4 illustrated in FIG. 6, the gate pad GPj is disposed so as to be leaning to a side closest to the source lead SL of the semiconductor chip CHP1. In this case, the distance from the gate pad GPj to the source lead SL can be minimized. Therefore, according to the package PKG4 illustrated in FIG. 6, the length of the wire Wgj for connecting the gate pad GPj and the source lead SL together can be minimized. In this manner, the parasitic inductance that is present in the wire Wgj can be minimized. Thus, application of a voltage larger than or equal to the dielectric voltage to the MOSFET by the above-described second mechanism can be suppressed, thereby effectively suppressing avalanche breakdown of the cascode-connected MOSFET. As a result, also in the package PKG4 illustrated in FIG. 6, reliability of the semiconductor device can be improved.

Figure 7:
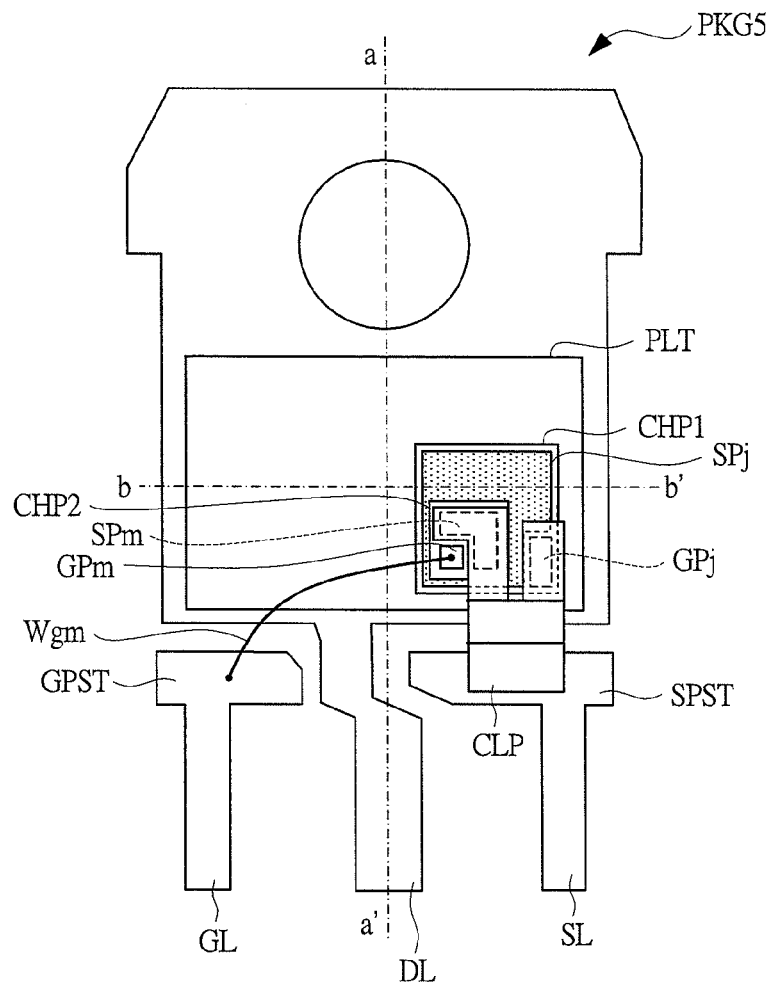
FIG. 7 is a diagram illustrating a mount configuration of still another semiconductor device in the first modification example.

An example of still another mount mode of the switching element in the first modification example is described. FIG. 7 is a diagram illustrating a mount configuration of a package PKG5 in the first modification example. In the package PKG5 illustrated in FIG. 7, a clip CLP formed of, for example, a copperplate (a metal plate), is used for connection between the gate pad GPj and the source lead SL and connection between the source pad SPm and SL. As just described, by using a copper plate, the conductor resistance is made smaller than that of a wire, thereby reducing the parasitic inductance. That is, by using the clip CLP with a metal plate structure, the parasitic inductance that is present between the gate pad GPj and the source lead SL and the parasitic inductance that is present between the source pad SPm and the source lead SL can be reduced.

In particular, according to the package PKG5 illustrated in FIG. 7, since the parasitic inductance that is present between the gate pad GPj and the source lead SL can be reduced, application of a voltage larger than or equal to the dielectric voltage to the MOSFET by the above-described second mechanism can be suppressed, thereby effectively suppressing avalanche breakdown of the cascode-connected MOSFET. As a result, according to the package PKG5 illustrated in FIG. 7, reliability of the semiconductor device can be improved. Furthermore, according to the package PKG5 illustrated in FIG. 7, since the parasitic inductance that is present between the source pad SPm and the source lead SL can be reduced, the electrical characteristics of the semiconductor device can also be improved.

Figure 8:
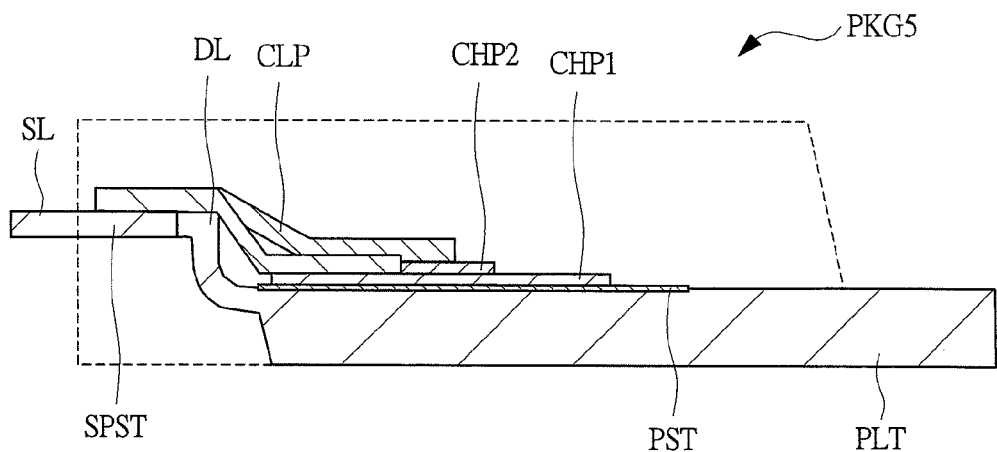
FIG. 8 is a cross-sectional view illustrating one cross section of FIG. 7.

FIG. 8 is a diagram illustrating one section of the package PKG5 in the first modification example. As illustrated in FIG. 8, the semiconductor chip CHP1 is mounted on the chip mount unit PLT via a conductive adhesive material PST. On this semiconductor chip CHP1, the semiconductor chip CHP2 is mounted via a conductive adhesive material (not illustrated in the drawing). And, the semiconductor chip CHP1 (gate pad) and the source lead SL, and the semiconductor chip CHP2 (source pad) and the source lead SL are electrically connected together via the clip CLP. Note that a broken line part represents a portion to be covered with a sealing body.

Figure 9:
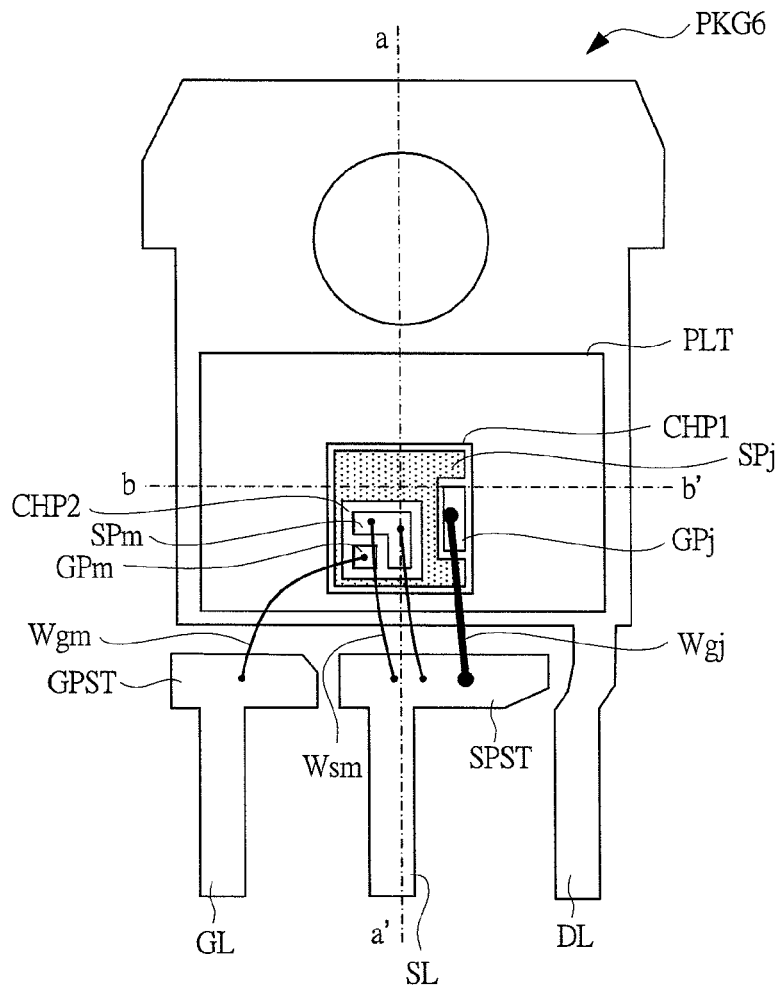
FIG. 9 is a diagram illustrating a mount configuration of still another semiconductor device in the first modification example.

Next, an example of still another mount mode of the switching element in the first modification example is described. FIG. 9 is a diagram illustrating a mount configuration of a package PKG6 in the first modification example. A difference between the package PKG6 illustrated in FIG. 9 and the package PKG3 illustrated in FIG. 5 is that the formation positions of the source lead SL and the drain lead DL are different. Specifically, in the package PKG3 illustrated in FIG. 5, the gate lead GL is disposed on the leftmost side, the drain lead DL is disposed at the center, and the source lead SL is disposed on the rightmost side. By contrast, in the package PKG6 illustrated in FIG. 9, the gate lead GL is disposed on the leftmost side, the source lead SL is disposed at the center, and the drain lead DL is disposed on the rightmost side. In this case, as illustrated in FIG. 9, with the change of the arrangement position of the source lead SL, the mount position of the semiconductor chip CHP1 mounted on the chip mount unit PLT is changed. That is, the arrangement position of the semiconductor chip CHP1 is changed so as to be closer to the source lead SL than to other leads. Specifically, the semiconductor chip CHP1 is disposed so as to be symmetrical with respect to a center line a-a' illustrated in FIG. 9 and is also disposed so as to be leaning to the frontward side (lower side) with respect to a center line b-b'. As a result, also in the package PKG6 illustrated in FIG. 9, the distance between the gate pad GPj and the source lead SL can be shortened. For this reason, the length of the wire Wgj for connecting the gate pad GPj and the source lead SL can be shortened. That is, also in the package PKG6 illustrated in FIG. 9, the parasitic inductance that is present in the wire Wgj can be sufficiently reduced. Thus, application of a voltage larger than or equal to the dielectric voltage to the MOSFET by the above-described second mechanism can be suppressed, thereby effectively suppressing avalanche breakdown of the cascode-connected MOSFET. As a result, also in the package PKG6 illustrated in FIG. 9, reliability of the semiconductor device can be improved.

Furthermore, a feature point unique to the package PKG6 illustrated in FIG. 9 is that the length of the wire Wgm for electrically connecting the gate pad GPm formed on the front surface of the semiconductor chip CHP2 and the gate lead GL together can be sufficiently shortened as compared with the package PKG3 illustrated in FIG. 5. Thus, according to the package PKG6 illustrated in FIG. 9, the parasitic resistance and the parasitic inductance of the wire Wgm can be reduced, thereby improving the electrical characteristics of the switching element in the first modification example.

Figure 10:
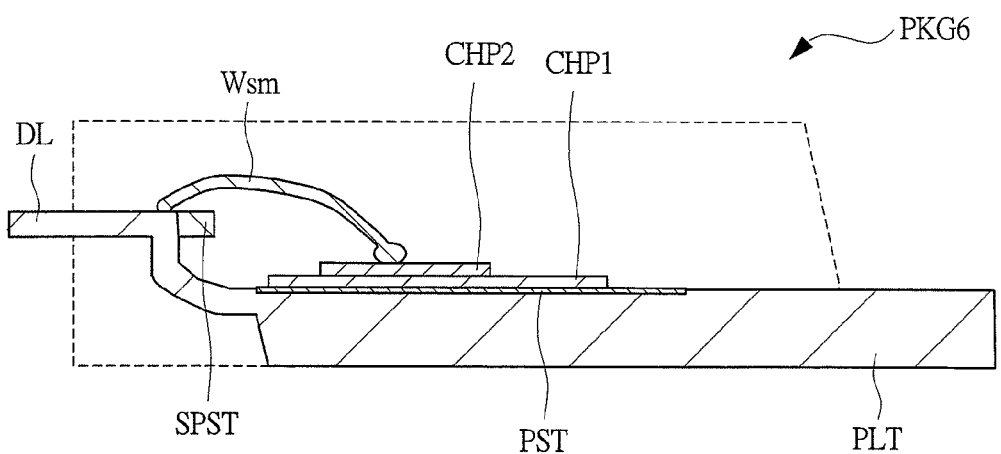
FIG. 10 is a cross-sectional view illustrating one cross section of FIG. 9.

Note that FIG. 10 is a diagram illustrating one section of the package PKG6 in the first modification example. As illustrated in FIG. 10, the semiconductor chip CHP1 is mounted on the chip mount unit PLT via the conductive adhesive material PST. On the semiconductor chip CHP1, the semiconductor chip CHP2 is mounted via a conductive adhesive material (not illustrated in the drawing). And the semiconductor chip CHP2 (source pad) and the source lead SL are electrically connected together via the wire Wsm. Note that a broken line part represents a portion to be covered with a sealing body.

Figure 11:
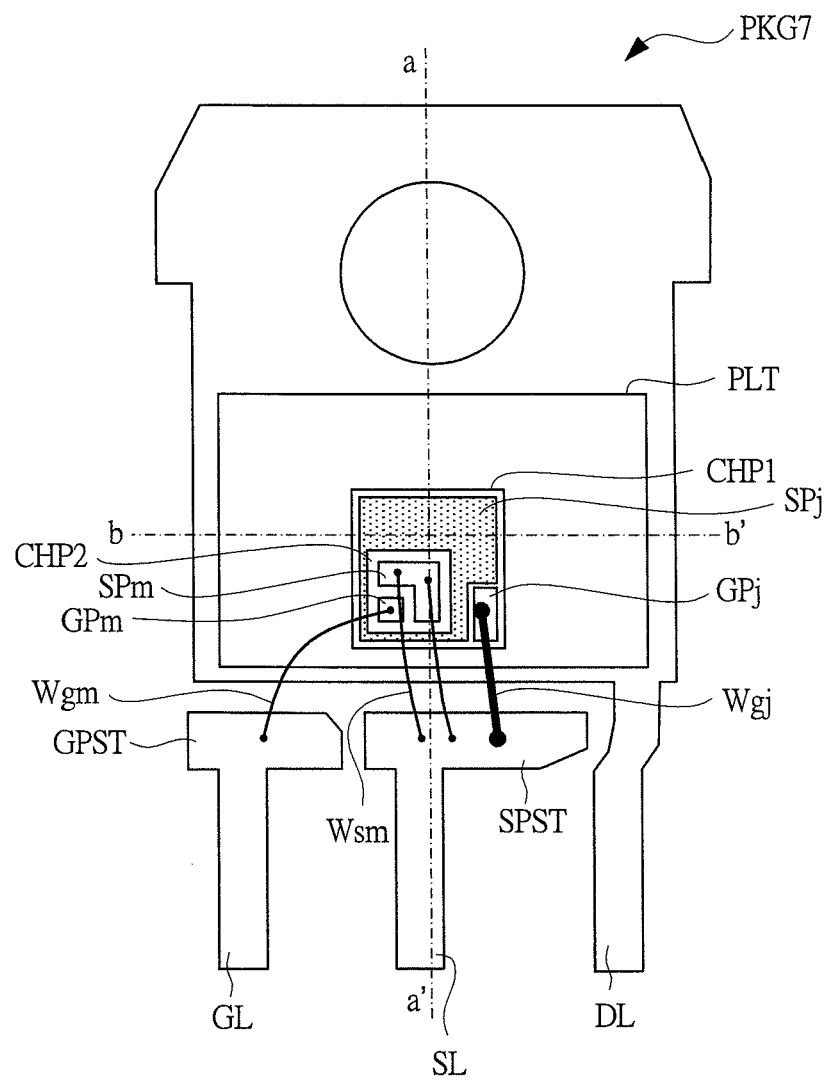
FIG. 11 is a diagram illustrating amount configuration of still another semiconductor device in the first modification example.

Next, an example of still another mount mode of the switching element in the first modification example is described. FIG. 11 is a diagram illustrating a mount configuration of a package PKG7 in the first modification example. A different point between the package PKG7 illustrated in FIG. 11 and the package PKG6 illustrated in FIG. 9 is that the arrangement position of the gate pad GPj formed on the front surface of the semiconductor chip CHP1 is different. Specifically, in the package PKG6 illustrated in FIG. 9, the gate pad GPj is disposed so as to be along the right side of the semiconductor chip CHP1 and be symmetrical to the center portion on the right side. By contrast, in the package PKG7 illustrated in FIG. 11, the gate pad GPj is disposed so as to be leaning to a side closest to the source lead SL of the semiconductor chip CHP1. In this case, the distance from the gate pad GPj to the source lead SL can be minimized. Therefore, according to the package PKG7 illustrated in FIG. 11, the length of the wire Wgj for connecting the gate pad GPj and the source lead SL together can be minimized. In this manner, the parasitic inductance that is present in the wire Wgj can be minimized. Thus, application of a voltage larger than or equal to the dielectric voltage to the MOSFET by the above-described second mechanism can be suppressed, thereby effectively suppressing avalanche breakdown of the cascode-connected MOSFET. As a result, also in the package PKG7 illustrated in FIG. 11, reliability of the semiconductor device can be improved.

Next, the parasitic inductance that is present in the switching element in the first embodiment and the parasitic inductance that is present in the switching element in the modification example are described in comparison to the parasitic inductance that is present in the switching element in a conventional technology. FIG. 12 is a diagram illustrating a circuit diagram of the cascode-connected switching element together with parasitic inductances. Specifically, FIG. 12A is a circuit diagram illustrating positions of parasitic inductances together with the switching element in the conventional technology, 12B is a circuit diagram illustrating positions of parasitic inductances together with the switching element in the first embodiment, and 12C is a circuit diagram illustrating positions of parasitic inductances together with the switching element in the first modification example.

First, as can be seen from FIG. 12A, in the cascode-connected switching element of the conventional technology, a parasitic inductance Lse is present at an intermediate node Se connecting the source of the junction FET Q1 and the drain of the MOSFET Q2 together, and a parasitic inductance Ls is present between the source of the MOSFET Q2 and the source S of the switching element. Also, a parasitic inductance Lgi is present between the gate electrode of the junction FET and the source S of the switching element, and the parasitic inductance is present at the gate electrode Gm of the MOSFET.

By contrast, as illustrated in FIG. 12B, in the cascode-connected switching element of the first embodiment, the parasitic inductance Lse, the parasitic inductance Ls, and the parasitic inductance Lgi are reduced compared with the cascode-connected switching element of the conventional technology illustrated in FIG. 12A. This is based on the fact that, for example, as illustrated in FIG. 3, the structure of shortening the wire Wgj for connecting the gate pad GPj and the source lead SL together is taken in the first embodiment by devising the arrangement position of the chip mount unit PLT1, the arrangement position of the semiconductor chip CHP1, and the arrangement position of the gate pad GPj and that the plurality of wires Wds for connecting the source pad SPj and the chip mount unit PLT2 together are provided. In this manner, according to the first embodiment, application of a voltage larger than or equal to the dielectric voltage to the MOSFET can be suppressed, thereby effectively suppressing avalanche breakdown of the cascode-connected MOSFET. As a result, according to the first embodiment, reliability of the semiconductor device can be improved.

Also, as illustrated in FIG. 12C, in the cascode-connected switching element of the first modification example, as with the first embodiment, the parasitic inductances Ls and Lgi can be reduced compared with the cascode-connected switching element of the conventional technology illustrated in FIG. 12A. Furthermore, in the first modification example, the parasitic inductance Lse that is present at the intermediate node Se connecting the source of the junction FET Q1 and the drain of the MOSFET Q2 together can be almost completely eliminated. This is because, for example, as illustrated in FIG. 5, the semiconductor chip CHP2 in which the MOSFET is formed is mounted on the semiconductor chip CHP1 in which the junction FET is formed. In this manner, the source pad SPj formed on the front surface of the semiconductor chip CHP1 and the drain electrode formed on the back surface of the semiconductor chip CHP2 can be directly connected. That is, according to the first modification example, the source of the junction FET and the drain of the MOSFET are directly connected together without using a wire. For this reason, according to the first modification example, the parasitic inductance interposed between the source of the junction FET and the drain of the MOSFET can be almost completely eliminated. In this manner, according to the first modification example, application of a voltage larger than or equal to the dielectric voltage to the MOSFET can be suppressed, thereby effectively suppressing avalanche breakdown of the cascode-connected MOSFET. As a result, according to the first modification example, reliability of the semiconductor device can be improved.

SECOND MODIFICATION EXAMPLE

Next, a mount configuration of a package PKG8 in a second modification example is described. FIG. 13 is a diagram of a mount configuration of the package PKG8 in the second modification example. The structure of the package PKG8 illustrated in FIG. 13 is substantially the same with the structure of the package PKG1 illustrated in FIG. 3. What is different is the outer shape of the package. As just described, the technical idea of the present invention can be applied not only to the package PKG1 illustrated in FIG. 3 but also to the package PKG8 as illustrated in FIG. 13. That is, there are various types of general-purpose packages for mounting and structuring a switching element, and the technical idea of the present invention can be achieved by improving various general-purpose packages typified by, for example, the package PKG1 illustrated in FIG. 3 and the package PKG8 illustrated in FIG. 13. Specifically, also in the package PKG8 illustrated in FIG. 13, for example, the distance between the gate pad GPj and the source lead SL can be shortened, and therefore the length of the wire Wgj for connecting the gate pad GPj and the source lead SL together can be shortened. Thus, also in the package PKG8 illustrated in FIG. 13, the parasitic inductance that is present in the wire Wgj can be sufficiently reduced. From this, application of a voltage larger than or equal to the dielectric voltage to the MOSFET can be suppressed, thereby effectively suppressing avalanche breakdown of the cascode-connected MOSFET. As a result, also in the package PKG8 illustrated in FIG. 13, reliability of the semiconductor device can be improved.

Note that FIG. 14 is a diagram illustrating one section of the package PKG8 in the second modification example. As illustrated in FIG. 14, the semiconductor chip CHP2 is mounted on the chip mount unit PLT2 via the conductive adhesive material PST. And, for example, the semiconductor chip CHP2 (gate pad) and the gate lead GL (GPST) are electrically connected together via the wire Wgm. Note that a broken line part represents a portion to be covered with a sealing body.

Next, an example of another mount mode of the switching element in the second modification example is described. FIG. 15 is a diagram illustrating a mount configuration of a package PKG9 in the second modification example. The structure of the package PKG9 illustrated in FIG. 15 is substantially the same with the structure of the package PKG3 illustrated in FIG. 5. What is different is the outer shape of the package. As just described, the technical idea of the present invention can be applied not only to the package PKG3 illustrated in FIG. 5 but also to the package PKG9 as illustrated in FIG. 15. That is, there are various types of general-purpose packages for mounting and structuring a switching element, and the technical idea of the present invention can be applied to various general-purpose packages typified by, for example, the package PKG3 illustrated in FIG. 5 and the package PKG9 illustrated in FIG. 15. Specifically, also in the package PKG9 illustrated in FIG. 15, since the semiconductor chip CHP2 in which the MOSFET is formed is mounted on the semiconductor chip CHP1 in which the junction FET is formed, the source pad SPj and the drain electrode formed on the back surface of the semiconductor chip CHP2 can be directly connected together. From this, also in the package PKG9 illustrated in FIG. 15, the source of the junction FET and the drain of the MOSFET can be directly connected together without using a wire, and therefore the parasitic inductance (Lse1 and of FIGS. 2A to 2C) between the drain of the MOSFET and the source of the junction FET can be almost completely eliminated. Therefore, also in the package PKG9 illustrated in FIG. 15, application of a voltage larger than or equal to the dielectric voltage to the MOSFET can be suppressed, thereby effectively suppressing avalanche breakdown of the cascode-connected MOSFET. As a result, according to the second modification example, reliability of the semiconductor device can be improved.

Note that FIG. 16 illustrates a diagram illustrating one section of the package PKG9 in the second modification example. As illustrated in FIG. 16, the semiconductor chip CHP1 is mounted on the chip mount unit PLT via the conductive adhesive material PST, and the semiconductor chip CHP2 is mounted on this semiconductor chip CHP1 via a conductive adhesive material (not illustrated in the drawing). And, for example, the semiconductor chip CHP2 (gate pad) and the gate lead GL (GPST) are electrically connected together via the wire Wgm. Note that a broken line part represents a portion to be covered with a sealing body.

THIRD MODIFICATION EXAMPLE

Next, a mount configuration of a package PKG10 in a third modification example is described. FIG. 17 is a diagram of a mount configuration of the package PKG10 in the third modification example. The structure of the package PKG10 illustrated in FIG. 17 is substantially the same with the structure of the package PKG1 illustrated in FIG. 3. What is different is the outer shape of the package. As just described, the technical idea of the present invention can be applied not only to the package PKG1 illustrated in FIG. 3 but also to the package PKG10 as illustrated in FIG. 17. That is, there are various types of general-purpose packages for mounting and structuring a switching element, and the technical idea of the present invention can be achieved by improving various general-purpose packages typified by, for example, the package PKG1 illustrated in FIG. 3 and the package PKG10 illustrated in FIG. 17. Specifically, also in the package PKG10 illustrated in FIG. 17, for example, the distance between the gate pad GPj and the source lead SL can be shortened, and therefore the length of the wire Wgj for connecting the gate pad GPj and the source lead SL together can be shortened. Thus, also in the package PKG10 illustrated in FIG. 17, the parasitic inductance that is present in the wire Wgj can be sufficiently reduced. From this, application of a voltage larger than or equal to the dielectric voltage to the MOSFET can be suppressed, thereby effectively suppressing avalanche breakdown of the cascode-connected MOSFET. As a result, also in the package PKG10 illustrated in FIG. 17, reliability of the semiconductor device can be improved.

Note that FIG. 18 is a diagram illustrating one section of the package PKG10 in the third modification example. As illustrated in FIG. 18, the semiconductor chip CHP1 is mounted on the chip mount unit PLT1 via the conductive adhesive material PST. And, for example, the semiconductor chip CHP1 (the gate pad GPj) and the source lead SL (the source lead post potion SPST) are electrically connected together via the wire Wgj. Note that a broken line part represents a portion to be covered with a sealing body.

Next, an example of another mount mode of the switching element in the third modification example is described. FIG. 19 is a diagram illustrating a mount configuration of a package PKG11 in the third modification example. The structure of the package PKG11 illustrated in FIG. 19 is substantially the same with the structure of the package PKG3 illustrated in FIG. 5. What is different is the outer shape of the package. As just described, the technical idea of the present invention can be applied not only to the package PKG3 illustrated in FIG. 5 but also to the package PKG11 as illustrated in FIG. 19. That is, there are various types of general-purpose packages for mounting and structuring a switching element, and the technical idea of the present invention can be applied to various general-purpose packages typified by, for example, the package PKG3 illustrated in FIG. 5 and the package PKG11 illustrated in FIG. 19. Specifically, also in the package PKG11 illustrated in FIG. 19, since the semiconductor chip CHP2 in which the MOSFET is formed is mounted on the semiconductor chip CHP1 in which the junction FET is formed, the source pad SPj and the drain electrode formed on the back surface of the semiconductor chip CHP2 can be directly connected together. From this, also in the package PKG11 illustrated in FIG. 19, the source of the junction FET and the drain of the MOSFET can be directly connected together without using a wire, and therefore the parasitic inductance (Lse1 and Lse2 of FIGS. 2A to 2C) between the drain of the MOSFET and the source of the junction FET can be almost completely eliminated. Therefore, also in the package PKG11 illustrated in FIG. 19, application of a voltage larger than or equal to the dielectric voltage to the MOSFET can be suppressed, thereby effectively suppressing avalanche breakdown of the cascode-connected MOSFET. As a result, according to the third modification example, reliability of the semiconductor device can be improved.

Note that FIG. 20 illustrates a diagram illustrating one section of the package PKG11 in the third modification example. As illustrated in FIG. 20, the semiconductor chip CHP1 is mounted on the chip mount unit PLT via the conductive adhesive material PST, and the semiconductor chip CHP2 is mounted on this semiconductor chip CHP1 via a conductive adhesive material (not illustrated in the drawing). And, for example, the semiconductor chip CHP2 (gate pad) and the gate lead GL (gate lead post portion GPST) are electrically connected together via the wire Wsm. Note that a broken line part represents a portion to be covered with a sealing body.

FOURTH MODIFICATION EXAMPLE

Next, a mount configuration of a package PKG12 in a fourth modification example is described. FIG. 21 is a diagram of a mount configuration of the package PKG12 in the fourth modification example. The structure of the package PKG12 illustrated in FIG. 21 is substantially the same with the structure of the package PKG1 illustrated in FIG. 3. What is different is the outer shape of the package. Specifically, the package form of the package PKG12 in the fourth modification example is an SOP (Small Outline Package). As just described, the technical idea of the present invention can be applied not only to the package PKG1 illustrated in FIG. 3 but also to the package PKG12 as illustrated in FIG. 21. That is, there are various types of general-purpose packages for mounting and structuring a switching element, and the technical idea of the present invention can be achieved by improving various general-purpose packages typified by, for example, the package PKG1 illustrated in FIG. 3 and the package PKG12 illustrated in FIG. 21. Specifically, also in the package PKG12 illustrated in FIG. 21, for example, the distance between the gate pad GPj and the source lead SL can be shortened, and therefore the length of the wire Wgj for connecting the gate pad GPj and the source lead SL together can be shortened. Thus, also in the package PKG12 illustrated in FIG. 21, the parasitic inductance that is present in the wire Wgj can be sufficiently reduced. From this, application of a voltage larger than or equal to the dielectric voltage to the MOSFET can be suppressed, thereby effectively suppressing avalanche breakdown of the cascode-connected MOSFET. As a result, also in the package PKG12 illustrated in FIG. 21, reliability of the semiconductor device can be improved.

Note that FIG. 22 is a diagram illustrating one section of the package PKG12 in the fourth modification example. As illustrated in FIG. 22, the semiconductor chip CHP1 is mounted on the chip mount unit PLT1 via a conductive adhesive material (not illustrated in the drawing). And, for example, the semiconductor chip CHP1 (gate pad GPj) and the source lead SL (source lead post portion SPST) are electrically connected together via the wire Wgj. Note in the fourth modification example that, for example, as illustrated in FIG. 22, the chip mount unit PLT1, the semiconductor chip CHP1, the wire Wgj, part of the lead, and others are sealed with the sealant MR made of resin. Here, on the analogy of FIG. 21 and FIG. 22, in the package PKG12 (SOP package), the sealant MR has an approximately rectangular parallelepiped shape, and has a first side surface and a second side surface facing the first side surface. And, the gate lead GL and the source lead SL are configured to protrude from the first side surface of MR, and the drain lead DL is configured to protrude from the second side surface.

Next, an example of another mount mode of the switching element in the fourth modification example is described. FIG. 23 is a diagram illustrating a mount configuration of a package PKG13 in the fourth modification example. The structure of the package PKG13 illustrated in FIG. 23 is substantially the same with the structure of the package PKG3 illustrated in FIG. 5. What is different is the outer shape of the package. Specifically, the package form of the package PKG13 in the fourth modification example is an SOP (Small Outline Package). As just described, the technical idea of the present invention can be applied not only to the package PKG3 illustrated in FIG. 5 but also to the package PKG13 as illustrated in FIG. 23. That is, there are various types of general-purpose packages for mounting and structuring a switching element, and the technical idea of the present invention can be applied to various general-purpose packages typified by, for example, the package PKG3 illustrated in FIG. 5 and the package PKG13 illustrated in FIG. 23. Specifically, also in the package PKG13 illustrated in FIG. 23, since the semiconductor chip CHP2 in which the MOSFET is formed is mounted on the semiconductor chip CHP1 in which the junction FET is formed, the source pad SPj and the drain electrode formed on the back surface of the semiconductor chip CHP2 can be directly connected together. From this, also in the package PKG13 illustrated in FIG. 23, the source of the junction FET and the drain of the MOSFET can be directly connected together without using a wire, and therefore the parasitic inductance (Lse1 and Lse2 of FIGS. 2A to 2C) between the drain of the MOSFET and the source of the junction FET can be almost completely eliminated. Therefore, also in the package PKG13 illustrated in FIG. 23, application of a voltage larger than or equal to the dielectric voltage to the MOSFET can be suppressed, thereby effectively suppressing avalanche breakdown of the cascode-connected MOSFET. As a result, according to the fourth modification example, reliability of the semiconductor device can be improved.

Note that FIG. 24 is a diagram illustrating one section of the package PKG13 in the fourth modification example. As illustrated in FIG. 24, the semiconductor chip CHP1 is mounted on the chip mount unit PLT1 via a conductive adhesive material (not illustrated in the drawing), and the semiconductor chip CHP2 is mounted on this semiconductor chip CHP1 via a conductive adhesive material (not illustrated in the drawing). And, for example, the semiconductor chip CHP1 (the gate pad GPj) and the source lead SL (the source lead post portion SPST) are electrically connected together via the wire Wgj. Note in the fourth modification example that, for example, as illustrated in FIG. 24, the chip mount unit PLT1, the semiconductor chip CHP1, the semiconductor chip CHP2, the wire Wgj, part of the lead, and others are sealed with a sealant MR made of resin. Here, part of the lead protrudes from both side surfaces of the sealant MR.

(Second Embodiment)

In the first embodiment, contrivance regarding the package structure has been described. In the second embodiment, contrivance regarding the device structure will be described.

<Layout Structure of Stacked Semiconductor Chip>

FIG. 25 is a diagram illustrating a layout structure of semiconductor chips in the second embodiment. The layout structure of the semiconductor chips described below illustrates an example in which the semiconductor chip CHP2 made of silicon (Si) in which the MOSFET is formed is multilayered and mounted on the semiconductor chip CHP1 made of a substance typified by, for example, silicon carbide (Si), with a band gap larger than that of silicon (Si). In FIG. 25, the semiconductor chip CHP1 has a rectangular shape, and a termination region TMj is formed in an outer circumferential region of this rectangular-shaped semiconductor chip CHP1. This termination region TMj is a region provided to ensure a withstand voltage. And, an inner region of the termination region TMj is an active region ACTj. In this active region ACTj, a plurality of junction FETs are formed.

The termination region TMj is formed on an outer circumferential region of the semiconductor chip CHP1, and part of the termination region TMj enters the inside, so that the gate pad GPj is formed in this region. This gate pad GPj is connected to the gate electrode of each of the plurality of junction FETs formed in the active region ACTj via a gate wiring. Here, in FIG. 25, the gate pad GPj is disposed on a center portion of the right side of the semiconductor chip CHP1. In other words, the gate pad GPj is disposed so as to be leaning to the right side and be symmetrical with respect to a center line extending laterally. In this manner, variations in distance of gate wirings for connecting the respective gate electrodes of the plurality of junction FETs and the gate pad GPj can be suppressed. For this reason, according to the layout structure illustrated in FIG. 25, the characteristics of the plurality of junction FETs formed in the semiconductor chip CHP1 can be advantageously made uniform for use.

The source pad SPj is formed on the active region ACTj of the semiconductor chip CHP1. This source pad SPj is electrically connected to the source region of the junction FET formed in the active region ACTj. And, the rectangular-shaped semiconductor chip CHP2 is mounted on the source pad SPj. In this semiconductor chip CHP2, a plurality of MOSFETs are formed, and the source pad SPm and the gate pad GPm are formed on the main surface of the semiconductor chip CHP2. The source pad SPm is electrically connected to the source region of each MOSFET, and the gate pad GPj is electrically connected to the gate electrode of each MOSFET.

FIG. 26 is a diagram illustrating another layout structure of the stacked semiconductor chip in the second embodiment. The layout structure illustrated in FIG. 26 is substantially the same with the layout structure illustrated in FIG. 25. A difference between FIG. 26 and FIG. 25 is that, while the gate pad GPj is disposed on the center portion of the right side in the layout structure illustrated in FIG. 25, the gate pad GPj is disposed so as to be leaning to the lower-right corner of the semiconductor chip CHP1 in the layout structure illustrated in FIG. 26. As just described, in FIG. 26, with the gate pad GPj being disposed at the lower-right corner of the semiconductor chip CHP1, for example, as illustrated in FIG. 6, the distance from the gate pad GPj to the source lead SL can be minimized. That is, by adopting the layout structure illustrated in FIG. 26, the length of the wire Wgj for connecting the gate pad GPj and the source lead SL together can be minimized. In this manner, the parasitic inductance that is present in the wire Wgj can be minimized.

Next, FIG. 27 is a cross-sectional view of the structure cut along the line A-A in FIG. 25 and FIG. 26. As illustrated in FIG. 27, a drain electrode DEj is formed on a back surface of a semiconductor substrate SUBj, and a drift layer DFTj is formed on a main surface (front surface) of the semiconductor substrate SUBj. And, the active region ACTj is formed on the drift layer DFTj, and the gate electrode and the source region of the junction FET are formed in this active region ACTj. The termination region TMj for ensuring a withstand voltage is formed at an end of this active region ACTj, and the source pad SPj is formed on the active region ACTj. An insulator IL1 formed of, for example, a silicon oxide film, is formed so as to cover an end of the source pad SPj. The structure described so far is the structure of the semiconductor chip CHP1 in which the junction FET is formed. On this semiconductor chip CHP1 in which the junction FET is formed, the semiconductor chip CHP2 in which the MOSFET is formed is mounted.

Specifically, on the exposed source pad SPj, a drain electrode DEm is in a contact via, for example, a conductive adhesive material (not illustrated in the drawing). This drain electrode DEm is formed on a back surface of a semiconductor substrate SUBm, and a drift layer DFTm is formed on a main surface (front surface) opposite to the back surface of the semiconductor substrate SUBm. And, an active region ACTm is formed on the drift layer DFTm, and a termination region TMm for ensuring a withstand voltage are formed at both ends of the active region ACTm. In this active region ACTm, the gate electrode and the source region of the MOSFET are formed. A source pad SPm is formed so as to be across the active region ACTm and the termination region TMm. An insulator IL2 is formed so as to cover an end of this source pad SPm. However, most of the surface region of the source pad SPm is exposed from IL2. As just described, the semiconductor chip CHP2 in which the MOSFET is formed is mounted on the semiconductor chip CHP1 in which the junction FET is formed.

As illustrated in FIG. 27, the semiconductor chip CHP2 is mounted on the semiconductor chip CHP1 so as to be embedded in the source pad SPj. Therefore, the drain electrode DEm formed on the back surface of the semiconductor chip CHP2 is in a direct contact with the source pad SPj formed on the front surface of the semiconductor chip CHP1 not via a wire but via a conductive adhesive material (not illustrated in the drawing). This means that the parasitic inductance that intervenes between the source of the junction FET and the drain of the MOSFET can be almost completely eliminated. That is, as illustrated in FIG. 27, according to the structure in which the semiconductor chip CHP2 is mounted directly on the semiconductor chip CHP1, no wire is required to connect the source of the junction FET and the drain of the MOSFET together. When a wire is used, the parasitic inductance that is present in the wire poses a problem. According to the layout structure in the second embodiment, since the source of the junction FET and the drain of the MOSFET can be directly connected together without using a wire, the parasitic inductance (Lse1 and Lse2 of FIGS. 2A to 2C) between the drain of the MOSFET and the source of the junction FET can be almost completely eliminated. From the foregoing, according to the second embodiment, application of a voltage larger than or equal to the dielectric voltage to the MOSFET can be suppressed. In this manner, avalanche breakdown of the cascode-connected MOSFET can be effectively suppressed. As a result, according to the second embodiment, reliability of the semiconductor device can be improved.

Also as illustrated in FIG. 27, according to the layout structure in the second embodiment, since the source pad SPj is disposed on the active region ACTj, the current flowing through the junction FET can be increased. And, in this case, since the area of the source pad the source pad SPj can be increased, the area of the semiconductor chip CHP2 mounted on the source pad SPj can also be increased. That is, the area of the semiconductor chip CHP2 can be increased, and that means that the number of MOSFETs to be formed in the semiconductor chip CHP2 can be increased. As a result, the current flowing through the whole plurality of MOSFETs can be increased. As just described, according to the layout structure in the second embodiment, the current flowing through the whole plurality of junction FETs and the current flowing through the whole plurality of MOSFETs can be increased, and a large current of the switching element in which the junction FETs and the MOSFETs are cascode-connected can be easily achieved. Furthermore, according to the second embodiment, since junction FETs using silicon carbide, which can theoretically achieve a high withstand voltage and a low on-resistance compared with silicon, is used, a switching element capable of achieving both a large current and a high withstand voltage, and an on-resistance can be provided.

<Modification Example of Layout Structure>

Next, another layout structure of the stacked semiconductor chip in the second embodiment is described. FIG. 28 is a layout structure of the stacked semiconductor chip in a modification example. As illustrated in FIG. 28, the semiconductor chip CHP1 has a rectangular shape, and the termination region TMj is formed in an outer circumferential region of this rectangular-shaped semiconductor chip CHP1. And, the active region ACTj, the gate pad GPj, and the source pad SPj are formed in an inner region of the termination region TMj. Here, a feature of the modification example is that the active region ACTj, gate pad GPj, and the source pad SPj are disposed so as not to be superposed each other in a plane. That is, as illustrated in FIG. 28, the active region ACTj in which the junction FET is formed is disposed so as to avoid the gate pad GPj and the source pad SPj. And, the semiconductor chip CHP2 is mounted on the source pad SPj.

Also, FIG. 29 is a diagram illustrating another layout structure of the stacked semiconductor chip in the modification example. The layout structure illustrated in FIG. 29 is substantially the same with the layout structure illustrated in FIG. 28. A difference between FIG. 29 and FIG. 28 is that, while the gate pad GPj is disposed on the center portion of the right side in the layout structure illustrated in FIG. 28, the gate pad GPj is disposed so as to be leaning to the lower-right corner of the semiconductor chip CHP1 in the layout structure illustrated in FIG. 29.

Next, FIG. 30 is a cross-sectional view of the structure cut along a line A-A in FIG. 28 and FIG. 29. As illustrated in FIG. 30, the drain electrode DEj is formed on the back surface of the semiconductor substrate SUBj, and the drift layer DFTj is formed on the main surface (front surface) of the semiconductor substrate SUBj. In this drift layer DFTj, the active region ACTj is formed. The termination region TMj is formed in an outer region of the active region ACTj. In the active region ACTj, a gate electrode GE and a source region SR of the junction FET are formed. And, the insulator IL1 is formed on the active region ACTj and the termination region TMj, and the source pad SPj is formed on the insulator IL1. Here, in the modification example, an important point is that the source pad SPj is formed not in the active region ACTj but in the termination region TMj. That is, in the modification example, the active region ACTj and the source pad SPj are disposed so as not to be superposed each other in a plan view, and the source pad SPj is disposed on TMj. Note in FIG. 30 that the semiconductor chip CHP2 disposed on the source pad SPj is omitted in the drawing. That is, also in FIG. 30, as with FIG. 27, the semiconductor chip CHP2 is mounted on the source pad SPj, but the structure is similar, and therefore the semiconductor chip CHP2 disposed on the source pad SPj is omitted in FIG. 30.

According to the modification example structured as described above, an effect as described below can be obtained. That is, the semiconductor chip CHP2 is mounted on the source pad SPj. In this case, stress is exerted onto the source pad SPj. However, in the modification example, since the active region ACTj in which the junction FET is formed is not formed in a region immediately below this source pad SPj, stress can be prevented from being applied to the active region ACTj. That is, according to the modification example, unnecessary stress can be prevented from being applied to the active region ACTj, and therefore mechanical breakage of the junction FET formed in the active region ACTj can be prevented.

Also, the gate pad GPm and the source pad SPm are formed on the front surface of the semiconductor chip CHP2 mounted on the source pad SPj. To these pads, wires are connected by wire bonding. Stress occurs even in this wire bonding process. In the modification example, since the semiconductor chip CHP2 and the active region ACTj are disposed so as not to be superposed each other in a plane, the stress occurring in the wire bonding process can be prevented from being transmitted directly to the active region ACTj. As a result, according to the layout structure of the stacked semiconductor chip in the modification example, the stress occurring at the time of mounting the semiconductor chip CHP2 and at the time of wire bonding influencing the characteristics of the junction FET formed in the active region ACTj of the semiconductor chip CHP1 can be suppressed. That is, according to the modification example, a semiconductor device with high assembly yields and high reliability can be provided.

<Device Structure of MOSFET>

Next, an example of a device structure of the MOSFET formed in the semiconductor chip CHP2 is described. FIG. 31 is a cross-sectional view illustrating an example of a device structure of the MOSFET in the second embodiment. As illustrated in FIG. 31, for example, on the back surface of the semiconductor substrate SUBm made of silicon in which n-type impurities are introduced, for example, the drain electrode DEm of a gold film is formed. On the other hand, on a main surface side of the semiconductor substrate SUBm, the drift layer DFTm of an n-type semiconductor region is formed. In the drift layer DFTm, a body region PR of a p-type semiconductor region is formed. A source region SR of an n-type semiconductor region is formed so as to be contained in this body region PR. A front surface region of the body region PR interposed between this source region SR and the drift layer DFTm functions as a channel formation region. And, a source electrode SE is formed so as to be electrically connected to both the source region SR and the body region PR. Furthermore, on the front surface of the drift layer DFTm including the surface of the channel formation region, a gate insulator GOX of a silicon oxide film is formed, and a gate electrode G is formed on this gate insulator GOX.

The above-structured MOSFET is configured so that, for example, electrons flow from the source region SR through the channel formation region formed on the front surface of the body region PR and then from the drift layer DFTm to the drain electrode DEm formed on the back surface of the semiconductor substrate SUBm, and this structure is a so-called vertical MOSFET. Since the semiconductor chip CHP2 can be formed with a high density, this vertical MOSFET advantageously becomes a MOSFET with a large current density. Therefore, by using the vertical MOSFET for the switching element of the present invention, a switching element with a large current density can be achieved.

For example, in the case of the layout structures illustrated in FIG. 28 and FIG. 29, deterioration in characteristics based on the stress to the junction FET formed in the active region ACTj can be effectively prevented. On the other hand, the area of the source pad SPj is relatively small. In this case, the area of the semiconductor chip CHP2 in which the MOSFET disposed on the source pad SPj is formed is also relatively small. However, if the vertical MOSFET illustrated in FIG. 31 is used as a MOSFET to be formed on the semiconductor chip CHP2, a MOSFET with a relatively large current density can be achieved even with a small chip area. As a result, the current density of the entire cascode-connected switching element can be increased. That is, in particular, by taking the layout structure illustrated in FIG. 28 or FIG. 29 and using the vertical MOSFET illustrated in FIG. 31 even if the area of the semiconductor chip CHP2 in which the MOSFET is formed is small, a high-performance switching element capable of ensuring a large current can be provided, while deterioration in characteristics based on the stress to the junction FET formed in the active region ACTj is effectively prevented.

<Problem Found Out by Inventors>

Next, a new problem found by the inventors is described. FIGS. 32A and 32B are diagrams illustrating a current path in a cascode-connected switching element. FIG. 32A is a diagram illustrating a current path of a leakage current flowing at the time of ON, and FIG. 32B is a diagram illustrating a current path of a leakage current flowing at the time of OFF. As illustrated in FIG. 32A, the rated current Id flows from the drain of the junction FET Q1 to the source of the MOSFET Q2 at the time of ON. That is, the rated current Id flows from the drain D to the source S of the cascode-connected switching element. Here, a drain voltage (voltage at Se) of the MOSFET Q2 before the MOSFET Q2 is cut off can be found from the product of the on-resistance of the MOSFET Q2 and the rated current Id. For example, when the on-resistance is 10 mil and the rated current Id is 40 A, the voltage at the intermediate node Se is 0.4 V. The voltage at the intermediate node Se is the drain voltage of the MOSFET Q2 and also the source voltage of the junction FET Q1, and therefore a voltage Vgs representing the gate voltage of the junction FET Q1 with the source voltage of the junction FET Q1 taken as a reference is −0.4 V.

When a transition of the cascode-connected switching element is made from an ON state to an OFF state, from the state in which 15 V is applied to the gate electrode Gm of the MOSFET Q2 as illustrated in FIG. 32A, 0 V is applied to the gate electrode Gm of the MOSFET Q2 as illustrated in FIG. 32B. Since the MOSFET Q2 is a normally-off-type MOSFET, when 0 V is applied to the gate electrode Gm, the MOSFET Q2 is cut off.

In the course of cutting off the MOSFET Q2, a channel is gradually lost at an initial stage, and therefore the on-resistance between the drain and the source of the MOSFET Q2 gradually increases. The junction FET Q1 used as the cascode-connected switching element is of a normally-on type and the voltage Vgs of the junction FET Q1 is −0.4 V at the initial stage in which the MOSFET Q2 is cut off. Therefore, the junction FET Q1 is maintained in the ON state. Thus, a current flows from the drain (for example, in an application of a power supply voltage of 300 V, the drain voltage is on the order of 300 V) of the junction FET Q1 toward the source of the junction FET Q1. Therefore, since the drain voltage (the voltage at the intermediate node Se) of the MOSFET Q2 is the product of the on-resistance increasing with the loss of the channel and the drain current flowing from the drain of the junction FET Q1, the drain voltage (voltage at the intermediate node Se) of the MOSFET Q2 gradually increases from 0.4 V.

Then, the channel of the MOSFET Q2 is completely lost and the MOSFET Q2 is completely cut off, electric charges are accumulated at the intermediate node Se by the current flowing from the junction FET Q1. Therefore, the drain voltage (voltage at the intermediate node Se) of the MOSFET Q2 further increases to a cutoff voltage (for example, on the order of 5 V to 15 V) of the junction FET Q1. In this state, the junction FET Q1 is turned OFF, and the drain current of the junction FET Q1 does not flow. That is, the increase of the drain voltage (voltage at the intermediate node Se) of the MOSFET Q2 stops, and this state is maintained.

However, the inventors have found out that the leakage current Id1 may flow between the drain and the source of the junction FET Q1 even if the voltage Vgs of the junction FET Q1 becomes −5 V to −15 V in the cascode-connected switching element. When this leakage current Id1 flows, electric charges are accumulated at Se, resulting in an increase in the drain voltage (voltage at the intermediate node Se) of the MOSFET Q2. Thus, if the above-described the leakage current Id1 increases, the drain voltage (voltage at the intermediate node Se) of the MOSFET Q2 may possibly become a voltage larger than or equal to the withstand voltage (for example, larger than or equal to 30 V) of the MOSFET Q2. As a result, the MOSFET Q2 performs avalanche operation, and the MOSFET Q2 may be eventually broken. To address this, if a high-withstand-voltage MOSFET with a high withstand voltage is used, the possibility of preventability of the above-described MOSFET avalanche breakdown is increased. However, when the high-withstand-voltage MOSFET is used, it is required to design a thick drift layer in order to ensure a withstand voltage. As just described, if the thickness of the low-concentration drift layer is thickened, the on-resistance of the MOSFET is increased, posing a problem of increasing conduction loss at the time of ON of the cascode-connected switching element. That is, to prevent avalanche breakdown of the MOSFET while ensuring high performance of the cascode-connected switching element, it is required to provide contrivance other than the structure of a thick low-concentration drift layer. Thus, in the second embodiment, to prevent avalanche breakdown of the MOSFET while ensuring high performance of the cascode-connected switching element, contrivance is provided to the device structure of the junction FET. In the following, the device structure of the junction FET provided with this contrivance in the second embodiment will be described.

<Device Structure of Junction FET>

FIG. 33 is a cross-sectional view illustrating a device structure of the junction FET in the second embodiment. As illustrated in FIG. 33, the junction FET in the second embodiment has the semiconductor substrate SUBj, and the drain electrode DEj is formed on the back surface of this semiconductor substrate SUBj. On the other hand, the drift layer DFTj is formed on the main surface opposite to the back surface of the semiconductor substrate SUBj, and a plurality of the trench TR are formed on this drift layer DFTj. And, a gate electrode GE (also referred to as a gate region) is formed on each side surface and bottom surface of the plurality of trenches TR, a channel formation region is formed so as to be interposed between gate electrode GE formed on the side surface and bottom surface of adjacent the trench TR. The source region SR is formed on an upper portion of this channel formation region. In the above-structured junction FET, by controlling the voltage to be applied to the gate electrode GE, extension of the depletion layer from the gate electrode GE is controlled. In this manner, when the depletion layer extending from the adjacent gate electrode GE is connected, the channel formation region disappears, and an OFF state is achieved. On the other hand, when the depletion layer extending from adjacent gate electrode GE is not connected, a channel formation region is formed, and an ON state is achieved.

Here, a feature point of the junction FET in the second embodiment is that the channel length CL of the channel formation region is longer than or equal to 1 μm. In other words, the feature point in the second embodiment is that the distance between the bottom of the source region SR and the bottom of gate electrode GE is longer than or equal to 1 μm. In this manner, the channel length of the channel formation region can be increased, and therefore the electrostatic potential in the channel formation region at the time of OFF of the junction FET can be increased. Thus, according to the second embodiment, it is possible to suppress the leakage current flowing between the drain and the source of the junction FET more than the case in which the device structure with a channel length on the order of 0.5 μm is used. As just described, an advantage of the channel length CL longer than or equal to 1 μm is that the electrostatic potential in the channel formation region at the time of OFF can be increased to reduce the leakage current. Furthermore, the long channel length CL itself is considered to contribute to a reduction in leakage current.

Furthermore, in the case of the device structure of the junction FET illustrated in FIG. 33, the distance between the semiconductor substrate SUBj and gate electrode GE is shorter than the distance between the semiconductor substrate SUBj as a drain and the source SR. And, with the junction FET being OFF, a reverse current (a reverse bias) is applied between gate electrode GE and the drift layer DFTj. As a result, the leakage current flowing through the junction FET at the time of OFF is considered to flow mainly as a reverse current (a leakage current) between the semiconductor substrate SUBj and gate electrode GE having a short distance therebetween rather than between the semiconductor substrate SUBj and the source region SR having a long distance therebetween. Therefore, according to the second embodiment, when the junction FET is cut off, the leakage current flowing between the drain and the source of the junction FET can be significantly reduced. Thus, according to the second embodiment, the drain voltage of the MOSFET can be restrained from increasing to a voltage larger than or equal to the withstand voltage due to the leakage current flowing between the drain and source of the junction FET at the time of OFF. In this manner, it is possible to effectively prevent the MOSFET from performing avalanche operation and eventually being broken. Note that, according to the junction FET having a trench structure illustrated in FIG. 33, the junction FET can be formed with high density, and it is needless to say that a switching element with a large current density can be achieved.

Next, FIG. 34 is a cross-sectional view illustrating another device structure of the junction FET in the second embodiment. As illustrated in FIG. 34, another junction FET in the second embodiment has the semiconductor substrate SUBj, and the drain electrode DEj is formed on the back surface of this semiconductor substrate SUBj. On the other hand, the drift layer DFTj is formed on the main surface side opposite to the back surface of the semiconductor substrate SUBj. In this drift layer DFTj, a plurality of gate electrodes GE are formed so as to be buried with spaces. And, the source region SR is formed on the front surface of the drift layer DFTj between adjacent gate electrodes GE. The above-structured junction FET illustrated in FIG. 34 is a so-called vertical junction FET without a trench structure.

Also in the junction FET structured as described above, a feature point is that the channel length CL of the channel formation region is longer than or equal to 1 μm. In other words, the feature point is that the distance (channel length CL) between the bottom of the source region SR and the bottom of gate electrode GE is longer than or equal to 1 μm. In this manner, the channel length of the channel formation region can be increased, and therefore the electrostatic potential in the channel formation region at the time of OFF can be increased also in the junction FET illustrated in FIG. 34. Thus, also in the junction FET illustrated in FIG. 34, it is possible to suppress the leakage current flowing between the drain and the source of the junction FET more than the case in which the device structure with a channel length on the order of 0.5 μm is used. As just described, an advantage of the channel length CL longer than or equal to 1 μm is that the electrostatic potential in the channel formation region at the time of OFF can be increased to reduce the leakage current. Furthermore, the long channel length CL itself is considered to contribute to reduction in leakage current.

An advantage of the junction FET illustrated in FIG. 34 is that the device structure is simple and a manufacturing cost is low. Furthermore, in the junction FET illustrated in FIG. 33, it is required to form conduction-type impurities (p-type impurities) on the side surfaces of the trench TR by sophisticated oblique ion implantation technology or the like. By contrast, in the junction FET illustrated in FIG. 34, it is not required to use sophisticated oblique ion implantation technology to form the gate electrode GE, and the accuracy of the impurity profile to be introduced to the gate electrode GE is high. That is, according to the junction FET illustrated in FIG. 34, an advantage that a junction FET with uniform characteristics can be easily formed can be obtained.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, while the gate electrode of the MOSFET is driven by the gate driver circuit (gate driver) in the above-described embodiments, the gate electrode of the junction FET may be configured to be driven by the gate driver circuit.

In this case, by controlling the gate electrode of the junction FET by the gate driver circuit, the source voltage of the junction FET can be controlled at a desired level, and an effect of being capable of suppressing a surge voltage at the intermediate node can be obtained. Although the number of terminals is increased in this structure, a switching element with lower loss can be advantageously provided.

Also, regarding the package forms described in the first embodiment, the lead arrangement is not restricted thereto. That is, the arrangement positions of the gate lead, the drain lead, and the source lead can be variously changed. For example, when a package is mounted on a mounting board, the lead arrangement of the package can be determined so that the existing lead arrangement can also be used. In this case, it is not required to change the mounting board, and an increase in cost with design change can be suppressed.

Furthermore, the layout structure of the stacked semiconductor chip is not particularly restricted to the layout structures described in the specification, and the shape of each semiconductor chip, the shape of the pad, the shape of the termination region, and others are not particularly restrictive. Also, the structures of the junction FET and the MOSFET are not restrictive, and various existing structures can be applied. Furthermore, the impurity profile of the device can be freely changed. For example, in the MOSFET, impurities may be implanted so that the impurity concentration on the front surface is lowered so as to prevent punch-through and the impurity concentration is gradually increased in a depth direction.

Note that the above-described MOSFET is not restricted to the one in which the gate insulating film is formed of an oxide film, but is assumed to include a MISFET (Metal Insulator Semiconductor Field Effect Transistor) in which the gate insulating film is formed of any of a wide variety of insulating films. That is, while the term MOSFET is used in the specification for convenience, this MOSFET is used in the specification as a term intended to include a MISFET.

Also, as a metal material of each wire described above, gold (Au), a gold alloy, copper (Cu), a copper alloy, aluminum (Al), an aluminum alloy, or the like is preferably used.

The switching element of the present invention can be applied to, for example, a power supply circuit. However, this is not meant to be restrictive, and the switching element can be applied to various devices, for example, an inverter for air conditioners, a power conditioner of a photovoltaic power generating system, an inverter for hybrid vehicles and electric automobiles, a power supply module for personal computers, and a white LED inverter.

INDUSTRIAL APPLICABILITY

The present invention can be widely used in manufacturing industries for manufacturing semiconductor devices.

DESCRIPTIONS OF REFERENCES

ACTj active region
ACTm active region
CHP1 semiconductor chip
CHP2 semiconductor chip
CL channel length
CLP clip
D drain
D1 drain
D2 drain
DEj drain electrode
DEm drain electrode
DFTj drift layer
DFTm drift layer
Dj1 drain
Dj2 drain
DL drain lead
Dm drain
Dm1 drain
Dm2 drain
G gate electrode
GE gate electrode
Gj gate electrode
Gj1 gate electrode
Gj2 gate electrode
GL gate lead
Gm gate electrode
Gm1 gate electrode
Gm2 gate electrode
GOX gate insulating film
GPj gate pad
GPm gate pad
GPST gate lead post portion
Id rated current
Id1 leakage current
IL1 insulating film
IL2 insulating film
Lgi1 parasitic inductance
Lgi2 parasitic inductance
LL load inductance
Ls parasitic inductance
Lse1 parasitic inductance
Lse2 parasitic inductance
MR sealing body
PKG1 package
PKG2 package
PKG3 package
PKG4 package
PKG5 package
PKG6 package
PKG7 package
PKG8 package
PKG9 package
PKG10 package
PKG11 package
PKG12 package
PKG13 package
PLT chip mount unit
PLT1 chip mount unit
PLT2 chip mount unit
PR body region
Q1 junction FET
Q1*a* junction FET
Q1*b* junction FET
Q2 MOSFET
Q2*a* MOSFET
Q2*b* MOSFET
S source
S1 source
S2 source
SE source electrode
Se intermediate node
Sj source
Sj1 source
Sj2 source
SL source lead
Sm source
Sm1 source
Sm2 source SPj source pad
SPm source pad
SPST source lead post portion
SR source region
SUBj semiconductor substrate
SUBm semiconductor substrate
TMj termination region
TMm termination region
TR trench
Vak voltage
Vdsu voltage
Vdsmu voltage
Vdsmd voltage
Wds wire
Wgj wire
Wgm wire
Wsm wire

The invention claimed is:
1. A semiconductor device comprising:
a junction FET (field-effect transistor) of a normally-on type formed of a substance having a band gap larger than that of silicon and having a first gate electrode, a first source, and a first drain; and
a MOSFET (metal-oxide semiconductor FET) of a normally-off type formed of silicon and having a second gate electrode, a second source, and a second drain,
the semiconductor device including a cascode connection in which the first source of the junction FET and the second drain of the MOSFET being electrically connected and the first gate electrode of the junction FET and the second source of the MOSFET being electrically connected, and
the semiconductor device comprising:
(a) a first semiconductor chip having a first front surface in which a first source pad electrically connected to the first source of the junction FET and a first gate pad electrically connected to the first gate electrode of the junction FET are formed and a first back surface electrically connected to the first drain of the junction FET and opposite to the first front surface;
(b) a second semiconductor chip having a second front surface in which a second source pad electrically connected to the second source of the MOSFET and a second gate pad electrically connected to the second gate electrode of the MOSFET are formed and a second back surface electrically connected to the second drain of the MOSFET and opposite to the second front surface;
(c) a first chip mount unit having a first upper surface on which the first semiconductor chip is mounted via a first conductive adhesive material;
(d) a drain lead coupled to the first chip mount unit;
(e) a source lead electrically insulated from the drain lead;
(f) a gate lead electrically insulated from the drain lead and the source lead;
(g) a first metal conductor for electrically connecting the first gate pad of the first semiconductor chip and the source lead together; and
(h) a sealing body which seals the first semiconductor chip, the second semiconductor chip, part of the first chip mount unit, part of the drain lead, part of the source lead, and part of the gate lead, and the first metal conductor,
wherein the first source pad of the first semiconductor chip and the second back surface of the second semiconductor chip are electrically connected together,
the second gate pad of the second semiconductor chip and the gate lead are electrically connected together,
the second source pad of the second semiconductor chip and the source lead are electrically connected together, and
the first gate pad of the first semiconductor chip are disposed so as to be closer to the source lead than to other leads.
2. The semiconductor device according to claim 1,
wherein the second gate pad of the second semiconductor chip and the gate lead are electrically connected together via a second metal conductor, and
the second gate pad of the second semiconductor chip is disposed so as to be closer to the gate lead than to the second source pad.
3. The semiconductor device according to claim 2,
wherein the first metal conductor has a conductor width wider than a conductor width of the second metal conductor.
4. The semiconductor device according to claim 2,
wherein the second semiconductor chip is mounted on the first source pad of the first semiconductor chip via a second conductive adhesive material so that the second back surface of the second semiconductor chip and the first source pad of the first semiconductor chip face each other.
5. The semiconductor device according to claim 4,
wherein the first semiconductor chip is disposed on the first chip mount unit so as to be closer to the source lead than to the other leads.
6. The semiconductor device according to claim 4,
wherein the second source pad of the second semiconductor chip and the source lead are electrically connected via a third metal conductor.
7. The semiconductor device according to claim 6,
wherein the first metal conductor, the second metal conductor, and the third metal conductor are bonding wires.
8. The semiconductor device according to claim 7,
wherein a plurality of the bonding wires of the third metal conductor are present.
9. The semiconductor device according to claim 4,
wherein the first conductive adhesive material and the second conductive adhesive material are either of silver paste or solder.
10. The semiconductor device according to claim 6,
wherein the source lead has a source lead post portion,
the gate lead has a gate lead post portion,
the first metal conductor and the third metal conductor are connected to the source lead post portion, and
the second metal conductor is connected to the gate lead post portion.
11. The semiconductor device according to claim 10,
wherein a region in which the first metal conductor and the third metal conductor of the source lead post portion are connected and a region in which the second metal conductor of the gate lead post portion is connected are placed at positions higher than the first upper surface of the first chip mount unit.
12. The semiconductor device according to claim 1,
wherein the sealing body has a first side surface and a second side surface facing the first side surface, and
the drain lead, the gate lead, and the source lead protrude from the first side surface of the sealing body.
13. The semiconductor device according to claim 12,
wherein the drain lead is disposed between the gate lead and the source lead.
14. The semiconductor device according to claim 1,
wherein the semiconductor device has a second upper surface on which the second semiconductor chip is mounted, and further includes a second chip mount unit electrically insulated from the first chip mount unit, the second back surface of the second semiconductor chip and the second upper surface of the second chip mount unit are electrically connected together via a third conductive adhesive material, and the first source pad of the first semiconductor chip and the second upper surface of the second chip mount unit are electrically connected together via a fourth metal conductor.

15. The semiconductor device according to claim 14, wherein the fourth metal conductor is a bonding wire.

16. The semiconductor device according to claim 14, wherein part of the sealing body is disposed between the first chip mount unit and the second chip mount unit.

17. The semiconductor device according to claim 1, wherein the first chip mount unit further has a first lower surface opposite to the first upper surface, and the first lower surface of the first chip mount unit is exposed from the sealing body.

18. The semiconductor device according to claim 1, wherein the sealing body has a first side surface and a second side surface facing the first side surface, the gate lead and the source lead protrude from the first side surface of the sealing body, and the drain lead protrudes from the second side surface of the sealing body.

19. The semiconductor device according to claim 1, wherein the first metal conductor is electrically connected also to the second source pad of the second semiconductor chip, and the first metal conductor is a metal plate.

20. The semiconductor device according to claim 19, wherein the metal plate is formed of a copper material.

21. The semiconductor device according to claim 1, wherein the junction FET is made of silicon carbide.

22. The semiconductor device according to claim 1, wherein the junction FET includes:

a semiconductor substrate serving as the first drain;

a drift layer formed on a main surface of the semiconductor substrate;

a plurality of trenches formed on the drift layer;

the first gate electrode formed on side surfaces and a bottom surface of each of the plurality of trenches;

a channel formation region interposed between gate electrodes formed on the side surfaces and the bottom surface of adjacent ones of the trenches; and the first source formed on the channel formation region, and wherein the channel formation region having a length longer than or equal to 1 μm.

23. The semiconductor device according to claim 1, wherein the junction FET includes:

a semiconductor substrate serving as the first drain;

a drift layer formed on a main surface of the semiconductor substrate;

a plurality of trenches formed on the drift layer;

the first gate electrode formed on side surfaces and a bottom surface of each of the plurality of trenches;

a channel formation region interposed between gate electrodes formed on the side surfaces and the bottom surface of adjacent ones of the trenches; and the first source formed on the channel formation region, and wherein a distance between a bottom of the first source and a bottom of the first gate electrode is longer than or equal to 1 μm.

24. The semiconductor device according to claim 1, wherein the junction FET includes:

a semiconductor substrate serving as the first drain;

a drift layer formed on a main surface of the semiconductor substrate, a plurality of said first gate electrodes formed on the drift layer with spaces, and the first source formed on a front surface of the drift layer between the first gate electrodes formed with spaces, and a distance between a bottom of the first source and a bottom of the first gate electrode is longer than or equal to 1 μm.

25. A semiconductor device comprising:

a junction FET (field-effect transistor) of a normally-on type formed of a substance having a band gap larger than that of silicon and having a first gate electrode, a first source, and a first drain; and a MOSFET (metal-oxide semiconductor FET) of a normally-off type formed of silicon and having a second gate electrode, a second source, and a second drain, the semiconductor device including a cascode connection in which the first source of the junction FET and the second drain of the MOSFET being electrically connected and the first gate electrode of the junction FET and the second source of the MOSFET being electrically connected, and the semiconductor device comprising:

(a) a first semiconductor chip having a first front surface in which a first source pad electrically connected to the first source of the junction FET and a first gate pad electrically connected to the first gate electrode of the junction FET are formed and a first back surface electrically connected to the first drain of the junction FET and opposite to the first front surface;

(b) a second semiconductor chip having a second front surface in which a second source pad electrically connected to the second source of the MOSFET and a second gate pad electrically connected to the second gate electrode of the MOSFET are formed and a second back surface electrically connected to the second drain of the MOSFET and opposite to the second front surface;

(c) a first chip mount unit having a first upper surface on which the first semiconductor chip is mounted via a first conductive adhesive material;

(d) a drain lead coupled to the first chip mount unit;

(e) a source lead electrically insulated from the drain lead;

(f) a gate lead electrically insulated from the drain lead and the source lead;

(g) a first metal conductor for electrically connecting the first gate pad of the first semiconductor chip and the source lead together;

(h) a second metal conductor for electrically connecting the second gate pad of the second semiconductor chip and the gate lead together, and (i) a third metal conductor for electrically connecting the second source pad of the second semiconductor chip and the source lead, and (j) a sealing body which seals the first semiconductor chip, the second semiconductor chip, part of the first chip mount unit, part of the drain lead, part of the source lead, and part of the gate lead, the first metal conductor, the second metal conductor, and the third metal conductor, wherein the second semiconductor chip is mounted on the first source pad of the first semiconductor chip via a second conductive adhesive material so that the second back surface of the second semiconductor chip and the first source pad of the first semiconductor chip face each other, and the first gate pad of the first semiconductor chip is disposed so as to be closer to the source lead than to other leads.

26. A semiconductor device comprising:

a junction FET (field-effect transistor) of a normally-on type formed of a substance having a band gap larger than that of silicon and having a first gate electrode, a first source, and a first drain; and a MOSFET (metal-oxide semiconductor FET) of a normally-off type formed of silicon and having a second gate electrode, a second source, and a second drain, the semiconductor device including a cascode connection in which the first source of the junction FET and the second drain of the MOSFET being electrically connected and the first gate electrode of the junction FET and the second source of the MOSFET being electrically connected, and the semiconductor device comprising:

(a) a first semiconductor chip having a first front surface in which a first source pad electrically connected to the first source of the junction FET and a first gate pad electrically connected to the first gate electrode of the junction FET are formed and a first back surface electrically connected to the first drain of the junction FET and opposite to the first front surface;

(b) a second semiconductor chip having a second front surface in which a second source pad electrically connected to the second source of the MOSFET and a second gate pad electrically connected to the second gate electrode of the MOSFET are formed and a second back surface electrically connected to the second drain of the MOSFET and opposite to the second front surface;

(c) a first chip mount unit having a first upper surface on which the first semiconductor chip is mounted via a first conductive adhesive material;

(d) a second chip mount unit having a second upper surface in which the second semiconductor chip is mounted via a second conductive adhesive material and electrically insulated from the first chip mount unit;

(e) a drain lead coupled to the first chip mount unit;

(f) a source lead electrically insulated from the drain lead;

(g) a gate lead electrically insulated from the drain lead and the source lead;

(h) a first metal conductor for electrically connecting the first gate pad of the first semiconductor chip and the source lead;

(i) a second metal conductor for electrically connecting the second gate pad of the second semiconductor chip and the gate lead;

(j) a third metal conductor for electrically connecting the second source pad of the second semiconductor chip and the source lead together;

(k) a fourth metal conductor for electrically connecting the first source pad of the first semiconductor chip and the second upper surface of the second chip mount unit together; and (l) a sealing body which seals the first semiconductor chip, the second semiconductor chip, part of the first chip mount unit, part of the second chip mount unit, part of the drain lead, part of the source lead, and part of the gate lead, and the first metal conductor, the second metal conductor, the third metal conductor, and the fourth metal conductor, wherein the first gate pad of the first semiconductor chip is disposed so as to be closer to the source lead than to other leads.

* * * * *